(12) United States Patent
Nagamine et al.

(10) Patent No.: US 6,287,988 B1
(45) Date of Patent: Sep. 11, 2001

(54) SEMICONDUCTOR DEVICE MANUFACTURING METHOD, SEMICONDUCTOR DEVICE MANUFACTURING APPARATUS AND SEMICONDUCTOR DEVICE

(75) Inventors: Makoto Nagamine, Ayase; Hitoshi Itoh, Tokyo., both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/039,980

(22) Filed: Mar. 17, 1998

(30) Foreign Application Priority Data

Mar. 18, 1997 (JP) .................................................. 9-065191
Sep. 4, 1997 (JP) .................................................. 9-239599

(51) Int. Cl.[7] .......................... H01L 21/31; H01L 21/469
(52) U.S. Cl. ......................... 438/770; 438/765; 438/769; 438/771; 438/787
(58) Field of Search ........................... 438/765, 769–771, 438/778, 787, 788

(56) References Cited

U.S. PATENT DOCUMENTS

| 4,624,859 | * | 11/1986 | Akira et al. .......................... 427/527 |
| 4,711,698 | * | 12/1987 | Douglas .............................. 438/722 |
| 4,753,818 | * | 6/1988 | Rogers, Jr. .......................... 427/583 |
| 4,886,760 | * | 12/1989 | Ben-Michael ......................... 436/66 |
| 5,294,571 | * | 3/1994 | Fujishiro et al. ...................... 438/770 |
| 5,443,863 | * | 8/1995 | Neely et al. .......................... 427/579 |
| 5,591,486 | * | 1/1997 | Okano et al. ...................... 427/255.28 |
| 5,840,600 | * | 11/1998 | Yamazaki et al. ..................... 438/151 |

FOREIGN PATENT DOCUMENTS 8-78694 3/1996 (JP) .
11-204518-A * 7/1999 (JP) .

* cited by examiner

*Primary Examiner*—Stephen D. Meier
*Assistant Examiner*—Jamie L. Brophy
(74) *Attorney, Agent, or Firm*—Oblon, Spivak, McClelland, Maier & Neustadt, P.C.

(57) ABSTRACT

A method of manufacturing a semiconductor device, which comprises a step of forming an oxide film by oxidizing a surface of semiconductor layer in an atmosphere containing an oxygen-activated species at a temperature of over 550° C. A method of manufacturing a semiconductor device, which comprises the steps of forming an oxide film by oxidizing a surface of semiconductor in an atmosphere containing an oxygen-activated species, and removing the oxide film so as to expose a surface of the semiconductor. A method of manufacturing a semiconductor device which comprises a step of feeding an oxidizing source gas comprising as a main component oxygen atomic radicals of singlet state in an excited state to a silicon layer thereby to oxidize a surface of the silicon layer, thus forming a silicon oxide film.

8 Claims, 26 Drawing Sheets

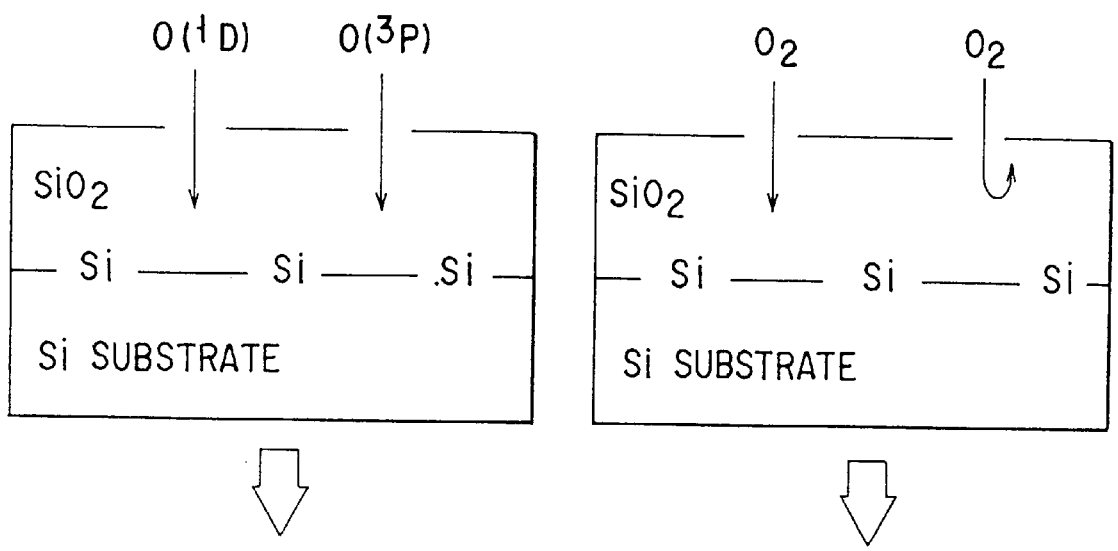
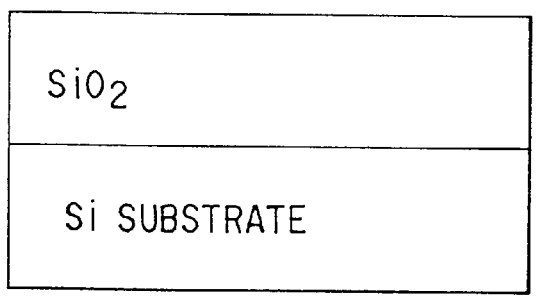
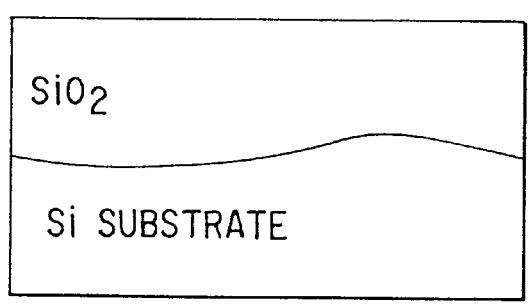
FIG. 11A          FIG. 11B

SEMICONDUCTOR DEVICE MANUFACTURING METHOD, SEMICONDUCTOR DEVICE MANUFACTURING APPARATUS AND SEMICONDUCTOR DEVICE

BACKGROUND OF THE INVENTION

The present invention relates to a semiconductor device and a method of manufacturing the semiconductor device. In particular, the present invention relates to a semiconductor device, which has a feature in the method of forming a silicon oxide film, and to a method of manufacturing the semiconductor device thereof.

An NAND type EEPROM, which is low in manufacturing cost and excellent in reliability as well as in high speed programming property is now attracting attentions as an alternative device to a magnetic memory. This NAND type EEPROM is provided with two different kinds of electrodes, i.e., an electrode (a floating gate electrode) for storing charges and an electrode (a control gate electrode) for forming an electric field for charging or discharging the charges to/from floating gate electrode.

According to the semiconductor memory of this kind, the electrically programming and erasing are performed by applying a high voltage to the control gate electrode so as to charge or discharge electrons to/from the floating gate electrode from the substrate through the gate oxide film.

Since the transfer of electrons between the substrate and the floating gate electrode is performed by making use of the Fowler-Nordheim tunnel mechanism, the gate oxide film interposed between the substrate and the floating gate electrode is called a tunnel oxide film.

One of the important features required for this tunnel oxide film is to make the total quantity of passing electrons (Qbd) that results in the dielectric breakdown of the oxide film larger than that of the ordinary MOS transistor. Because, since the memory is employed by taking advantage of the transfer of electrons by applying a high electric field to the tunnel oxide film, if the value of Qbd is small, the reliability of the oxide film would be deteriorated or the life thereof would be shortened. At the same time, it is also important to minimize so-called stress-induced leak current, which is a phenomenon of increasing a leak current at low electric field due to the application of high electric field to the tunnel oxide film.

A thermal oxidation method, i.e., a method of heating a silicon substrate while exposing it to a dry oxygen atmosphere, has been conventionally employed as a typical method of forming a tunnel oxide film. The quality of the thermal oxide film to be obtained from this thermal oxidation method is known to vary depending on the oxidation process conditions such as the oxide film-forming temperature (oxidation temperature), the heat treatment (annealing) temperature in a non-oxidative gas atmosphere, the annealing time and the rate of raising or lowering temperature. Therefore, many attempts have been tried to improve the dielectric breakdown resistance of the oxide film by adjusting these oxidation process conditions. However, no one has succeeded up to date to obtain a thermal oxide film, which meets the dielectric breakdown resistance, which may be required in future.

On the other hand, with viewpoints of saving the manufacturing cost of a semiconductor device and of simplifying a semiconductor device manufacturing apparatus, it is now desired to lower the oxidation temperature of the oxide film. According to the conventional thermal oxidation method, there has been developed for obtaining a required oxidation rate a method of raising temperature of substrate at a high speed up to a high temperature (e.g., 1,000° C.). However, this conventional method is accompanied with problems that an apparatus capable of withstanding such a high temperature is high in manufacturing cost, and that since the rate of raising or lowering the substrate temperature is very high, the substrate is imposed by a large thermal stress.

As for the method of forming an oxide film, which meets the aforementioned demands for improving the dielectric breakdown resistance of the tunnel oxide film and for lowering the oxidation temperature, there is known an oxidation method employing an active oxygen species such as oxygen radicals and ozone.

The oxidation method employing oxygen radicals has been developed up to date with a view to lowering the oxidation temperature. For example, according a publication, Applied Physics, Kimura et al., Vol. 56, pp. 64–69 (1987), it is reported that an oxide film exhibiting the same degree of dielectric breakdown resistance as that of a thermal oxide film can be obtained by performing the oxidation in an oxygen radical atmosphere at a temperature of 580° C.

Further, with a view to realize a sufficient oxide film-forming rate and to obtain a silicon substrate-oxide film interface having a property equivalent to a thermal oxide film, there has been reported a method wherein a thin oxide film is formed at first on the surface of a silicon substrate in an oxygen radical atmosphere and then additional oxide film is deposited on the aforementioned thin oxide film by means of a chemical gas phase deposition (CVD) method (Jpn. J. Appl. Phys., Vol. 31, G. Lucovsky, Y. Ma, T. Yasuda, C. Silvestre, J. R. Hauser, pp. 4387–4395 (1992)).

However, an oxygen radical oxide film having a more excellent dielectric breakdown resistance than that of a thermal oxide film has not been reported as yet. The reason for this may be ascribed to the fact that the oxygen radical atmosphere employed up to date for oxidation is formed of a mixture of activated species excited in various states.

As for the means for generating oxygen radicals, a microwave discharge, a parallel plate plasma discharge, or an electron cyclotron resonance plasma discharge in a low pressure oxygen gas atmosphere has been employed up to date. As an alternative means for these discharges, a method of irradiating an excitation light to an oxidative gas has been also proposed.

However, in any of these methods, it is not intended to selectively generate an optimum activated species in the oxidation step, i.e., various kinds of activated species (for instance, oxygen atoms/molecules in various excitation states, positive/negative ions of oxygen atom and positive/negative ions of oxygen molecules) are caused to be generated simultaneously in the atmosphere.

There are inappropriate activated species in the oxidation step, which may react with an activated species, which are optimum for the oxidation, or adsorb on the surface of oxide film. These reaction and adsorption by the inappropriate activated species may hinder the supply of activated species, which are optimum for oxidation to an oxidation film, or become causes for a deterioration of dielectric breakdown resistance of an oxide film being formed or for a slowdown of oxidation rate.

With regard to the oxidation method employing ozone, the lowering of the oxidation temperature and at the same time, the improvement of the dielectric breakdown resistance of oxide film have been reported (for instance, Takasaki, a textbook for The 42nd Semiconductor Professional Meeting (1995)).

As for the cause for the improvement of dielectric breakdown resistance in the oxidation method employing ozone, the following phenomena may be accounted therefor. Namely, when ozone molecules reach the surface of an oxide film facing an oxidation atmosphere, active oxygen radicals are fed into the oxide film and allowed to react with lattice defects which may become a cause for a trap-site of electric charge, and hence the trap-site of electric charge is entrapped in an $SiO_2$ mesh structure, thus eliminating the trap-site of electric charge.

However, the ozone molecules may become oxygen atoms or oxygen ions taking various electron excitation states, according to a difference in microscopic structure of the surface of oxide film to be fed to the oxide film through the surface of oxide film.

According to the conventional ozone oxidation method, activated species which are optimum for the oxidation and activated species which are not optimum for the oxidation are all fed to the surface of the substrate. Therefore, the conventional ozone oxidation method is not preferable because of the same reasons as explained with reference to the aforementioned oxygen radical oxidation method.

Meantime, for realizing a semiconductor device which is excellent in reliability and capable of exhibiting a high-speed operation property, it is also imperative to improve not only the reliability of insulating layers and wiring layers both constituting a semiconductor device, but also the flatness of interfaces among the insulating layer, wiring layer and semiconductor body.

When a hole or trench is formed selectively on the surface of semiconductor substrate by making use of a reactive ion etching (RIE) method for instance for forming an element isolation region or a capacitor of large electrostatic capacity, the surface of semiconductor substrate including the side walls and bottom surface of the hole or trench is damaged by the etching species such as ions and plasma, thus generating so-called RIE damage. In order to cope with this problem, a countermeasure has been conventionally taken, wherein the surface of semiconductor substrate is subjected to a thermal oxidation in a dry oxygen atmosphere until an oxide film having a thickness of about 50 nm or more is formed on the surface of semiconductor substrate and then this thermal oxide film is removed thereby removing the layer of RIE damage and at the same time assuring the reliability of a gate oxide film or embedded insulating layer to be subsequently formed on the surface of semiconductor substrate.

However, if a thermal oxidation is adopted for the oxidation (buffer oxidation) of the semiconductor substrate for removing the layer of RIE damage, the interface between the substrate and the thermal oxide film cannot be sufficiently flattened, so that a prominent roughness would be left on the surface of the substrate after the thermal oxide film is removed. Accordingly, if a very thin film gate oxide film is formed through oxidation on this rough surface of the substrate, or if an element isolation or a trench capacitor is formed by embedding such a rough-surfaced hole or trench with an insulating layer, a dielectric breakdown would be likely to be generated due to an interface roughness between the substrate and the insulating layer, or a deterioration of drain current response speed would be caused to generate at the gate oxide film. Furthermore, since the depth of the RIE-damaged layer is at most about 10 nm or less, the buffer oxidation of 50 nm or more in depth that is to be performed to the side wall of the hole or trench would lead to a redundant increase in element area, thus hindering the miniaturization of semiconductor element.

Additionally, it has been conventionally performed, in the step of making an electric connection between a semiconductor and an overlying wiring layer, to selectively form a contact hole in an insulating layer interposed between the semiconductor and the overlying wiring layer so as to expose the semiconductor at the bottom of the contact hole and then to fill the contact hole with a silicide layer or a wiring layer without flattening the exposed bottom surface of the contact hole in advance.

However, if the roughness of the exposed surface of the semiconductor at the bottom of the contact hole is large, the uniform growth of the silicide layer or of the embedded wiring layer would be hindered, thus introducing an electric contact failure between the wiring layer and the semiconductor, or a deterioration in reliability of the wiring layer. Further, in the case where an impurity-doped layer is formed on the surface of the semiconductor, a phenomenon where an electric charge flows passing through this impurity-doped layer may be induced. According to the conventional buffer thermal oxidation, a temperature of about 1,000° C. is required as an oxidation temperature, so that, because of the possibility of a thermal deformation of the region around the contact hole that might be caused by the buffer thermal oxidation, it has been considered very difficult to perform the buffer oxidation of the bottom surface of contact hole.

Meanwhile, as a ultra-flattening method of the surface of substrate where the flatness is discussed at the atomic level, there are proposed a method of heating a natural oxide-deposited substrate at a temperature of 1,000° C. in a ultra-high vacuum atmosphere (flushing, for example, M. Niwa, T. Kouzaki, K. Okada, M. Udagawa, and R. Sinclair, Japanese Journal of Applied Physics, Vol. 33, pp. 388 (1994)), and a molecular beam epitaxial growth method (for example, A. Ourmazd, D. W. Taylor, J. A. Rentschler, and J. Bevk, Physical Review Letter, Vol. 59, pp. 213 (1987)). However, these methods are not feasible because of the treating temperature, the treating time or the cost of apparatus, and, in addition to that, may introduce a contamination of the insulating layer with a metal constituting the inner wall of the apparatus, thus resulting in the dielectric breakdown of the insulating layer.

As mentioned above, since the conventional method of forming an oxide film employing oxygen radical or ozone is not intended to employ an activated species which is optimum for the oxidation, the dielectric breakdown resistance of the oxide film is poor and the oxide film-forming rate is also low as compared wiith a method where an activated species which is optimum for the oxidation is employed.

As explained above, when a thermal oxidation in a dry oxygen atmosphere is employed in the buffer oxidation of a semiconductor substrate, it is impossible to assure a sufficiently flattened surface of the semiconductor substrate after the peeling of the buffer oxide film, so that the reliability of not only the gate oxide film but also the embedded insulating layer which are to be subsequently formed on the surface of the substrate would be deteriorated. Further, since the exposed surface of semiconductor substrate, which constitutes the bottom surface of contact hole, is not sufficiently flattened according to the prior art, the reliability and property of the semiconductor device are caused to deteriorate.

BRIEF SUMMARY OF THE INVENTION

Therefore, an object of the present invention is to provide a method of manufacturing a semiconductor device and to provide a semiconductor manufacturing apparatus, which make it possible to form a silicon oxide film exhibiting a high dielectric breakdown.

Another object of the present invention is to provide a method of manufacturing a semiconductor device and to provide a semiconductor manufacturing apparatus, which make it possible to flatten the surface of semiconductor, thereby flattening the interface between the semiconductor and an insulating layer or a conductive layer which is to be subsequently formed on the surface of the semiconductor, thus making it possible to improve the reliability and property of the semiconductor device.

In order to achieve the above objects, there is provided, according to a first aspect of the present invention, a method which is characterized in that an oxidizing source gas comprising as a main component oxygen atomic radicals of singlet state in an excited state is supplied to a silicon layer thereby to oxidize the surface of the silicon layer, thus forming a silicon oxide film.

The silicon layer in the present invention includes not only a silicon layer formed on a substrate but also a silicon substrate itself.

It has been found as a result of researches made by the present inventors that an oxygen atomic radical of singlet state in an excited state $O(^1D)$ is superior in dielectric breakdown resistance than an oxygen atomic radical of triplet state in the ground state $O(^3P)$. Further, when a light of specific wavelength is irradiated to oxygen gas or ozone gas, the $O(^1D)$ can be selectively generated rather than the $O(^3P)$.

The following methods are preferable for generating an oxidizing source gas comprising as main component oxygen atomic radicals of singlet state.

(1) A light of 175 nm or less in wavelength is irradiated to an oxygen source gas thereby to generate oxygen atomic radicals of singlet state.

(2) A light of 175 nm or less in wavelength is irradiated to a plasma atmosphere of gas containing a molecule having an oxygen atom thereby to generate oxygen atomic radicals of singlet state.

(3) Aforementioned plasma atmosphere is separated into a plasma-generating region and an oxidization region.

(4) A light having a wavelength which enables to promote the generation efficiency of oxygen atomic radicals of singlet state rather than oxygen atomic radicals of triplet state is irradiated to a gas atmosphere containing a molecule having an oxygen atom thereby to generate oxygen atomic radicals of singlet state.

(5) Aforementioned oxidizing source gas containing oxygen atomic radicals of singlet state contains a gas molecule which enables the reaction rate constant to become $4 \times 10^{11}$ $cm^3 mol^{-1} s^{-1}$ of less at a temperature of 298 K in the reaction of inactivating oxygen atomic radicals of singlet state to oxygen atomic radicals of triplet state.

(6) A light of 341 nm or less in wavelength is irradiated to an atmosphere containing dinitrogen monoxide thereby to generate oxygen atomic radicals of singlet state.

(7) Aforementioned oxidation is performed under the conditions where the partial pressure of oxygen molecule in the oxidizing source gas is set to 10 Torr or less, and the oxidizing temperature is set to 550° C. or less.

According to the first aspect of the present invention, since an oxidizing gas source comprising oxygen radicals of singlet state as a main component is fed to a silicon layer, the oxidation of the silicon layer can be effectively proceeded, so that the formation of silicon oxide film can be achieved at a lower temperature as compared with the conventional method. At the same time, the trap site such as lattice defects in the silicon oxide film can be eliminated, thereby making the silicon oxide film high in density, and the interface between the silicon layer and the silicon oxide film can be flattened, thus improving the electric reliability of the silicon oxide film.

FIG. 1 illustrates a comparison between the growth rate of oxide film employing an oxygen radical oxidation (O*) or an ozone oxidation ($O_3$) and the growth rate of oxide film employing dry oxygen, both being according to the prior art. The high oxidation power of the activated species contained in the conventional oxygen radical oxidation atmosphere and ozone oxidation atmosphere is indicated by the fact that the growth rate of oxide film under these oxidation atmospheres is higher than that can be obtained through the thermal oxidation by means of the oxidation employing dry oxygen under the conditions of the same pressure and the same temperature.

The fact that the oxide film to be formed by the conventional oxygen-activated species atmosphere (O*, $O_3$) containing the activated species of such a high oxidation power is more effective in suppressing the generation of electronic trap as compared with the thermal oxide film is reflected in the small value of gate voltage shift $\Delta Vg$ due to the formation of electronic trap in the injection of constant current (FIG. 2). The improvement of dielectric breakdown of oxide film as a result of the suppression of electronic trap is reflected in the large value of the total quantity Qbd of electrons that have passed through a gate insulation film until a dielectric breakdown is caused to generate (FIG. 3).

FIG. 4 shows the electron mobility at the interface of a silicon oxide film facing a silicon substrate on which the silicon oxide film has been formed by various oxidation methods (oxidizing species). The reason for the higher electron mobility, as compared with that of thermal oxide film, which has been indicated in the silicon film formed by the conventional oxygen-activated species atmosphere (O*, $O_3$) may be ascribed to an increased flatness, as compared with that to be obtained by the thermal oxidation, of the interface between the silicon substrate and the silicon oxide film by the effect of the oxygen-activated species.

Further, when the density of O*-silicon oxide film and $O_3$-silicon oxide film, both indicating an improved dielectric breakdown property over the thermal oxide film, was measured, a value of as high as 2.10 $g/cm^3$ or more was obtained in both-films. The improvement in density of these silicon oxide films is considered as reflecting the densification in quality of film.

On the other hand, when the density of a silicon oxide film which had been formed in an atmosphere containing a lower concentration of activated species was measured, the density thereof was found as being almost equivalent to that of thermal oxide film, i.e., 2.10 $g/cm^3$ or less, but the dielectric breakdown property thereof was found as being more excellent than that of the thermal oxide film.

In this case, the density of the silicon oxide film is considered as reflecting the fact that the oxide film was formed mainly through a thermal oxidation, while the improvement in electric property thereof is assumed to be ascribed to a partial improvement on the trap site in the oxide film by the effect of oxygen-activated species.

As explained above, it is possible, through the employment of oxygen radical oxidation or ozone oxidation according to the prior art, to improve the oxidation rate and the electric property of oxide film, to flatten the interface between the substrate and the oxide film, and to densify the oxide film as compared with the oxidation employing dry oxygen due to the effects by the oxygen atomic radical O($^3$P) which is the main oxidizing species to be fed to the substrate.

Therefore, if an oxygen atomic radical O($^1$D), which is an excited state of the oxygen atomic radical O($^3$P) and is a preferable activated species for the oxidation of the substrate as compared with the oxygen atomic radical O($^3$P), is employed for the oxidation, it is possible to further improve the oxidation rate and the electric property of oxide film, to further flatten the interface between the substrate and the oxide film, and to further densify the oxide film as compared with the oxidation employing oxygen radical oxidation or ozone oxidation according to the prior art.

FIGS. 5A and 5B illustrate a difference in flatness of the interface between a silicon substrate and a silicon oxide film, depending on the kinds of oxidizing species. It is clear from FIGS. 5A and 5B that in contrast to the conventional oxidation method employing an atmosphere containing a large quantity of the oxygen atomic radical O($^3$P), the oxidation method according to the present invention which employs an atmosphere comprising, as a main activated species, the oxygen atomic radical O($^1$D) which is optimum for the oxidation has made it possible to realize a flat (at the atomic level) substrate-oxide film interface.

FIG. 6A shows the advantages of the oxidation method (the present invention) employing an atmosphere comprising the oxygen atomic radical O($^1$D) as a main activated species.

Since the direction of spin of the valence electron in O($^1$D) is constituted by a pair ($\uparrow\downarrow$), the oxygen atomic radical can easily enter into the Si—Si bond at the interface between the substrate—the oxide film, thereby allowing the oxidation to proceed one atomic layer by one atomic layer (layer-by-layer) of the silicon substrate, thus allowing a flat interface to be formed without generating a mixed structure thereof in atomic level with the underlying silicon substrate and allowing a strong and densified $SiO_2$ mesh structure to be formed within the oxide film.

By contrast, according to the conventional method, since the inappropriate oxygen atomic radical O($^3$P) contained in the atmosphere cannot enter into the Si—Si bond at the interface between the substrate—the oxide film as illustrated in FIG. 6B, the flatness of the interface is caused to deteriorate and at the same time, Si atom and O atom having an unbonded valence electron are left remained in the oxide film, thus easily introducing a dielectric breakdown of the oxide film.

Further, since the aforementioned optimum activated species is high in rate of forming an oxide film, it is possible to form an oxide film at a lower temperature than that of the conventional method by increasing the concentration of the optimum activated species.

Namely, according to the first aspect of the present invention, it is possible, by feeding an oxidizing gas source comprising as a main component a singlet state oxygen radical to a silicon layer, to form a silicon oxide film of high dielectric breakdown resistance at a low temperature.

The method of manufacturing a semiconductor device according to a second aspect of the present invention comprises the steps of forming an oxide film by oxidizing a surface of a semiconductor in an atmosphere containing an oxygen-activated species; and exposing the surface of the semiconductor by removing the oxide film. In this case, the film thickness of the oxide film should preferably be 8 nm or more.

As for the oxygen-activated species (corresponding to oxygen radical), radicals of positive ion (O$^+$, $O_2^+$), radicals of negative ion (O$^-$, $O_2^-$), and radicals of neutral atom or molecule (O, $O_2$) may be employed. As for the raw material gas for generating the oxygen-activated species, $O_2$ gas, $O_3$ (ozone) gas, and a gas of a compound containing oxygen may be employed.

As for the semiconductor, in addition to a semiconductor substrate, a semiconductor film formed via an insulation film on the semiconductor substrate may be employed. As for the material for the semiconductor, although silicon is a typical example thereof, other semiconductor materials may also be employed.

As mentioned above, it is possible, by forming an oxide film (hereinafter referred to as a buffer oxide film) through an oxidization of the surface of a semiconductor in an atmosphere containing an oxygen-activated species (hereinafter referred to as an oxygen radical oxidation), to extremely flatten the interface between the semiconductor and the buffer oxide film, and hence the surface of the semiconductor after this buffer oxide film is removed can be also flattened. Therefore, when any desired film is formed on the surface of semiconductor which has been exposed after the removal of the buffer oxide film, the interface between the film newly formed and the surface of semiconductor can be extremely flattened, thus making it possible to manufacture a semiconductor device excellent in reliability and electric property.

The step of forming any desired film on the surface of semiconductor which has been exposed after the removal of the buffer oxide film formed through an oxygen radical oxidation can be performed as follows.

(1) An insulation film is formed through an oxidation or nitrification on the exposed surface of the semiconductor. Typically, after a buffer oxide film is formed through an oxygen radical oxidation on the surface of a semiconductor substrate, the buffer oxide film is removed and then a gate oxide film is formed on the flattened surface of the semiconductor substrate. Since the surface of the semiconductor is sufficiently flattened before the formation of the gate oxide film, an extremely flattened interface can be formed between the semiconductor and the gate oxide film. In the case of very thin gate oxide film, in particular, the flatness of the interface between the semiconductor and the gate oxide film is greatly influenced by the degree of roughness of the surface of semiconductor before oxidation. However, when the method of the present invention is adopted, it is possible to obtain an extremely flattened interface between the semiconductor and the gate oxide film.

In this case, the surface of semiconductor layer thus flattened according to the present invention is also effective as an underlying layer to be nitrided. In the case of very thin gate nitride film, in particular, the flatness of the interface between the semiconductor and the gate nitride film is greatly influenced by the degree of roughness of the surface of semiconductor before nitrification as in the case of forming a gate oxide film. However, when the method of the present invention is adopted in the flattening of the surface of semiconductor and then the surface is nitrided, it is possible to obtain an extremely flattened interface between the semiconductor and the gate oxide film, thus improving the electric property of the nitride film.

As for the gas useful for nitriding a semiconductor layer, ammonia ($NH_3$), nitrogen trifluoride ($NF_3$), nitrogen monoxide (NO), dinitrogen monoxide ($NO_2$), nitrogen dioxide ($N_2O$) and nitrogen ($N_2$) can be employed. These gases may be employed as they are, or if required, as a mixture thereof with an inert gas such as argon or in combination of two or more kinds of these raw material gases. These gases may be introduced, as they are, into an atmosphere in the vicinity of a heated substrate, or treated in advance with a plasma discharge, a light irradiation or a metal/metal oxide catalyst so as to generate a nitrogen activated species, which is then utilized for nitriding the surface of the substrate.

(2) An insulation film is deposited on the exposed surface of the semiconductor, Typically, after a trench for element isolation is formed by means of RIE for instance in the surface of a semiconductor substrate, the buffer oxide film is formed by means of the oxygen radical oxidation at first and then removed, after which an element isolation insulation film is formed on the flattened inner surface of the trench to embed the trench. Although the inner surface of the trench may become rugged due to the RIE, due to the formation of the buffer oxide film by means of the oxygen radical oxidation and to the subsequent removal of the buffer oxide film, the inner surface of the trench is ultimately turned into an extremely flattened surface. Therefore, it is possible to improve the dielectric breakdown resistance of the element isolation insulation film as compared with the case where the inner surface of the trench is remained in a rugged state.

(3) A conductive film is deposited on the exposed surface of the semiconductor. Typically, after a contact hole is formed in the source/drain region (impurity diffusion layer), the surface of the semiconductor exposed at the bottom of the contact hole is flattened by the formation of a buffer oxide film by means of the oxygen radical oxidation and by the subsequent removal of the buffer oxide film, after which a metallic film for constituting a wiring layer is deposited in the contact hole. Since the bottom surface of the contact hole is flattened, the wiring layer can be uniformly deposited, whereby the contact resistance between the wiring layer and the semiconductor substrate can be minimized, and a phenomenon of punch-through of electric charge into the impurity diffusion layer can be prevented, thus making it possible to reduce the thickness of the impurity diffusion layer.

(4) A layer mainly consisting of a semiconductor and a desired metal is formed on the exposed surface of the semiconductor. Typically, after a contact hole is formed in the source/drain region, the surface of the semiconductor exposed at the bottom of the contact hole is flattened by the formation of a buffer oxide film by means of the oxygen radical oxidation and by the subsequent removal of the buffer oxide film, after which the exposed surface of the semiconductor at the bottom of the contact hole is silicified to form a metal silicide layer in the contact hole. Since the bottom surface of the contact hole is flattened in this case also, the aforementioned advantages as explained in the above item (3) can be obtained.

(5) A process, which comprises the steps of forming a first oxide film by oxidizing the surface of a semiconductor with a semiconductor containing the aforementioned oxygen-activated species; removing the first oxide film thereby to expose the surface of the semiconductor; forming a second oxide film by oxidizing the exposed surface of the semiconductor; and removing the second oxide film so as to expose the surface of the semiconductor, may be repeated twice or more.

(6) The step of removing the oxide film thereby to expose the surface of the semiconductor comprises a step of removing the oxide film in a gas phase atmosphere. This gas phase atmosphere may be a gas phase atmosphere containing a molecule or an activated species, comprising at least one kind of atom selected from F atom, Cl atom, Br atom and I atom.

As for the atmosphere containing oxygen-activated species (oxygen radical), the employment of an atmosphere containing, as a main component, the singlet state oxygen radical in excitation state is more effective. In the case where the oxygen radical in excitation state is of singlet state, i.e., $O(^1D)$ or $O(^1S)$, s is zero (s=0) and the direction of spin of the valence electron is constituted by a pair ($\uparrow\downarrow$). Therefore, oxygen atom can easily enter into the Si—Si bond (valence electron: $\uparrow\downarrow$) (in the case where the oxygen radical is ($^3P$), s is one (s=1) and the direction of spins of two valence electrons is both constituted by either upward direction ($\uparrow\uparrow$) or downward direction ($\downarrow\downarrow$), so that oxygen atom can hardly enter into the Si—Si bond (valence electron: $\uparrow\downarrow$), so that the reactivity thereof would be high, thus enhancing the rate of forming an oxide film, and at the same time, the effect of flattening the interface between the semiconductor and the buffer oxide film would be enhanced.

When the speed of removing the buffer oxide film is too high at the occasion of exposing the surface of the semiconductor through the removal of the buffer oxide film (silicon oxide film), it may become difficult to suppress the roughness of the surface of semiconductor after the remove of the oxide film, thus spoiling the flatness of the interface between the semiconductor and the buffer oxide film. Therefore, it is preferable, for ensuring an excellent flatness through the controlling of the buffer oxide film-removing speed, to remove the buffer oxide film in the following manners.

(1) The buffer oxide film is etched by making use of an aqueous solution of hydrogen fluoride having a concentration of 1% or less.

(2) The buffer oxide film is etched by making use of an aqueous solution of ammonium fluoride having a hydrogen ion concentration of $10^{-4}$ mol/L or less (pH$\geq$4).

(3) The buffer oxide film is etched by exposing the exposed surface of semiconductor to a gas atmosphere containing hydrogen fluoride molecule.

According to the second aspect of the present invention, it is possible, by forming a buffer oxide film through an oxidization on the surface of a semiconductor in an atmosphere containing an oxygen-activated species, to extremely flatten the interface between the semiconductor and the buffer oxide film, and hence the surface of the semiconductor after this buffer oxide film is removed can be also flattened. Therefore, when an insulating layer or a conductive layer is formed on the surface of semiconductor which has been exposed after the removal of the buffer oxide film, the interface between the layer newly formed and the surface of semiconductor can be extremely flattened, thus making it possible to manufacture a semiconductor device excellent in reliability and electric property.

The method of manufacturing a semiconductor device according to a third aspect of the present invention comprises a step of forming an oxide film by oxidizing a surface of a semiconductor in an atmosphere containing an oxygen-activated species at a temperature of 550° C. Namely, the semiconductor device thus obtained is provided with an oxide film which is formed by oxidizing the surface of semiconductor in an atmosphere containing an oxygen-activated species at a temperature of 550° C. Preferable embodiments according to the third aspect of the present invention are as follows.

(1) The atmosphere containing the oxygen-activated species is formed of a plasma atmosphere of gas containing a molecule having oxygen atom.

(2) The atmosphere containing the oxygen-activated species contains ozone molecule.

(3) The oxygen-activated species is generated by irradiating light to a gas containing a molecule having oxygen atom.

(4) The oxygen-activated species is generated by exposing a metal or a metal oxide to a gas containing a molecule having oxygen atom.

According to the third aspect of the present invention, the oxidation of the semiconductor substrate can be performed in an atmosphere containing an oxygen-activated species at an optimum temperature, so that almost the same advantages as those of the aforementioned second aspect of the present invention can be obtained.

The semiconductor device according to a fourth aspect of the present invention is characterized in that it is manufactured by the steps of forming an oxide film by oxidizing a surface of a semiconductor in an atmosphere containing an oxygen-activated species, and removing the oxide film so as to expose the surface of the semiconductor, the steps being performed continuously without exposing the surface of the semiconductor to the external air atmosphere. The method of manufacturing the semiconductor device comprises the steps of oxidizing the surface of semiconductor in an atmosphere containing an oxygen-activated species thereby to form a first oxide film, removing the first oxide film so as to expose the surface of the semiconductor, oxidizing the exposed surface of the semiconductor to form a second oxide film, and removing the second oxide film so as to expose the surface of the semiconductor, the steps being performed at least once and continuously without exposing the surface of the semiconductor to the external air atmosphere. Preferable embodiments according to the fourth aspect of the present invention are as follows.

(1) It comprises a step of forming an insulation film by oxidizing or nitriding the exposed surface of the semiconductor while maintaining a closed atmosphere without exposing the interior thereof to the external air atmosphere.

(2) It comprises a step of depositing an insulation film on the exposed surface of the semiconductor while maintaining a closed atmosphere without exposing the interior thereof to the external air atmosphere.

(3) It comprises a step of depositing a conductive film on the exposed surface of the semiconductor while maintaining a closed atmosphere without exposing the interior thereof to the external air atmosphere.

(4) It comprises a step of forming a layer containing as main components the semiconductor and a desired metal on the exposed surface of the semiconductor while maintaining a closed atmosphere without exposing the interior thereof to the external air atmosphere.

(5) The step of exposing the surface of the semiconductor by removing the oxide film is performed in a gas phase atmosphere. This gas phase atmosphere may be a gas phase atmosphere containing a molecule or an activated species, which comprises at least one kind of atom selected from F atom, Cl atom, Br atom and I atom.

Since a sequence of steps are performed in a closed atmosphere without exposing the interior thereof to the external air atmosphere according to the fourth aspect of the present invention, it is possible to prevent the deterioration of electric property such as the deterioration of dielectric breakdown resistance of an insulation film due to the contamination of the surface of semiconductor and the contact failure between a wiring layer and the surface of semiconductor, thereby improving the performance and yield of the semiconductor device, and also contributing to the improvement of through-put and to the labor saving in the manufacture of semiconductor device.

As a preferable embodiment in the aforementioned first and fourth aspects of the present invention, the step of forming an oxide film by oxidizing the surface of the semiconductor in an atmosphere containing the aforementioned oxygen-activated species can be performed at a temperature of over 550° C.

As a preferable embodiment in the aforementioned first to fourth aspects of the present invention, the aforementioned oxygen-activated species is mainly consisted of oxygen atom radical which is in a singlet state as an excitation state thereof.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 11A and 11B are diagrams each illustrating the reason for a difference in flatness of the interface between a silicon substrate and a gate oxide film, depending on the kinds of oxidizing species;

DETAILED DESCRIPTION OF THE INVENTION

Specific embodiments (hereinafter referred to as embodiments) of the present invention will be explained with reference to the drawings.

First Embodiment

Figure 1:
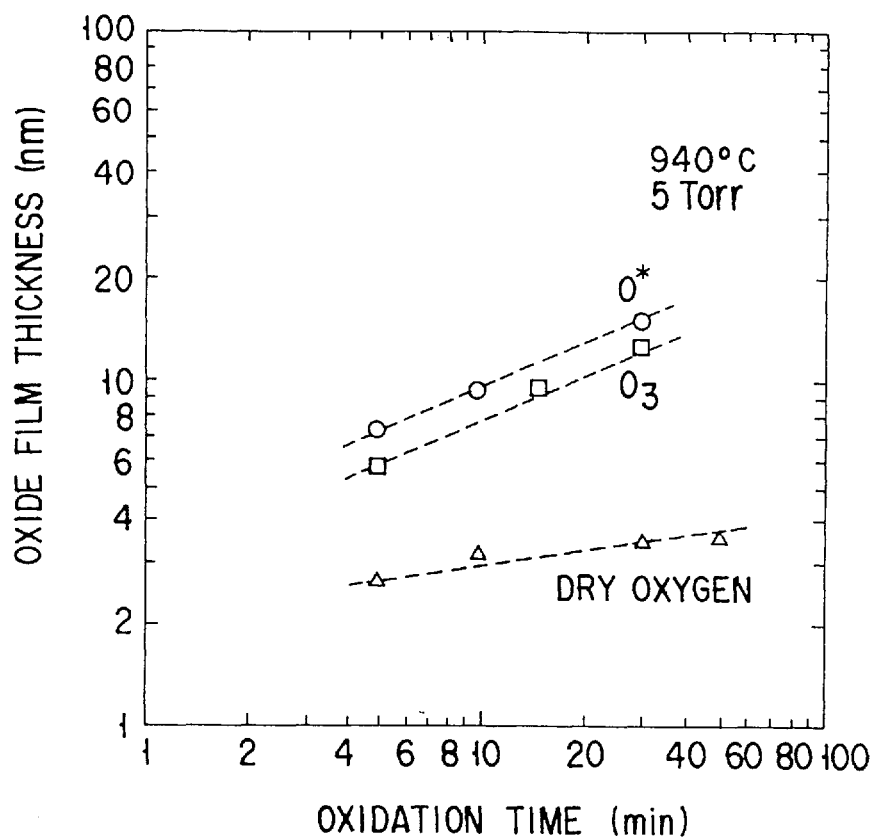
FIG. 1 is a graph showing a difference in oxidation rate depending on the kinds of oxidizing species.
Figure 2:
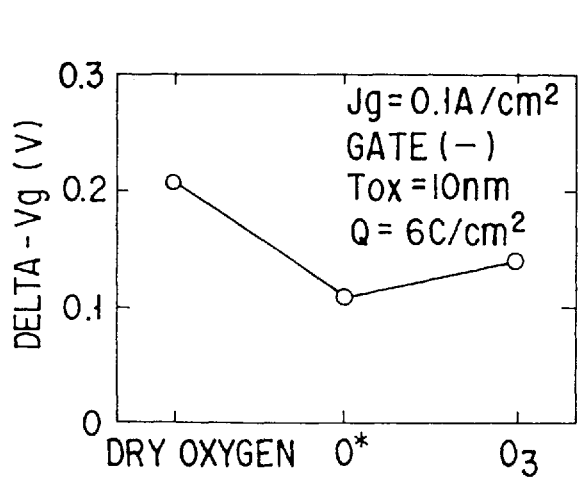
FIG. 2 is a graph showing a difference in gate voltage shift ΔVg depending on the kinds of oxidizing species.
Figure 3:
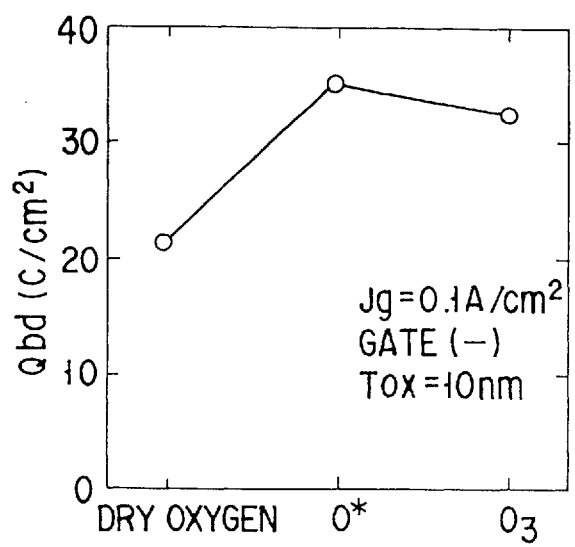
FIG. 3 is a graph showing a difference in Qbd depending on the kinds of oxidizing species.
Figure 4:
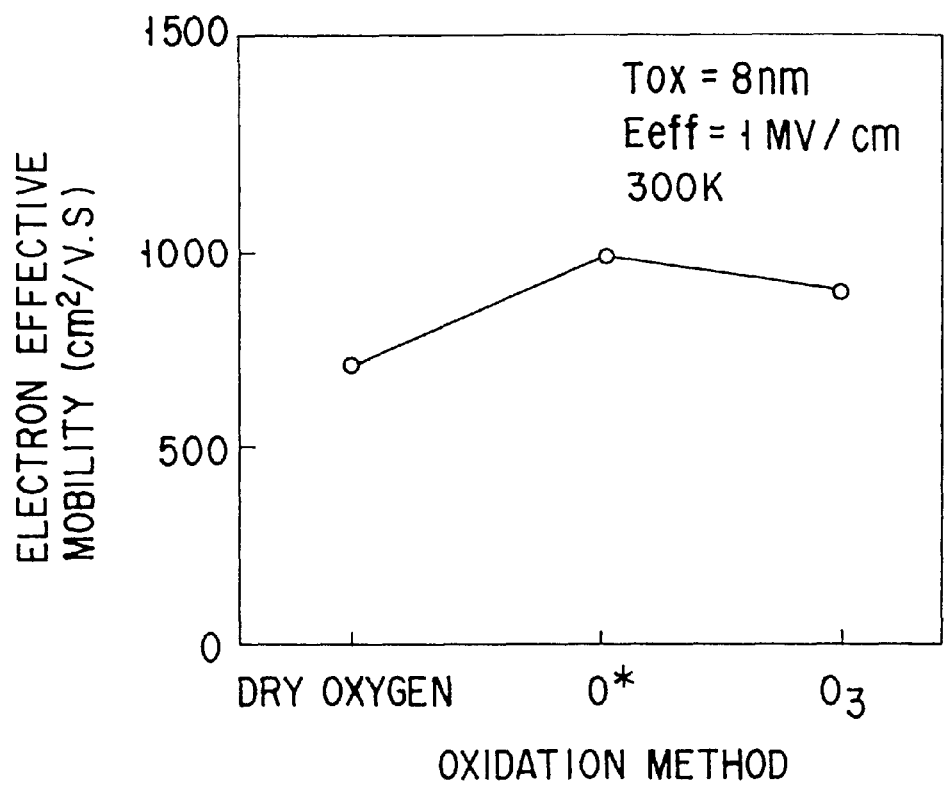
FIG. 4 is a graph showing a difference in the electron mobility, depending on the kinds of oxidizing species, at the surface of a silicon oxide film facing a silicon substrate on which the silicon oxide film has been formed.
Figure 5A:
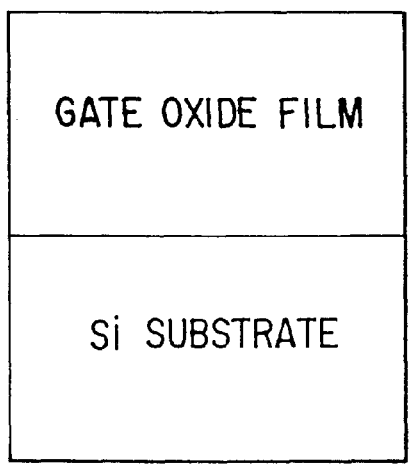
FIGS. 5A and 5B illustrate a difference in flatness of the interface-between a silicon substrate and a silicon oxide film, depending on the kinds of oxidizing species.
Figure 5B:
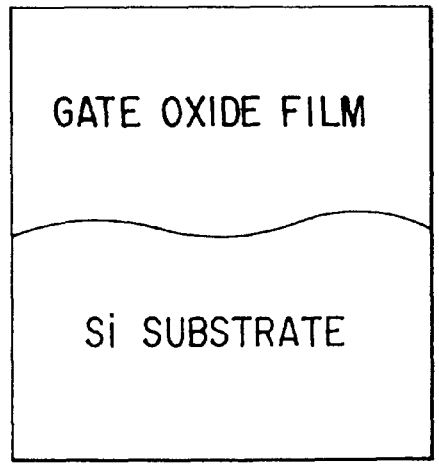
Figures 6A, 6B:
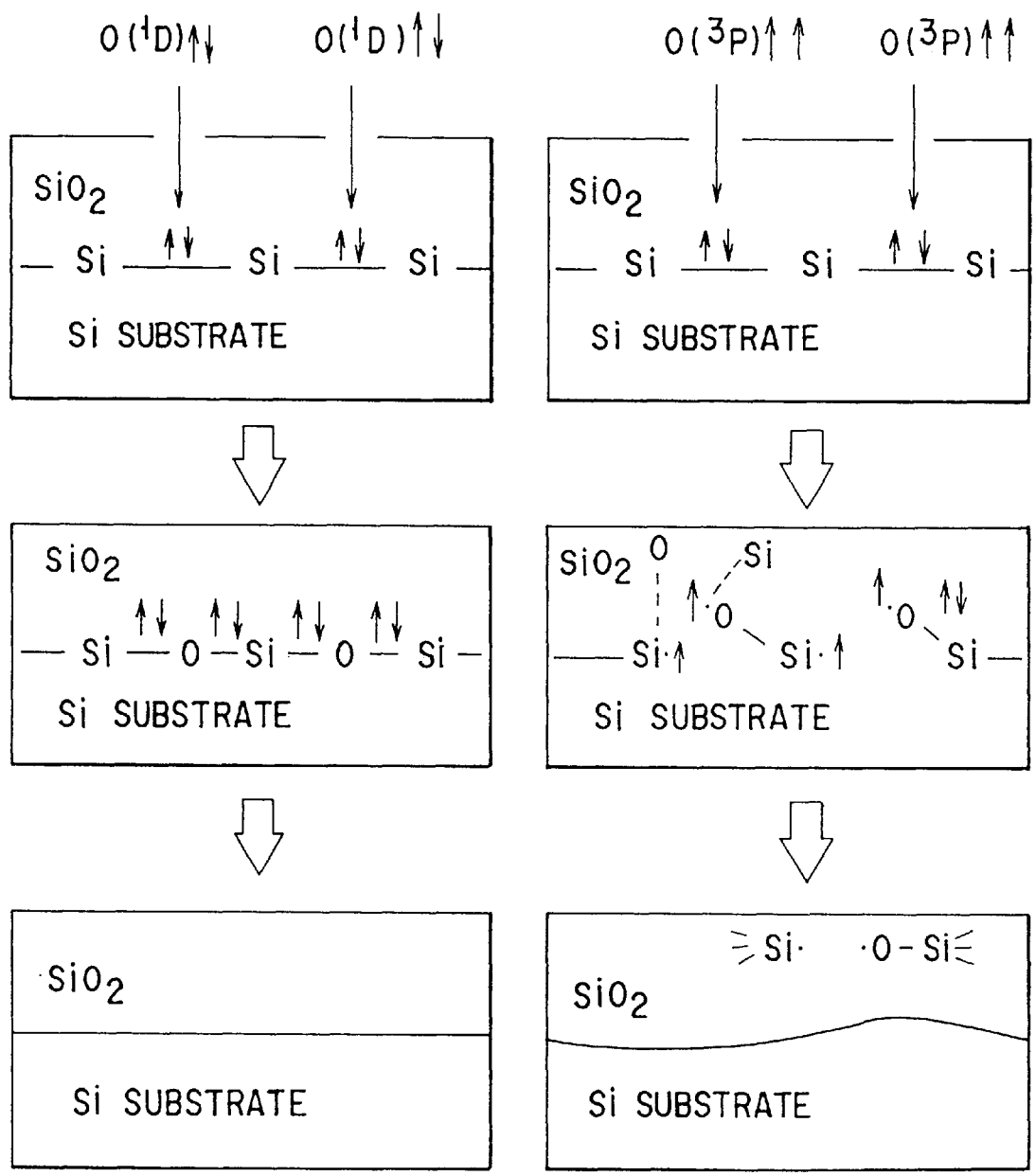
FIGS. 6A and 6B are diagrams each illustrating the reason for a difference in flatness of the interface between a silicon substrate and a silicon oxide film, depending on the kinds of oxidizing species.
Figure 7:
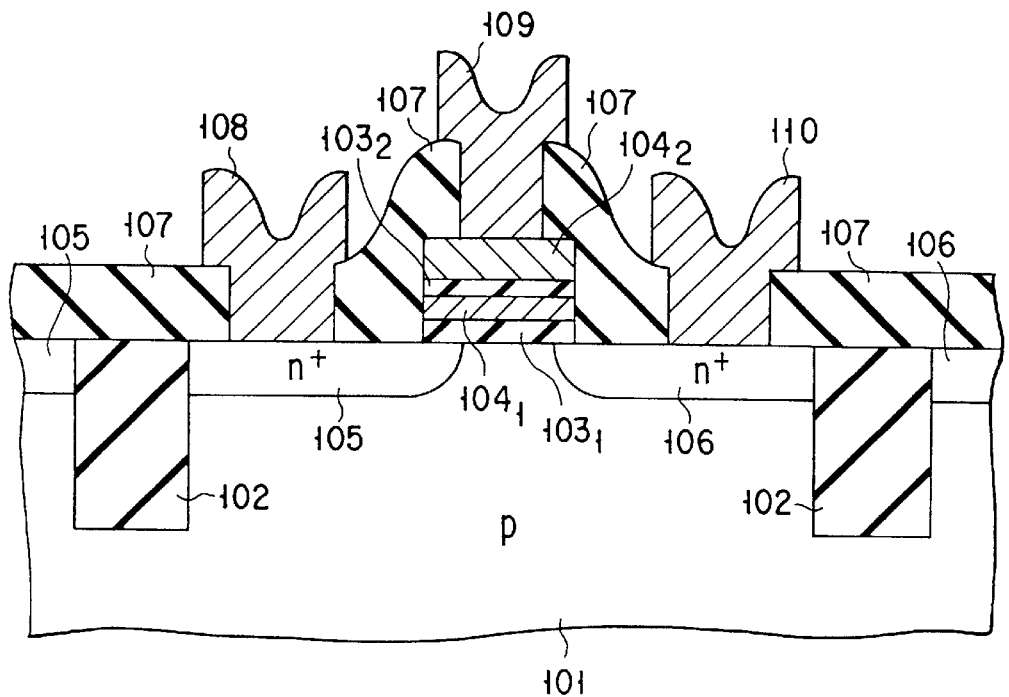
FIG. 7 is a cross-sectional view illustrating the element structure of an EEPROM memory cell according to the first embodiment of the present invention.

FIG. 7 shows a cross-sectional view illustrating the element structure of an EEPROM memory cell according to the first embodiment of the present invention.

Referring to FIG. 7, a trench is formed on the surface of a p-type silicon substrate 101. In this embodiment, an element isolation region is formed by embedding a silicon oxide film 102 to the interior of this trench. By the way, the element isolation may be effected by other means such as LOCOS, etc.

The surface of the element region of silicon substrate 101 which has been defined by the silicon oxide films 102 is provided with n-type impurity diffusion layers each having a high concentration of impurity and constituting a source region 105 and a drain region 106.

A floating gate electrode $104_1$ consisting of a polysilicon film containing arsenic is formed via a tunnel oxide film $103_1$ (which has been formed according to the present invention) on the p-type silicon substrate 101. Further, a control gate electrode $104_2$ is formed via an inter-gate electrode insulation film $103_2$ on the floating gate electrode $104_1$.

A silicon oxide film 107 is deposited all over the substrate and then partially etched to form contact holes, through which a source electrode 108, a gate electrode wiring 109 and a drain electrode 110, each formed by the patterning of the same conductive film such as an Al film, are contacted with a source region 105, a control gate electrode $104_2$ and a drain region 106, respectively.

FIGS. 8A to 8E show cross-sectional views illustrating the steps of manufacturing the memory cell shown in FIG. 7.

Figure 8A:
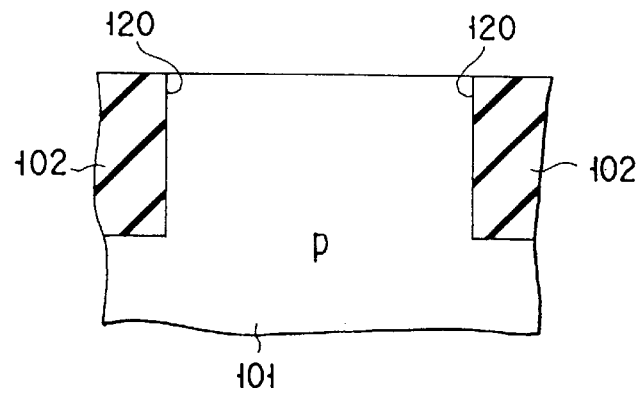
FIGS. 8A to 8E are cross-sectional views illustrating the steps of manufacturing the memory cell shown in FIG. 7.

First, as shown in FIG. 8A, a trench 120 is formed on the surface of a p-type silicon substrate 101, and then by making use of a CVD method such as a liquid CVD method, the interior of the trench 120 is embedded with a silicon oxide film 102 thereby forming an element isolation.

Figure 8B:
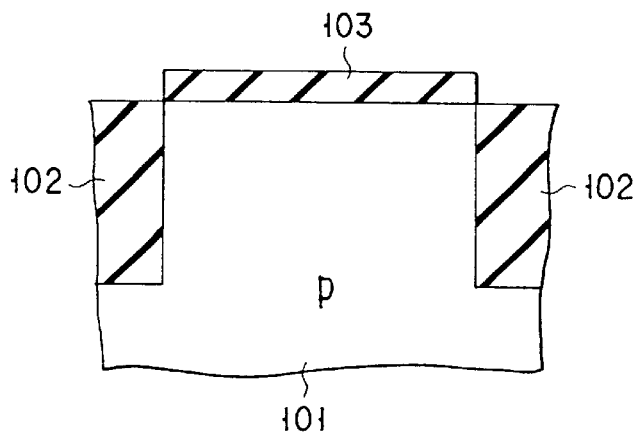

Then, as shown in FIG. 8B, the p-type silicon substrate 101 is exposed to an atmosphere of oxygen-activated species $O(^1D)$ (which is preferable for the oxidation) at a temperature of 550° C. for 120 minutes for instance, whereby forming a tunnel oxide film $103_1$ having a film thickness of 5 nm.

Figure 9:
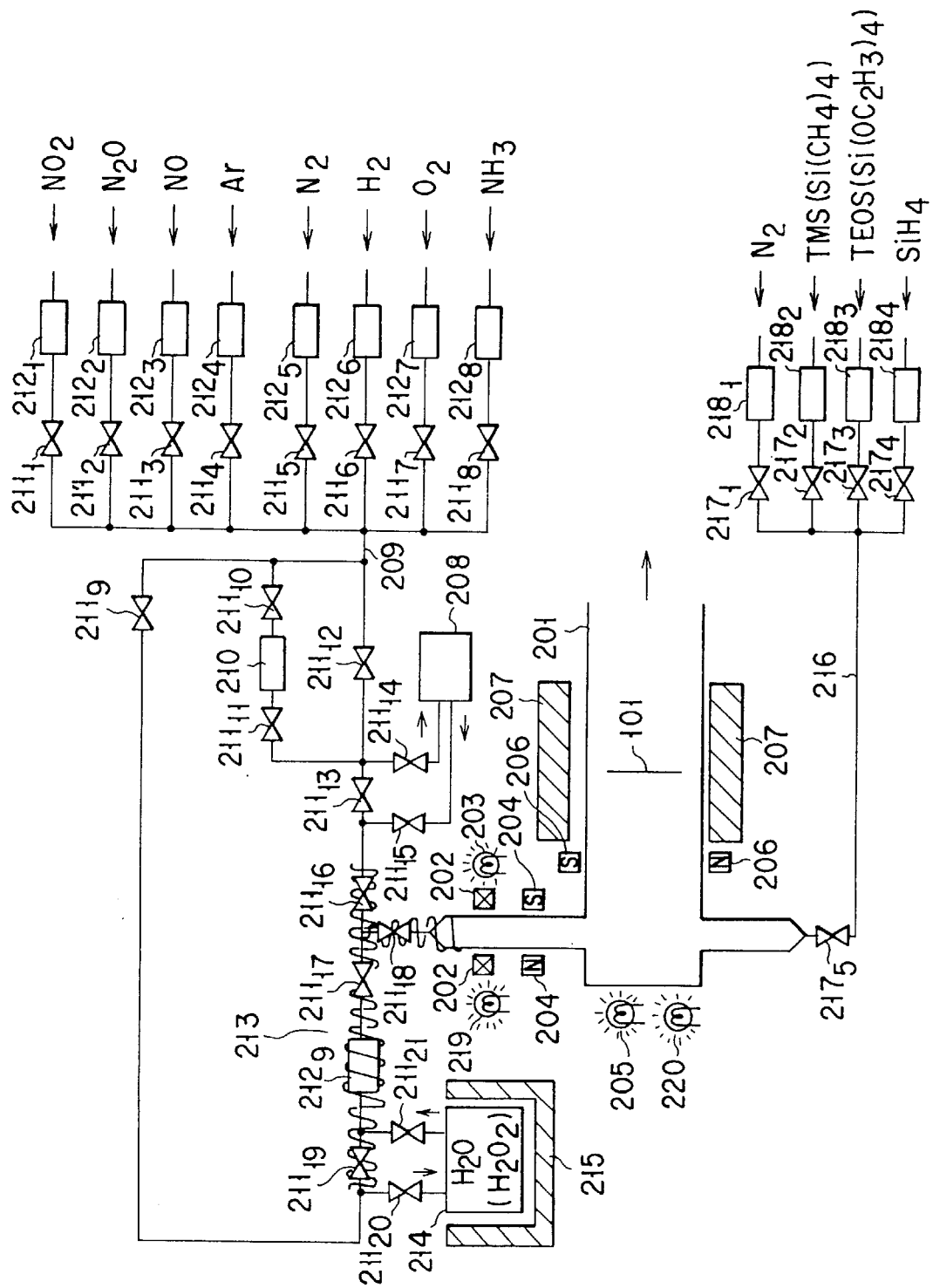
FIG. 9 is a diagram schematically illustrating the oxidation apparatus to be employed in the formation of a tunnel oxide film.

The oxidation employing the activated species $O(^1D)$ which is preferable for the oxidation is performed by making use of an oxidizing apparatus shown in FIG. 9 for instance. By the way, this oxidizing apparatus is capable of performing an oxidation without employing $O(^1D)$, and hence is provided with members which are not necessary for the oxidation method of this embodiment. In FIG. 9, the members denoted by the same reference numeral excluding the subscript are the same in construction.

In this embodiment, an $N_2O$ gas is employed as an oxidizing gas source. It is also possible in the oxidizing apparatus shown in FIG. 9 to employ an $O_2$ gas, an NO gas, an $H_2O$ vapor or an $H_2O_2$ vapor.

These $H_2O$ vapor and $H_2O_2$ vapor can be generated for instance by heating these liquids in a quartz vessel 214 by means of a heater 215. In order to prevent the vapor thus generated from being condensed, a piping extending from the outlet port of the vessel 214 to a quartz tube 201 is heated by means of a heater 213.

The activated species $O(^1D)$ can be generated by a process wherein dinitrogen monoxide ($N_2O$) gas is introduced via a mass flow controller $212_2$, a valve $211_2$ and a pipe 209 into a quartz tube 201 in which the silicon substrate 101 is placed in advance, and then this oxygen-containing gas is excited by a light having a wavelength of 197 nm and irradiated from a light source 203, thus allowing the activated species $O(^1D)$ to generate. The activated species $O(^1D)$ thus generated is then fed through a downflow thereof to the silicon substrate 101.

The pressure inside the quartz tube 201 is controlled by means of an exhaust system to 0.1 Torr for instance. The flow rate of the dinitrogen monoxide gas is controlled by the mass flow controller $212_2$ to 20 sccm for instance.

Preferably, any impurities such as water and carbon dioxide that might be mixed in the dinitrogen monoxide gas should be removed by passing the dinitrogen monoxide gas through a gas purifier 210 in a purifying step.

As for the raw material gas for $O(^1D)$, oxygen gas ($O_2$) may be employed in place of the dinitrogen monoxide gas. The surface of silicon substrate may be oxidized by setting the oxidation temperature to 550° C., the pressure of oxidation atmosphere to 0.1 Torr, and the oxidation time to 120 minutes for instance, thereby forming a silicon oxide film having a thickness of 5 nm on the surface of silicon substrate.

The silicon substrate 101 may be heated by making use of a heater 207 for instance. The oxidation treatment temperature by making use of $O(^1D)$ may be 550° C. for instance.

By making use of this oxidation apparatus, the oxidation region can be separated from the plasma-generating region. The reason for separating the oxidation region from the plasma-generating region is as follows.

When the conventional oxygen plasma atmosphere would be considered, since the plasma-generating region is impressed by a high frequency energy, a very small quantity of $O(^1D)$ can be existed in the plasma-generating region.

However, if the oxidation region is overlapped with the plasma-generating region, various kinds of ion species and activated species existing in the high energy region are caused to impinge upon the oxide film, thus damaging the oxide film and extremely deteriorating the dielectric breakdown resistance of the oxide film.

By contrast, if the oxidation region is separated from the plasma-generating region, the ion species and activated species which are capable of being existed only in a high energy condition are inactivated before reaching to the oxidation region and hence the oxide film can be prevented from being damaged, and at the same time, the $O(^1D)$ that has generated in the plasma-generating region is also inactivated before reaching to the oxidation region.

It is desirable, for feeding the $O(^1D)$ to the oxidation region, to irradiate a light to the downflow atmosphere of plasma wherein ions and activated species introducing damages to the oxide film are already inactivated so as to excite the gas molecules existing in the downflow atmosphere thereby to generate the $O(^1D)$.

Figure 8C:
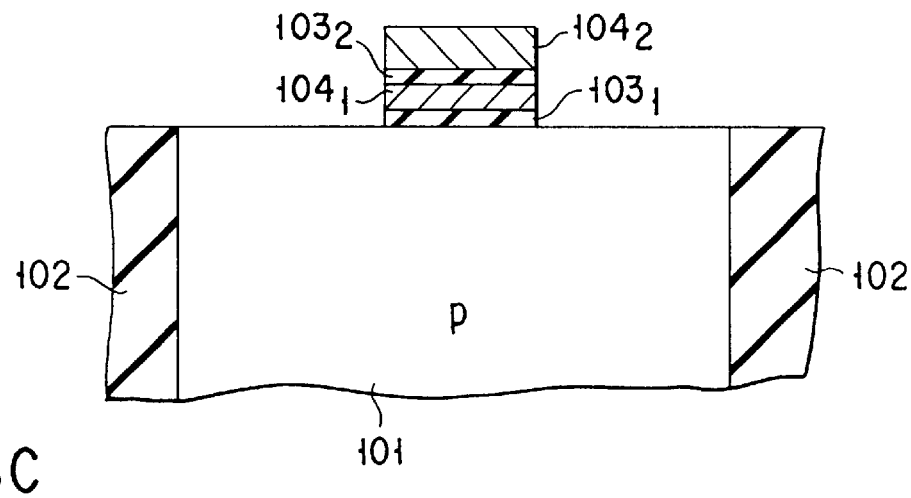

Then, as shown in FIG. 8C, a polysilicon film doped with arsenic for forming the floating gate electrode $104_1$ is deposited all over the substrate by means of a low pressure CVD method at a temperature of 650° C. Thereafter, an insulation film for constituting an inter-gate electrode insulation film $103_2$, and a conductive film for constituting a control gate electrode $104_2$ are successively deposited on the polysilicon film. Then, these conductive film, insulation film, polysilicon film and tunnel oxide film $103_1$ are successively etched away by means of a reactive ion etching method, whereby forming a gate electrode portion of predetermined structure.

Figure 8D:
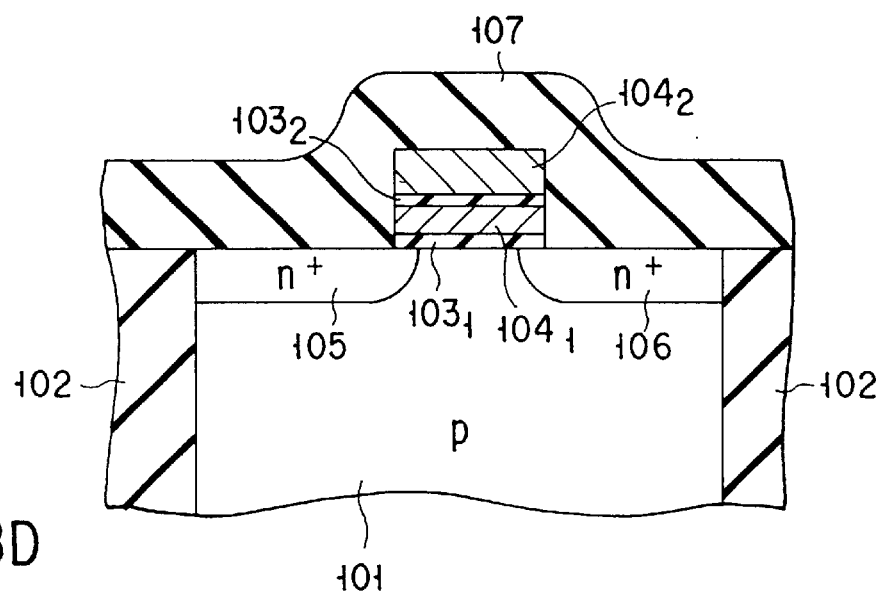

Then, as shown in FIG. 8D, arsenic ions are injected into the surface of substrate with the gate electrode portion being employed as a mask under the conditions of 40 keV in acceleration voltage and $2 \times 10^{15}$ $cm^{-2}$ in dosage, thereby forming, in self-alignment, a source region 105 and a drain region 106. Subsequently, as shown in FIG. 8D, a silicon oxide film 107 is deposited all over the substrate by means of a low pressure CVD method.

Figure 8E:
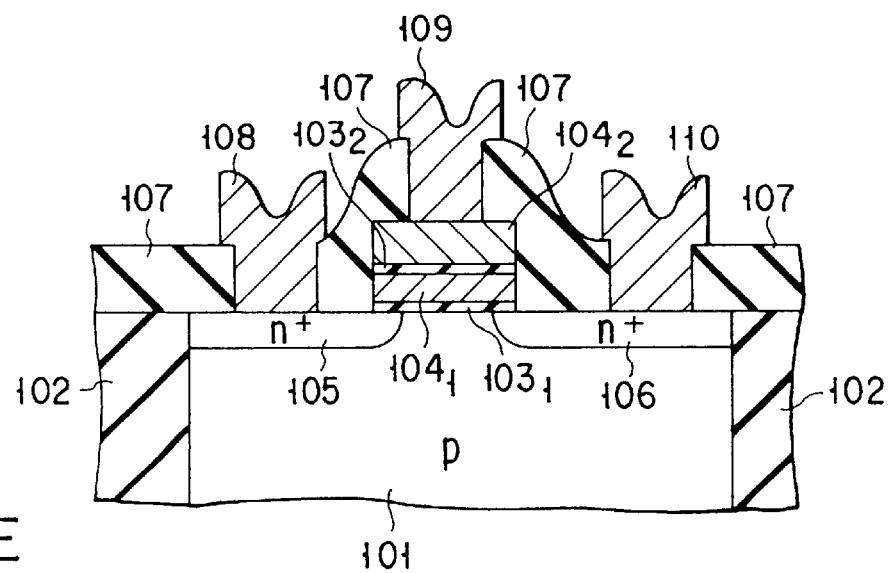

Then, as shown in FIG. 8E, contact holes for obtaining electric contacts with the source region 105, the drain region 106 and the control gate electrode $104_2$ respectively are formed in the silicon oxide film 107.

Finally, as shown in FIG. 8E, after an Al film is deposited all over the surface of the substrate, the Al film is patterned thereby to form a source electrode 108, a gate electrode wiring 109 and a drain electrode 110.

The cross-section of the tunnel oxide film of the memory cell thus manufactured according to the method of this embodiment was then observed using a transmission electron microscope (TEM), the results being compared with that of the tunnel oxide film manufactured according to the conventional method.

Figure 10A:
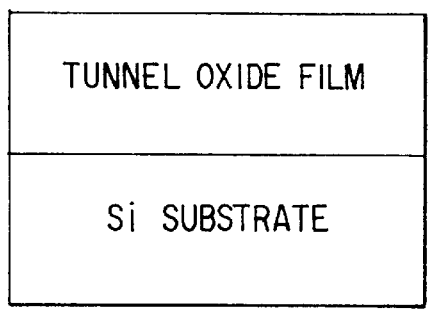
FIGS. 10A to 10C illustrate a difference in flatness of the interface between a silicon substrate and a gate oxide film, depending on the kinds of oxidizing species.
Figure 10B:
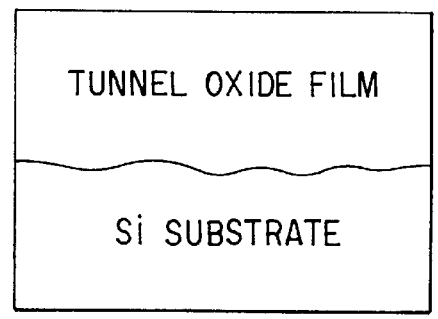
Figure 10C:
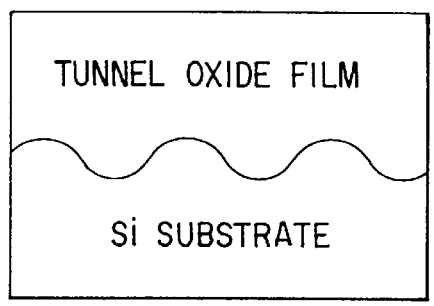

As a result, as shown in FIGS. 10A to 10C, the interface (FIG. 10A) between the Si substrate and the tunnel oxide film (gate oxide film) which was obtained according to the method of this embodiment ($O(^1D)$)) is more excellent in flatness as compared with the interfaces (FIGS. 10B and 10C) between the Si substrate and the tunnel oxide film (gate oxide film) which are obtained according to the conventional methods ($O(^3P)$ oxidation and dry oxygen oxidation). Additionally, the value of Qbd according to this embodiment is larger than that of the tunnel oxide film obtained according to the conventional method ($O(^3P)$ oxidation).

These results are considered as reflecting an increased flatness of the interface and the densification of the oxide film which have been brought about by the employment of atmosphere mainly consisting of activated species $O(^1D)$ (which is high in oxidation power and preferable for the oxidation) for the oxidation.

When the process of oxidation is considered microscopically, it is assumed that the oxidation species is adsorbed at first on the surface of the oxide film facing the oxidizing atmosphere, and then allowed to diffuse into the interior of the oxide film, and hence the oxygen atom is allowed to enter into the Si—Si bond at the interface between the silicon substrate and the oxide film, thus allowing the oxide film to grow.

As for the activated species which is preferable for the oxidation, it is preferable to employ an oxygen atom which is capable of easily diffusing into the interior of an oxide film and also capable of entering into the Si—Si bond (the direction of spin of the valence electron constituting the bond is: ↑↓) because of a pair of upward spin (↑) and downward spin (↓) of the valence electrons, and which exhibits zero in electronic spin quantum number (s=0) as a whole.

Four valence electrons of the $2p$ orbit which are bound by oxygen atom are respectively provided with an upward spin (↑: spin quantum number ½) and a downward spin (↓: spin quantum number −½), and it is assumed that the total of the spin quantum numbers of each valence electron is reflected on the value of "s".

When the oxygen atoms of various electronic configuration are listed in the order of low energy, it will be $O(^3P$: triplet-P, s=1), $O(^1D$: singlet-D, s=0), $O(^1S$: singlet-S, s=0), . . . .

These S, P and D correspond to the azimuthal quantum number of the valence electron based on the entire oxygen atom (l=0, 1, 2). According to the conventional method of generating oxygen-activated species of electronic orbit, these species have been indiscriminately generated and employed, so that the $O(^3P)$ which is the lowest in energy has been turned out to be the highest in concentration, and $O(^1D)$ and $O(^1S)$ which are most effective for oxidation have been failed to be sufficiently utilized.

In the case of the oxygen radical $O(^3P)$, s is one (s=1) and the direction of spins of two valence electrons is both constituted by either upward direction (↑↑) or downward direction (↓↓), so that oxygen atom can hardly enter into the Si—Si bond (valence electron: ↑↓) and hence the $O(^3P)$ is inappropriate for the oxidation.

By contrast, in the case of the oxygen radicals $O(^1D)$ and $O(^1S)$, s is zero (s=0) and the direction of spins of valence electrons is constituted by a pair (↑↓) so that oxygen atom can easily enter into the Si—Si bond (valence electron: ↑↓) and hence the $O(^1D)$ and $O(^1S)$ are preferable for the oxidation.

It is very important in the oxidation method employing an oxygen-activated species to selectively enhance the concentration of activated species exhibiting s=0 and being more effective for oxidation, such as the $O(^1D)$ and $O(^1S)$ in view of effectively proceeding the oxidation and obtaining a tunnel oxide film (gate oxide film) which is excellent in reliability.

According to the conventional oxidation method employing an oxygen radical, the oxygen radical is mainly consisted of the $O(^3P)$ which is higher in oxidizing power than that of dry oxygen but lower than that of the $O(^1D)$. Therefore, as shown in FIG. 11B, oxygen atom can hardly enter into the Si—Si bond at the interface between a silicon substrate and an oxide film, thus failing to achieve a sufficient flatness of the interface.

Most of ≡Si· and —O· in an oxide film after oxidation, which may become a trap site of electric charge, are eliminated through reactions with other Si atom or O atom having a dangling bond. However, part of them are left unreacted and left in the oxide film, thus making the oxide film insufficient in densification.

Whereas according to this embodiment, as shown in FIG. 11A, the concentration of $O(^1D)$ (the spin of valence electron: ↑↓) which is preferable for oxidation is enhanced, so that the oxygen atom is allowed to effectively enter into the Si—Si bond at the interface between the substrate and the oxide film, and an excellent flatness of the interface can be achieved. Further, since the unbending hands of ≡Si· and —O· can be eliminated, the structure of the oxide film can be further densified, the electric reliability of the oxide film can be improved, and the dielectric constant of the oxide film can be lowered.

The improved flatness of the interface between an oxide film and an underlying substrate by the employment of $O(^1D)$ oxidation can be explained as follows.

Figure 12A:
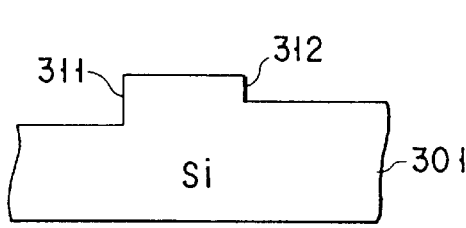
FIGS. 12A to 12C are diagrams each illustrating the mechanism of flattening of the interface between an oxide film and an underlying substrate in the O($^1$D) oxidation.

The surface of substrate 301 before oxidation is not completely flat as shown in FIG. 12A, i.e., there are a step portion 312 of one-atomic layer and a step portion 311 of two-atomic layer. During the proceeding of oxidation, the oxidizing species ($O(^1D)$) can diffuse into the oxide film not only in the thickness-wise direction thereof but also in various directions. In the initial stage of oxidation where the thickness of oxide film is still small, the $O(^1D)$ penetrates into the $SiO_2$ in a wide range and enters into the Si—Si bond, thus oxidizing the silicon substrate one atom layer by one atom layer.

At the regions of step portions 311 and 312 which are existed at the beginning, since the Si—Si bond is exposed in a larger amount at these interfaces as compared with other terrace portions, these step portions 311 and 312 are preferentially oxidized by the $O(^1D)$, so that these step-portions 311 and 312 are gradually eliminated at the interfaces thereof due to the effect of this preferential oxidization, thus forming an interface 313 which is flattened in atomic level.

On the other hand, after the formation of the flat interface 313 has been completed, the following oxidation of Si atomic layer can be preferentially proceeded at a region 314 due to a temporary non-uniformity in concentration of the $O(^1D)$. If the step of oxidation is terminated at this stage, the end portions of the region 314 may become step portions of atomic layer.

When the oxide film has been grown to some film thickness, the film thickness reaches to the penetration depth of the $O(^1D)$, so that the oxide film can not grow any more. The higher the temperature of the atmosphere is, the more the vibration of lattice of atoms constituting the oxide film becomes vigorous, so that it becomes more easy for the $O(^1D)$ to advance into the oxide film, thus increasing the penetration depth of the $O(^1D)$.

Figure 12B:
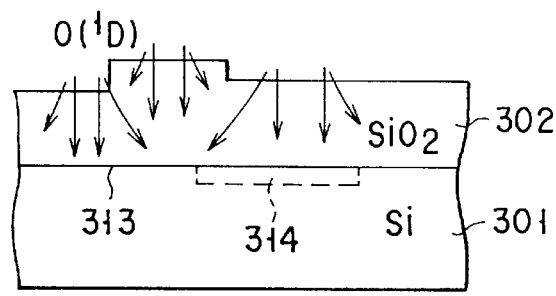
Figure 12C:
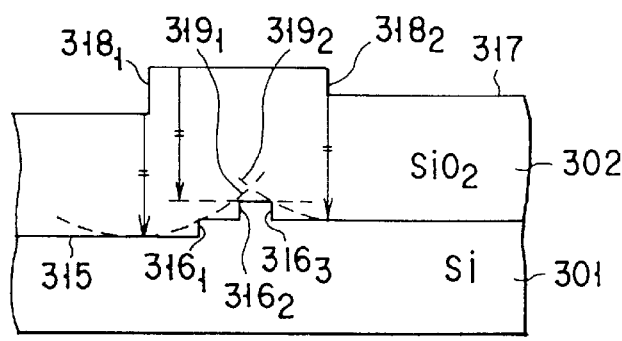

FIG. 12C shows schematically the growth state of the oxide film which has been extended to the penetration depth of the $O(^1D)$. The oxide film can grow at most up to the depth to which the $O(^1D)$ can penetrate. If there is a rugged portion on the surface 317 of the oxide film, the penetration depth is caused to vary depending on the location due to this rugged portion, and hence step portions $316_1$, $316_2$ and $316_3$ are caused to generate at the interface 315.

However, even if the height of the rugged portion on the surface of the oxide film is 2-atom layer or more, the height of these step portions $316_1$, $316_2$ and $316_3$ is 1-atom layer or less. Because, the range to which the $O(^1D)$ can penetrate from the step portions $318_1$ and $318_2$ of the surface of oxide film is considered to be confined by the circular arc $319_1$ and $319_2$ respectively, so that if the ruggedness of the surface of oxide film is not so large, a difference in distance that the $O(^1D)$ can reach to the atoms existing in the vicinity of the interface would be limited to 1-atom layer or less.

When the cross-section of the $O(^1D)$ oxide film was observed by means of a transmission electron microscope (TEM), a regular array of atomic image could be recognized over several atomic layers of the interface facing the substrate, thus indicating the presence of crystal structure. The thermal oxide film according to the prior art is known to be amorphous in structure, and hence the aforementioned regular array of atoms could not be found in the thermal oxide film in the vicinity of the interface facing the substrate.

The reason for the formation of crystal structure in the oxide film in the vicinity of the interface due to the employment of the $O(^1D)$ oxidation can be ascribed to the fact that the oxide film was allowed to firmly bond with the silicon substrate due to the $O(^1D)$ oxidation, so that the regular array of atoms of the silicon substrate was reflected on the oxide film in the vicinity of the interface facing the substrate.

The fact that the oxide film in the vicinity of the interface exhibited a crystal structure constituted by a regular array of atoms is agreeable to the flatness, in atomic level, of the interface. Further, the oxide film of crystal structure is higher in density as compared with the oxide film of amorphous structure, and hence the dielectric breakdown resistance of the oxide film can be improved.

When it is assumed that the $O(^1D)$ enters into the Si—Si bond, the construction of the interface between the (100) plane and (111) plane of Si and the $SiO_2$ can be more easily understood.

Figure 13A:
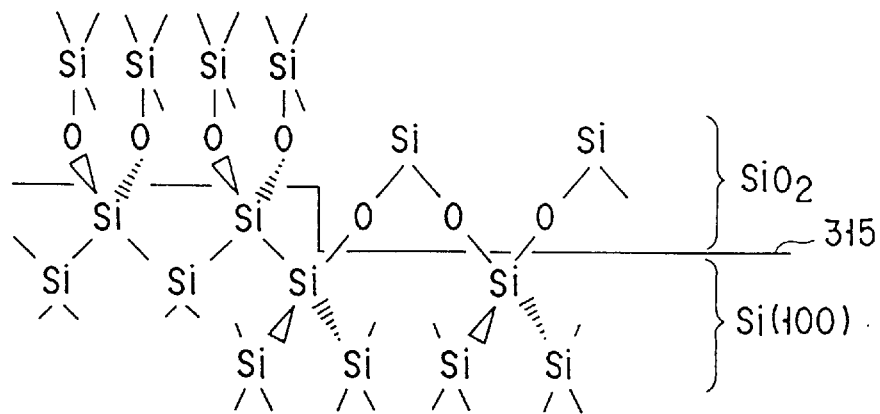
FIGS. 13A to 13C illustrate a difference in the entering degree of O($^1$D) into the Si—Si bond, depending on the difference of plane direction.
Figure 13B:
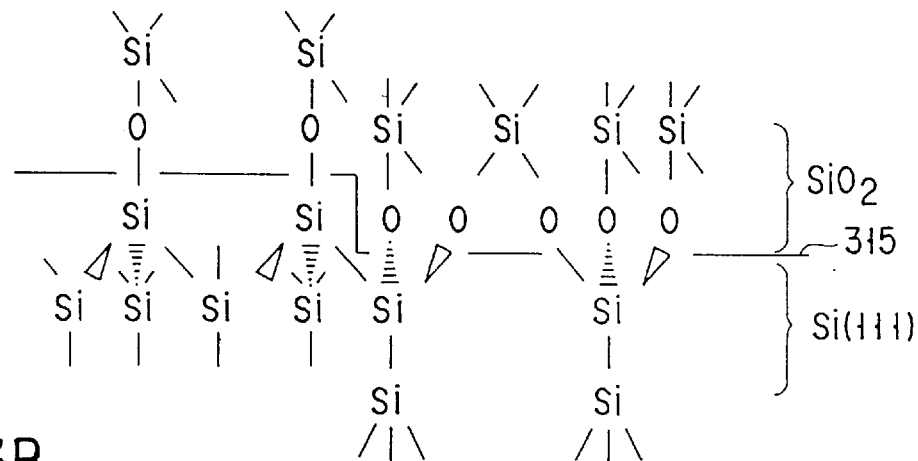

Namely, as shown in FIGS. 13A and 13B, the interface facing the silicon substrate is constituted by Si atom, to which the O atom on the $SiO_2$ side is bonded.

FIGS. 13A and 13B also illustrate examples of interface having a stepped structure, i.e., examples of step portions $316_1$, $316_2$ and $316_3$ of the interface shown in FIGS. 12A to 12C.

Figure 13C:
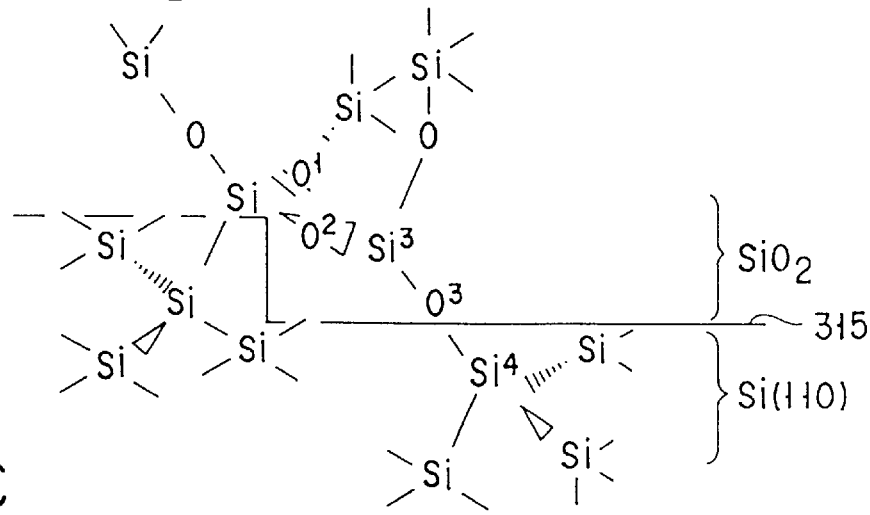

FIG. 13C illustrates an $SiO_2/Si$ (110) interface. The $Si^1$ and $Si^3$, and the $Si^2$ and $Si^4$ are respectively existed in the same atomic layer. $O^1$, $O^2$ and $O^3$ denote a state where the $O(^1D)$ is entered into and bonded with the Si—Si bond.

There are two kinds of chemical bond ($Si^1$—$Si^2$ and $O^3$—$Si^4$) at the $SiO_2/Si$ (110) interface. In both cases, the interface facing the silicon substrate is constituted by Si atom. The atoms of the $SiO_2$ side that are to be bonded with Si are Si atom which is bonded with three oxygen atoms such as $Si^1$ on one hand, and oxygen atom such as $O^3$ on the other.

Although the $Si^1$—$Si^2$ bond is left unreacted, the $Si^3$—$Si^4$ bond is oxidized by the entry of O atom. This difference is agreeable to one example of step portion of the interface between the substrate and the oxide film.

According to the oxidation by means of the $O(^1D)$, oxygen atom is certainly allowed to enter into the Si—Si bond at the interface between the oxide film and the substrate thereby forming an Si—O—Si bond, so that $P_b$ defect center ($\cdot Si\equiv Si_3$) would not be generated at the interface and unreacted Si—Si bond (oxygen hole, $O_3\equiv Si$—$Si\equiv O_3$) would not be left in the oxide film.

The $P_b$ defect center can be observed by means of an electron spin resonance (ESR). The Pb center that has been observed in the conventional thermal oxide film or in the conventional $O(^3P)$ film can no more be observed in the $O(^1D)$ oxide film.

The oxygen hole can be turned into E'γ center ($O_3\equiv Si\cdot +^+$ $Si\equiv O_3+e^-$) by the irradiation of a high energy electromagnetic wave such as a radiant ray and a strong ultraviolet ray, so that it can be observed as in the case of the Pb center by the ESR. In the cases of the conventional thermal oxide film and $O(^3P)$ film, the E'γ center could be observed by the irradiation of a radiant ray. However, the E'γ center could not be observed in the $O(^1D)$ oxide film.

The fact that the Pb center or the E'γ center could not be observed in the $O(^1D)$ oxide film demonstrates that there is no defect in the $O(^1D)$ oxide film and that the oxide film is densified (reference literature: "Silicon Thermal Oxide Film and the Interface thereof", Edited by Aizawa, Realize Co., 1991).

Since the bonding strength between a silicon substrate and an oxide film is large in the $O(^1D)$ oxidation, the stress to be imposed on the oxide film is larger than the conventional oxide film. The reason for the superior electric property of the oxide film obtained through the $O(^1D)$ oxidation over that of the conventional oxide film in spite of the aforementioned stress can be attributed to the prominent improvement on the electric property of the oxide film that has brought about by the flattening of the interface between the substrate and the oxide film, and by the densification of the oxide film.

Then, the gate oxide film of a field effect transistor (MOSFET) was formed by making use of an $O(^1D)$ oxide film, and the carrier mobility thereof was measured. As a result, the carrier mobility thereof was found as being larger than that of the conventional thermal oxide film or oxygen radical oxide film. This increased carrier mobility can be attributed to the improved flatness of the interface between the silicon substrate and the oxide film over that of the conventional oxide film.

In the case of the $O(^1D)$ oxidation, it is possible to cause oxygen atom to effectively enter into the Si—Si bond at the interface between a silicon substrate and an oxide film, thus suppressing the generation of unbonded Si atom or unbonded O atom, and hence the interfacial level can be reduced.

In the case of the $O(^1D)$ oxidation, it is possible to cause oxygen atom to enter into the Si—H bond existing in the oxide film in small quantity, thus forming an Si—O—H bond of higher bonding energy, and, due to this phenomenon also, the dielectric breakdown resistance of the oxide film can be improved.

The phenomenon of improving the dielectric breakdown resistance by the conversion of the Si—H bond in the oxide film to the Si—O—H bond is disclosed in a literature: Satake et al., "Extended Abstracts of the 1995 International Conference on Solid State Devices and Materials", pp. 264–266.

The base pressure inside the oxidizing apparatus shown in FIG. 9 should preferably be as low as possible. Further, it is also preferable to minimize the entry of water or the external air into the interior of the oxidizing apparatus.

In order to suppress a reaction between gas species other than the $O(^1D)$ and a silicon substrate so as to allow the oxidation of the substrate to proceed only through the effect of the $O(^1D)$, the temperature of the substrate should preferably be controlled to 550° C. or less for instance. On the other hand, if a nitride/oxide film is to be formed by making use of nitrification effect of dinitrogen monoxide gas, the temperature of the substrate may be relatively high, e.g., it may be 800° C. or less.

An activated species, which is preferable for oxidation is considered as being high in rate of forming an oxide film. Therefore, if it is possible to feed such an activated species to a substrate at a high concentration, an oxide film can be formed at a lower temperature, thus contributing to the simplification of the oxidizing apparatus and to the improvement of through-put in the treatment of the substrate.

Just like the $O(^1D)$ employed in this embodiment, the $O(^1S)$ is also zero in electron spin quantum number (s=0), so that it is also effective, as in the case of the $O(^1D)$, to flatten the interface and to densify the oxide film.

According to this embodiment, a light of 197 nm in wavelength was employed for generating the $O(^1D)$ from dinitrogen monoxide gas. However, it is also possible to employ a light of other wavelength in conformity with the kind of activated species required and with the wavelength of light that can be generated from a desired light source. For example, if the $O(^1D)$ is to be generated from oxygen gas, a light of 138 nm in wavelength can be employed.

The reaction speed for generating an activated species through a light excitation can be given by the formula:

(excitation light intensity)×(light absorption cross-section)×(quantum efficiency for generating the activated species)×(concentration of raw material gas). It is preferable for selectively forming a specific activated species to employ an excitation light having a wavelength which enables a larger quantum efficiency to be obtained for the generation of the activated species as rather than the quantum efficiency for the generation of other activated species.

On the other hand, even if the excitation light is of a wavelength which gives a low quantum efficiency for the generation of a desired activated species, it is still possible to obtain the activated species in a high concentration provided that the parameters of (excitation light intensity)×(light absorption cross-section) are large.

The photoexcitation reaction for generating the $O(^1D)$ from dinitrogen monoxide gas: $N_2O+h\nu\rightarrow N_2+O(^1D)$ can be proceeded with an excitation light having a wavelength of 341 nm or less. It is possible, with the energy of this excitation light, to allow a reaction: $N_2O+h\nu\rightarrow N_2+O(^3P)$ to proceed, thus generating not only the $O(^1D)$ but also the $O(^3P)$.

Therefore, in order to enhance the generation efficiency of the $O(^1D)$, it is preferred to employ an excitation light having a wavelength ranging from 185 to 230 nm so as to allow the reaction: $N_2O+h\nu\rightarrow N_2+O$ $(^1D)$ to proceed with a quantum efficiency of 1.

When the wavelength of light is confined to the range of 185 to 230 nm where the $O(^1D)$ can be generated at a quantum efficiency of 1, the light absorption cross-section of $N_2O$ would decrease with an increase in wavelength of the excitation light. As for the excitation light source for obtaining an atmosphere where the oxygen atom radical is mainly consisted of the $O(^1D)$, a light which is smaller in wavelength within the aforementioned range and higher in light intensity is more preferable.

On the other hand, even if the wavelength of excitation light falls outside of the aforementioned range and the quantum efficiency for the generating of the $O(^1D)$ is less than 1, it is still possible to enhance the concentration of the $O(^1D)$, provided that the light source is capable of emitting a light having a wavelength which is large in (excitation light intensity)×(light absorption cross-section).

Although the excitation light was irradiated from the light source 203 in this embodiment, the excitation light may be irradiated by making use of a light source 205 so as to enhance the concentration of activated species in the vicinity of the surface of substrate. Furthermore, these light sources 203 and 205 may be co-used.

As for the raw material gas for forming an oxygen radical by means of electric discharge, not only dinitrogen monoxide gas, but also a gas of other kinds of molecule containing oxygen atom may be employed. For example, ozone ($O_3$), nitrogen monoxide (NO), nitrogen dioxide ($NO_2$), water vapor ($H_2O$), hydrogen peroxide ($H_2O_2$), etc. may be employed. These gases and oxygen gas may be formed of a pure gas or a mixture of plural gases, or may be mixed with an inert gas such as helium, neon and argon. Ozone gas can be generated by introducing oxygen gas into an ozonizer 208 by closing a valve 211$_{13}$ and at the same time, opening valves 211$_{14}$ and 211$_{15}$ in the apparatus shown in FIG. 9.

Figure 14:
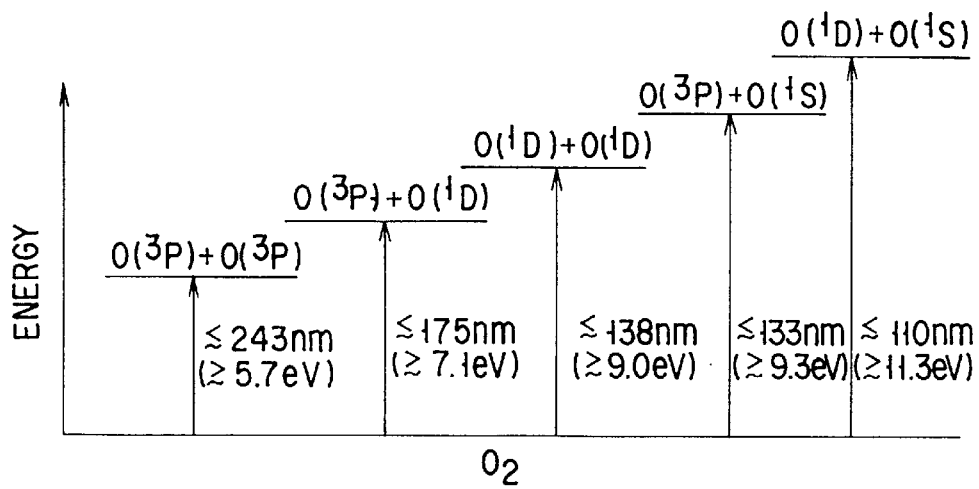
FIG. 14 is a graph illustrating the amount of energy which is required for forming various oxygen-activated species from oxygen molecule $O_2$.
Figure 15:
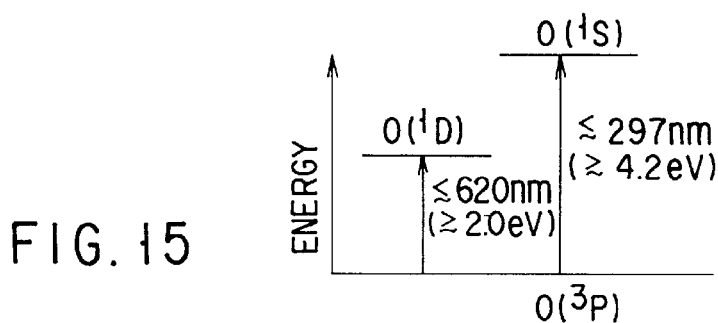
FIG. 15 is a graph illustrating the amount of energy which is required for exciting the ground state of oxygen atom $O(^3P)$.
Figure 16:
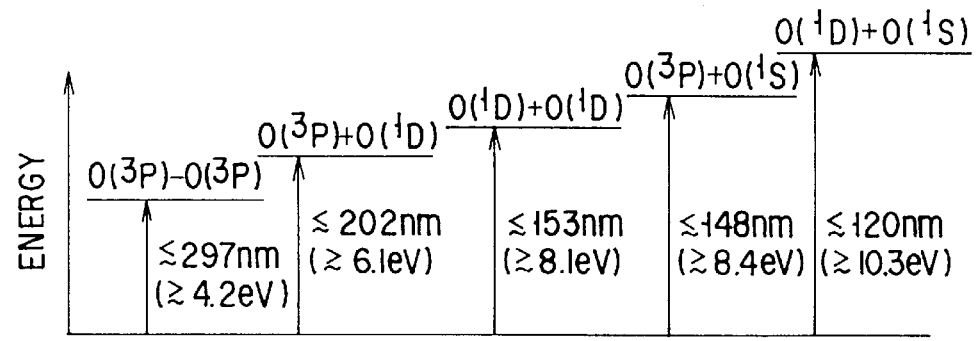
FIG. 16 is a graph illustrating the amount of energy required for exciting the excited state of oxygen molecule $O_2(a^1\Delta g)$.
Figure 17:
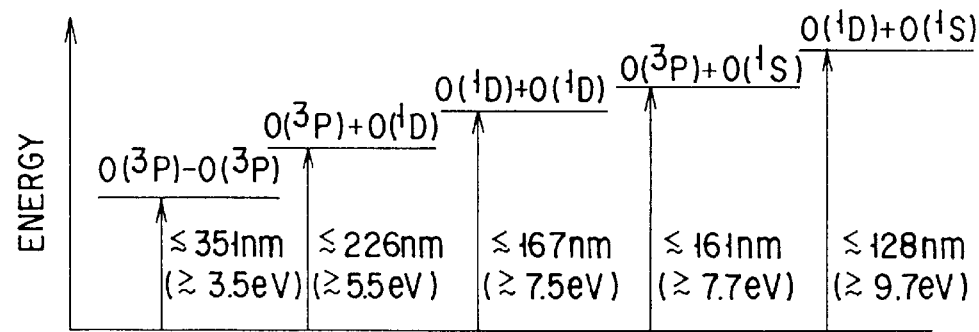
FIG. 17 is a graph illustrating the amount of energy required for exciting the excited state of oxygen molecule $O_2(b^1\Sigma g^+)$.

In this case, a light for exciting the reaction product into oxygen radicals may be separately irradiated to the reaction product for enhancing the concentration of the $O(^1D)$ or $O(^1S)$ in the plasma atmosphere of these raw material gases. The wavelength of the light may be, as shown in FIG. 14, an excitation wavelength for the oxygen molecule ($O_2$) that might be formed as an intermediate product of the plasma reaction. Alternatively, it may be a light (see FIG. 15) having a range of wavelength for enabling the ground state of oxygen atom $O(^3P)$ which is assumed to be existed in large amount in the atmosphere to be excited into the $O(^1D)$ or $O(^1S)$. Otherwise, it may be a light having a range of wavelength having an energy which enables excited state of oxygen molecule $O_2(a^1\Delta g)$ or $O_2(b^1\Sigma g^+)$ existing in a low pressure activated species atmosphere to be excited into the $O(^1D)$ or $O(^1S)$ (see FIGS. 16 and 17). The lights of the aforementioned wavelengths may be co-used.

From FIG. 14, the excitation energy having the wavelength from 138 nm to 175 nm mainly froms $O(^3P)$ and $O(^1D)$ from $O_2$. The excitation energy having the wavelength from 110 nm to 138 nm mainly froms $O(^1D)$, $O(^3P)$ and $O(^1S)$. The excitation energy having the wavelength lower than 110 nm mainly froms $O(^1D)$ and $O(^1S)$. The activated species formed by the wavelength from 175 nm to 243 nm is mainly $O(^3P)$ and is not preferable for oxidation.

The smaller the exciting wavelength is, the higher the energy of an activated species that can be obtained with the spin quantum number being s=0, so that it is more preferable. On the other hand, the method of employing a relatively large excitation wavelength is characterized in that the energy of the light is not so large, and that the light source thereof can be relatively easily prepared.

To selectively obtain a required activated species in high concentration, it is preferable to employ a light having a wavelength which is close to each excitation light shown in FIG. 14, and to irradiate the light in high quantity. Further, in order to allow the ground state of oxygen atom $O(^3P)$ which is assumed to be existed in large amount in the atmosphere to be excited into the $O(^1D)$ or $O(^1S)$, a light having a wavelength of 620 nm or less may be irradiated from a light source 219 or a light source 220 for instance.

Various excitation wavelengths each employing a single photon are shown in FIGS. 14 to 17. However, a necessary excitation energy may be effected by making use of a multiple photon excitation.

The activated species ($O(^1D)$ and $O(^1S)$) where the spin quantum number s=0 which are preferable for the oxidation are excited in higher energy than the ($O(^1P)$). Therefore, if there is a higher possibility that these activated species impinge against other kinds of gas in the atmosphere, these activated species can be inactivated into $O_2$ or ($O(^3P)$). Therefore, in order to prevent these activated species from being inactivated due to the impingement thereof against other kinds of gas, the pressure of the atmosphere should preferably be controlled in advance to a low pressure of 10 Torr or less.

If the pressure of the atmosphere is higher than 10 Torr, $O(^1D)$ and $O(^3P)$ may be converted into ozone through the reaction of $O(^1D, ^3P)+O_2+M\rightarrow O_3+M$ (M is third body), and hence it is not preferable.

Since this reaction is a tri-molecular reaction, the speed of reaction extremely slows by lowering the pressure. In particular, for preventing the $O(^1D)$ from being inactivated into the $O(^3P)$ in an oxygen gas or ozone gas, it is preferable to control the pressure to about 1 mTorr or less.

The aforementioned gas of a molecule having oxygen atom may be subjected to excitation only by means of an exciting light without performing an electric discharging. In this case, it is preferable to irradiate a light which is capable of selectively generating the $O(^1D)$ or $O(^1S)$ from each molecule. For exciting the $O(^3P)$ into the $O(^1D)$, a light having a wavelength of 620 nm or less may be employed.

Since the activated species $O(^1D)$ is an excited state of oxygen radical, it can be easily inactivated, through the impingement thereof against other kinds of gas in the atmosphere, into the ground state radical $O(^3P)$. Therefore, in order to realize an atmosphere of activated species where the $O(^1D)$ is included therein as a main radical, it is preferable to employ a gas molecule which enables the reaction rate constant in the inactivation of the $O(^1D)$ into the $O(^3P)$ to be minimized. It is also preferable to employ a gas molecule which contains oxygen atom, thereby providing a source for generating the $O(^1D)$.

It is known, as reported in the literature (D. L. Baulch et al, Journal of Physical and Chemical Reference Data, Vol. 11, No. 2, pp. 327–496 (1982)), that in the cases of oxygen gas ($O_2$) and ozone gas ($O_3$) that have been conventionally employed for the generation of $O(^1D)$, the reaction rate constant in the inactivation reaction of the $O(^1D)$ into the $O(^3P)$, i.e., $O(^1D)+M \rightarrow O(^3P)+\text{Products}$; wherein $M=O_2$ or $O_3$; and Products represents an excitation state of M) at 298 K is $4\times10^{-11}$ $cm^3 molecule^{-1} s^{-1}$ and $1.2\times10^{-10}$ $cm^3 molecule^{-1} s^{-1}$.

Therefore, if a gas atmosphere which iS mainly consisted of a gas molecule enabling the reaction rate constant in the inactivation reaction of the $O(^1D)$ into the $O(^3P)$ to be made smaller than $4\times10^{-11}$ $cm^3 molecule^{-1} s^{-1}$ is employed, it is possible to realize an oxygen radical atmosphere where the concentration of the $O(^1D)$ is higher than the conventional $O_2$ or $O_3$ atmosphere and also realize such an oxygen radical atmosphere at a higher pressure.

As for the gas meeting the aforementioned requirements, dinitrogen monoxide ($N_2O$) gas for instance can be employed. According to Baulch et al, the reaction rate constant in the inactivation reaction of the $O(^1D)$ into the $O(^3P)$ in the atmosphere of $N_2O$ molecule is less than $1\times10^{-12}$ $cm^3 molecule^{-1} s^{-1}$.

In the oxidation of a silicon substrate, an oxygen species is required to diffuse into an oxide film and to reach the interface between the substrate and the oxide film. In the case of oxidation employing the $O(^1D)$, it seems that the degree of inactivation of the $O(^1D)$ becomes more prominent as the $O(^1D)$ penetrates deeper into the oxide film from the surface thereof facing the oxidizing atmosphere, thus decreasing the concentration of radical.

Further, as mentioned above, for inhibiting the reaction between a gas species other than the $O(^1D)$ and the substrate whereby to enhance the oxidation effect by the $O(^1D)$, the temperature of the substrate should preferably be controlled to a low temperature of about 550° C. or less.

When the penetration-depth of the $O(^1D)$ into an oxide film at such a low temperature is taken into account, the thickness of oxide film where a sufficient oxidation effect can be achieved by the $O(^1D)$ at the interface between the substrate and the oxide film would be about 5 nm or less.

In the case of oxide film which has been formed by means of the $O(^1D)$ oxidation, the film becomes more dense as compared with the conventional thermal oxide film to be formed by means of dry oxygen, i.e., the density of the film is higher than that of the conventional thermal oxide film. Namely, the density of the conventional thermal oxide film is about 2.1 $g/cm^3$. On the other hand, the density of oxide film in the most densified state is seemed to be that of quartz, which is the highest in density among the entire solid silicon dioxides, i.e., in the range of 2.6 to 2.7 $g/cm^3$. Therefore, the density of oxide film that can be formed through a singlet oxygen radical oxidation is within the range of more than 2.1 to 2.7 $g/cm^3$.

The density of an oxide film can be measured by measuring a difference in weight between that of a substrate where the oxide film is formed thereon and that of a substrate where the oxide film has been etched away by an etching employing hydrofluoric acid, and by measuring the thickness of the oxide film. A method of measuring the density of an oxide film by making use of the reflection of X-ray is disclosed in a literature: Hasegawa, Journal of Electrochemical Society, Vol. 142, No. 1, pp. 273–282 (1995).

As mentioned above, the memory cell manufactured by the method according to this embodiment has the following features. Namely, the density of the tunnel oxide film $103_1$ is within the range of more than 2.1 to 2.7 $g/cm^3$. The interface between the silicon substrate 101 and the tunnel oxide film $103_1$ is free from a mixing in atomic level, and the height of stepped portion at the interface is 1-atom layer or less. The portion of interface facing the tunnel oxide film $103_1$ is formed of a crystal structure.

When the penetration depth of the oxygen radical into the tunnel oxide film $103_1$ that can be attained without being inactivated is taken into account, the thickness of tunnel oxide film $103_1$ where a sufficient improvement on electric property can be achieved by the oxidation by means of a singlet oxygen atom radical would be about 5 nm or less.

As for the method of screening the state of excitation of activated species, it is possible to employ a magnetic field. Namely, in the case of the oxygen radicals $O(^1D)$ and $O(^1S)$ which are preferable for the oxidation, the electron spin quantum number, s is zero (s=0) and the direction of spins of valence electrons is constituted by a pair ($\uparrow \downarrow$), so that the external force to be imparted by the magnetic field is relatively small.

On the other hand, in the case of the oxygen radical $O(^3P)$ which is not preferable for the oxidation, is one (s=1) and the direction of spins of two valence electrons is both constituted by either upward direction ($\uparrow \uparrow$) or downward direction ($\downarrow \downarrow$), so that the external force to be imparted by the magnetic field is relatively large.

Therefore, when a magnetic field is applied vertical to a stream of plasma atmosphere containing these activated species, the running direction of the $Q(^3P)$ is greatly deviated and impinged against the inner wall of the apparatus, thus increasing the ratio of the $O(^3P)$ that can be removed. On the other hand, the running direction of $O(^1D)$ and $O(^1S)$ are not so influenced by the magnetic field, so that the ratio of $O(^1D)$ and $O(^1S)$ is allowed to increase.

The aforementioned change in direction of particles having electron spin by the influence of magnetic field is known as "the experiment of Stern-Gerlach".

The change in direction of particles by the influence of magnetic field is relatively large in positive/negative ions rather than in neutral particle. Therefore, the application of magnetic field is effective in removing ions contained in the activated species atmosphere, and at the same time, in preventing a tunnel oxide film (gate oxide film) to be formed from being damaged by ions.

The magnetic field can be generated from a magnet 204 or 206. These magnets 204 and 206 may be a permanent magnet or an electromagnet.

As explained above, according to this embodiment, the step of forming a tunnel oxide film by means of oxygen-activated species is performed by exposing a silicon substrate to an atmosphere where the concentration of activated species which are high in oxidation power and optimum for the oxidation is selectively enhanced. Therefore, the oxidation can be effectively proceeded, thus making it possible to form a tunnel oxide film at a lower temperature than that of the prior art, to eliminate the trap site such as a lattice defect in the tunnel oxide film, to flatten the interface between the silicon substrate and the tunnel oxide film, and to improve the electric reliability (for example, stress-induced leak current) of the tunnel oxide film. Furthermore, since the difference between the method of this embodiment and the prior art fundamentally resides noly in the kind of oxidizing species, the method according to this embodiment would not introduce the problems such as an increase in number of process or the complication of process.

It has been mentioned in the foregoing explanation of the First Embodiment that the oxidation by means of $O(^1D)$ should preferably be performed at a temperature of 550° C. or less. However, there is a difference in temperature dependency of silicon-oxidizing power of oxygen radical between the ordinary oxygen radical $O(^3P)$ and the $O(^1D)$. Since the oxidizing power of $O(^3P)$ is low at a temperature of 550° C. or less, it is required to employ the $O(^1D)$ which is higher in reactivity than the conventional $Q(^3P)$, if it is desired to expect any improvement on the electric reliability of the oxide film that can be brought about by the employment of radical for the oxidation. In this case, the expression of "the improvement on the electric reliability of the oxide film that can be brought about by the employment of radical" is meant to include a phenomenon wherein oxygen radical enters into an O atom defect in the oxide film so as to remedy the trap site in the oxide film, thereby improving the dielectric breakdown resistance of the oxide film. On the other hand, if the temperature exceeds over 550° C., the reactivity of $O(^3P)$ is increased, so that the effect of improving the dielectric breakdown resistance of the oxide film can be sufficiently obtained. Further, it is possible, through an increase in oxidation temperature, to improve the speed of forming the oxide film, thus improving the through-put of semiconductor device.

Second Embodiment

Next, the method of manufacturing an EEPROM memory cell according to the second embodiment of the present invention will be explained.

The manufacturing method according to this embodiment differs from that of the First Embodiment in the first half portion of method of forming a tunnel oxide film.

Figure 18A:
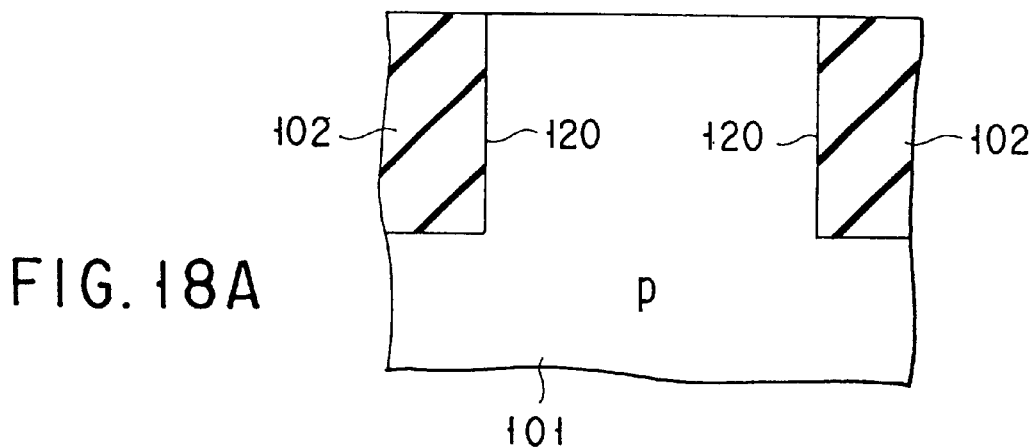
FIGS. 18A to 18C are cross-sectional views illustrating the method of manufacturing the memory cell of EEPROM according to the second embodiment of the present invention.

The step of FIG. 18A is the same as that of FIG. 8A. Namely, a trench 120 is formed on the surface of a p-type silicon substrate 101, and then by making use of a CVD method such as a liquid CVD method, the interior of the trench 120 is embedded with a silicon oxide film 102 thereby forming an element isolation.

Figure 18B:
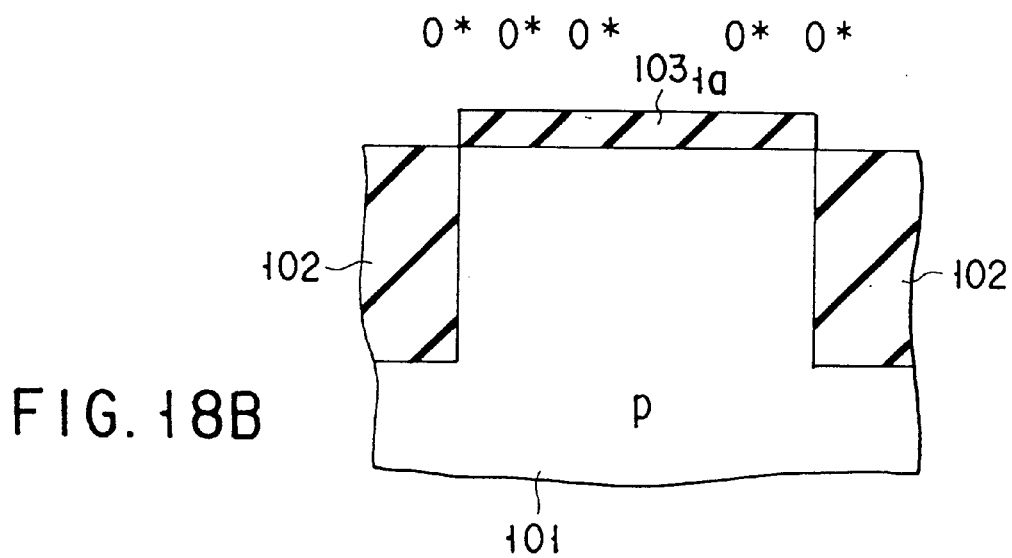

Then, as shown in FIG. 18B, the p-type silicon substrate 101 is exposed, according to the prior art, to an atmosphere of oxygen radical at a temperature of 800° C. for 30 minutes for instance, whereby forming a tunnel oxide film (an underlying tunnel oxide film) $103_{1a}$ having a film thickness of 9 nm.

The oxidation employing this oxygen radical can be performed by making use of an oxidizing apparatus shown in FIG. 9 for instance. By the way, this oxidizing apparatus is capable of performing an oxidation without employing the oxygen radical, and hence is provided with members, which are not necessary for the oxidation method of this embodiment.

The oxygen radical can be generated by a process wherein oxygen ($O_2$) gas is introduced at a flow rate of 800 sccm into a quartz tube 201 by controlling the flow rate of the oxygen gas by means of a mass flow controller $212_7$, and then this oxygen gas is excited by a discharge electrode 202, thus allowing the oxygen radical to generate. The oxygen radical thus generated is then fed through a downflow thereof to the p-type silicon substrate 101.

The pressure inside the quartz tube 201 is controlled by means of an exhaust system to 5 Torr for instance. The flow rate of the oxygen gas is controlled by the mass flow controller $112_7$ to 800 sccm for instance.

Preferably, any impurities such as water and carbon dioxide that might be mixed in the oxygen gas should be removed by passing the oxygen gas through a gas purifier 210 in a purifying step.

The p-type silicon substrate 101 can be heated by means of a heater 207 for instance.

Figure 18C:
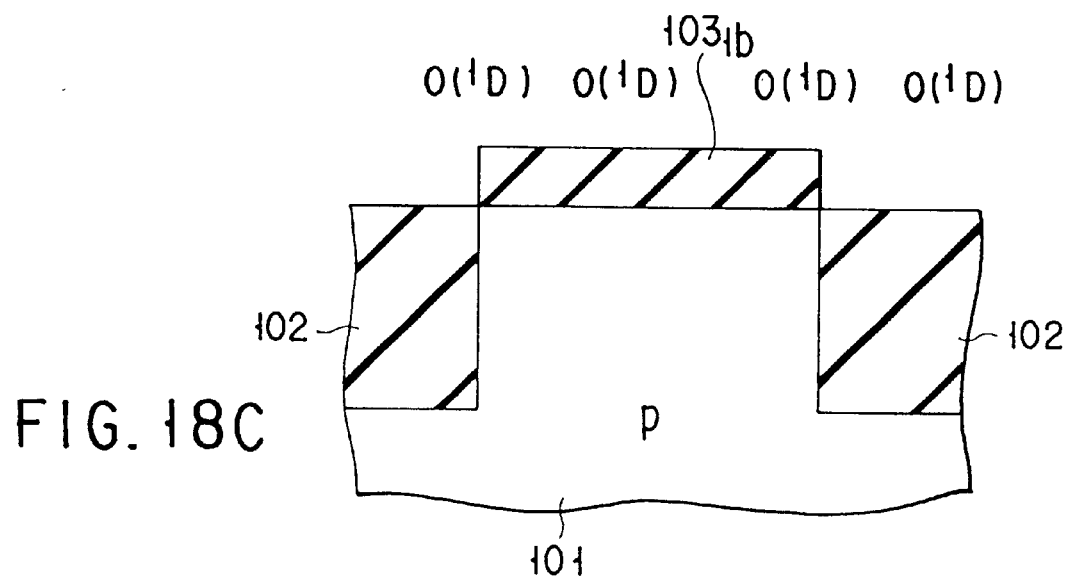

Then, as shown in FIG. 18C, the p-type silicon substrate 101 is exposed to an atmosphere of activated species $O(^1D)$ heated at a temperature of 800° C. for 60 minutes thereby modifying the tunnel oxide film $103_{1a}$ and forming a tunnel oxide film $103_{1b}$ having a thickness of 10 nm. The oxidation in the atmosphere of activated species $O(^1D)$ can be performed in the same manner as explained in the First Embodiment.

Finally, the same processes as shown in FIGS. 8C to 8E explained in the First Embodiment are repeated thereby to accomplish the EEPROM memory cell.

The cross-section of the tunnel oxide film of the memory cell thus manufactured according to the method of this embodiment was then observed using a transmission electron microscope (TEM), the results being compared with that of the tunnel oxide film manufactured according to the conventional method.

As a result, as in the case of the First Embodiment, the interface between the Si substrate and the tunnel oxide film which was obtained according to the method of this embodiment ($O(^1D)$) was found as being more excellent in flatness as compared with the interfaces between the Si substrate and the tunnel oxide film which were obtained according to the conventional methods ($O(^3P)$) oxidation and dry oxygen oxidation). Additionally, the value of Qbd according to this embodiment was found to be larger than that of the tunnel oxide film obtained according to the conventional method ($O(^3P)$ oxidation).

These results are seemed to indicate that, due to the employment of the activated species $O(^1D)$ (which is high in oxidation power and preferable for the oxidation) for the modification of the tunnel oxide film $103_{1a}$ which has been formed by means of oxygen radical, i.e., the tunnel oxide film that has been manufactured according to the method of prior art, it has become possible to obtain an increased flatness of the interface and to achieve the densification of the tunnel oxide film $103_{1a}$.

The method of this embodiment is applicable to the case where the concentration of the activated species $O(^1D)$ which is preferable for the oxidation is low and the speed for forming a tunnel oxide film is slow, and is characterized in that an underlying tunnel oxide film having almost an aimed film thickness which is desired for the tunnel oxide film is formed at first by a different oxidizing method (oxygen radical oxidation) which enables to achieve a high oxidation speed, and then the resultant underlying tunnel oxide film is modified by an atmosphere of the activated species $O(^1D)$, whereby concurrently flattening the interface between the silicon substrate and the oxide film, thus forming a tunnel oxide film of desired film thickness. Therefore, the efficiency of film formation would be enhanced as a whole.

An oxide film, which has been obtained by means of oxygen radical, has been employed as an underlying tunnel oxide film in this embodiment. It is also possible to employ an ozone oxide film, a thermal oxide film to be obtained by means of dry oxygen, or a wet oxide film to be obtained by means of water vapor atmosphere instead.

An underlying ozone oxide film can be formed by a process wherein an ozone-containing gas (for example, $O_3/O_2$ is about 7%) is formed at first in an ozonizer, and then the surface of a silicon substrate heated to a temperature of 900° C. for instance is exposed to an atmosphere of this ozone-containing gas for 15 minutes for instance, thereby forming the underlying ozone oxide film. In this case, the pressure of the atmosphere may be 10 Torr and thickness of the silicon oxide film to be formed may be controlled to 8 nm for instance.

An underlying thermal oxide film can be formed by a process wherein the surface of a silicon substrate heated to a temperature of 1,000° C. for instance is exposed to an atmosphere of dry oxygen of normal pressure for 3 minutes for instance, thereby forming the underlying thermal oxide film. In this case, the thickness of the silicon oxide film to be formed may be controlled to 8 nm for instance.

An underlying wet oxide film can be formed by a process wherein the surface of a silicon substrate heated to a temperature of 900° C. for instance is exposed to an atmosphere of hydrogen-combustion gas of normal pressure for 5 minutes for instance, thereby forming the underlying wet oxide film. In this case, the thickness of the silicon oxide film to be formed may be controlled to 8 nm for instance.

It is also possible to employ a silicon oxide film to be formed by means of a CVD method or a spin-on-glass method as an underlying oxide film to be treated in the $O(^1D)$ atmosphere.

Third Embodiment

In the Second Embodiment, the oxygen radical $O(^3P)$ has been employed for the oxidation thereby forming an oxide film at a temperature of 800° C., and then the resultant oxide film was modified by means of the $O(^1D)$. When the oxide film that has been formed by means of $O(^3P)$ oxidation at a temperature of 800° C. was examined before it is modified by means of the $O(^1D)$, the value of Qbd (the total amount of electrons that have passed through the oxide film until the dielectric breakdown thereof is resulted) has become larger, the flatness of the oxide film/substrate interface has improved, and the density of the oxide film has also increased as compared with the conventional thermal oxide film that has been formed by making use of a dry oxygen atmosphere. Accordingly, it is apparent that in the case of oxidation at a temperature exceeding over 550° C., the dielectric breakdown resistance of the oxide film can be improved even if the $O(^3P)$ is employed.

In this Third Embodiment, an example of oxidation at a temperature of more than 550° C. by making use of the $O(^3P)$ will be explained.

In the case of oxidation by making use of the $O(^3P)$ should preferably be performed by heating the substrate at a temperature of more than 550° C., more preferably at a temperature ranging from 600° C. to 950° C. for enhancing the reactivity of the $O(^3P)$ and of suppressing the growth of oxide film due to the dry oxidation.

Figure 19:
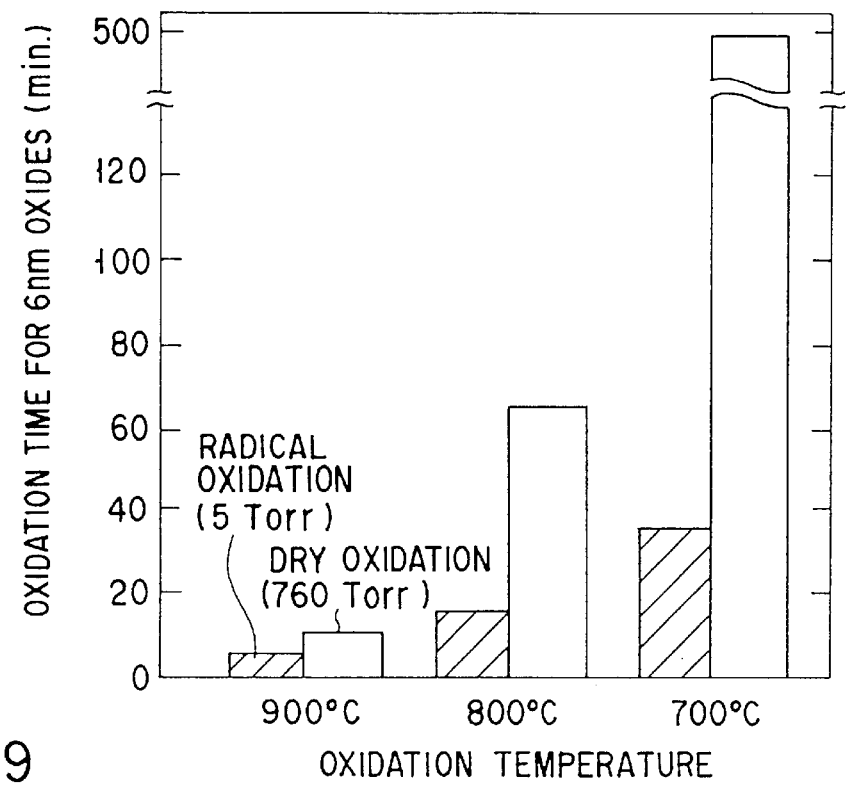
FIG. 19 is a graph showing a difference in speed of forming an oxide film, depending on the kinds of oxidizing species.

FIG. 19 shows a comparison in speed of forming an oxide film between the radical oxidation (oxidation by making use of the $O(^3P)$) and the conventional dry oxidation (oxidation by making use of the $O_2$). It is clear from FIG. 19 where the time required for growing an oxide film to a thickness of 6 nm is indicated that the shorter the time is, the higher the speed of oxidation. When the oxidation temperature is confined to the range of 700 to 900° C., the radical oxidation is higher in speed of oxidation as compared with the dry oxidation, thus indicating a high oxidation power of the $O(^3P)$. The fact that the time required for growing an oxide film to a thickness of 6 nm increases in proportion to a decrease in temperature in the case of radical oxidation is indicative of a tendency that the oxidizing power of the $O(^3P)$ decreases with the lowering of temperature.

Figure 20:
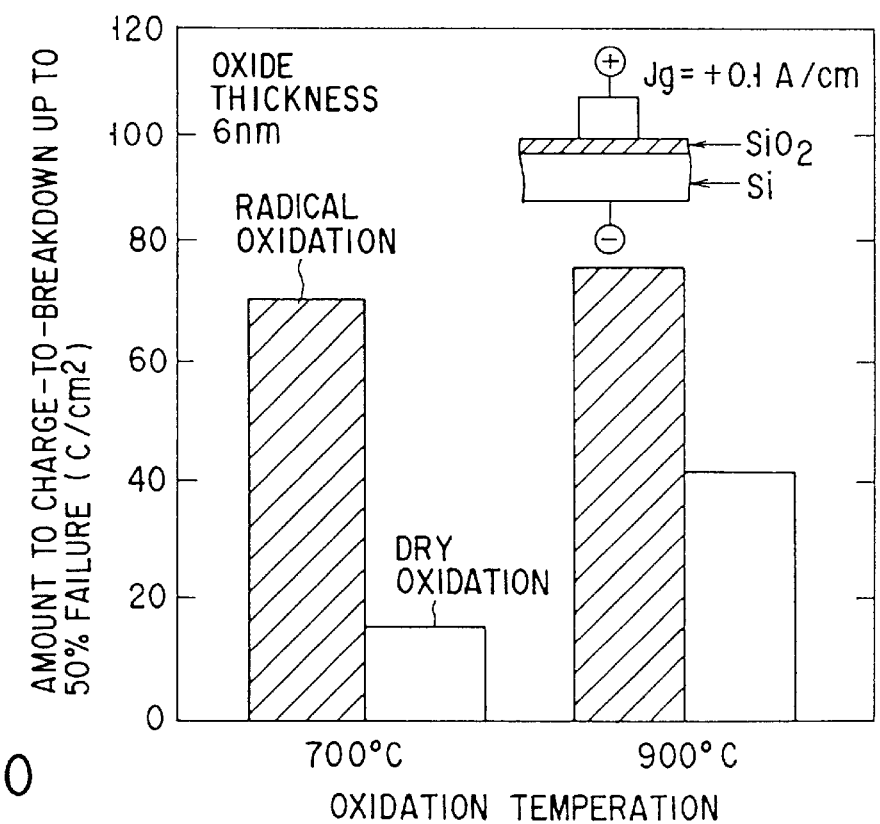
FIG. 20 is a graph showing a difference in dielectric breakdown resistance of an oxide film, depending on the kinds of oxidizing species.

FIG. 20 shows a comparison in value of Qbd of an oxide film (the total amount of electrons that have passed through the oxide film until the dielectric breakdown thereof is resulted) between the radical oxidation (oxidation by making use of the $O(^3P)$) and the conventional dry oxidation (oxidation by making use of the $O_2$). It is clear from FIG. 20 that the Qbd of radical oxidation at an oxidation temperature of 700° C. is about four times higher than that of the dry oxidation, thus indicating an improvement on the dielectric breakdown resistance of the oxide film which was formed by means of the radical oxidation. Even at an oxidation temperature of 900° C., the Qbd of radical oxidation is about two times higher than that of the dry oxidation, thus indicating that the radical oxidation is effective in improving the electric reliability of the oxide film.

In this case, the radical oxidation was performed by a process wherein a microwave discharging was applied to a low pressure oxygen gas under conditions of: 2.45 GHz in frequency and 200 W in output, and the silicon substrate was exposed to the downflow atmosphere of the resultant plasma. The pressure of this atmosphere was set to 5 Torr for instance. On the other hand, the dry oxidation was performed for instance by exposing the silicon substrate to a dry oxygen atmosphere of the normal pressure at a temperature of 900° C.

Even if the oxidation temperature is 550° C. or less, it is still possible to obtain the effect of flattening the surface of silicon substrate that can be brought about by the removal of an oxide film after a flat oxide film/silicon layer interface is formed through an oxidation by making use of the oxygen radical $O(^3P)$. However, when the oxidation temperature is higher than 550° C., the reactivity of the radical can be enhanced and hence the flattening of the oxide film/silicon layer interface can be enhanced, thus further enhancing the flatness of the surface of silicon substrate upon the removal of the oxide film.

Then, by means of an X-ray reflection method, the radical oxide film which has been formed by making use of the oxygen radical $O(^3P)$ was compared, with regard to the density of the oxide film, with the thermal oxide film which has been formed by making use of dry oxidation. The conditions for forming the samples of the oxide film which were employed for the measurement of density were: 930° C., 5 Torr and 15 minutes for the radical oxidation; and 900° C., normal pressure and 10 minutes for the dry oxidation.

Since the density of the oxide film varies in thicknesswise, the oxide film is assumed as being formed of a 2-ply model where the oxide film is in separated into two sides, i.e., one side portion which faces the oxide film/substrate interface and the other side portion which faces the oxidizing atmosphere, thereby obtaining the following results.

In the case of radical oxide film, the density of a region about 11 nm in thickness of the oxide film/substrate interface side was 2.386 g/cm$^3$, whereas the density of a region about 2 nm in thickness of the oxidizing atmosphere side was 2.280 g/cm$^3$.

In contrast to the density of about 2.3 g/cm$^3$ in the case of the thermal oxide film, the density of most of the radical oxide film is about 2.4 g/cm$^3$, thus indicating an increased density of the radical oxide film. This increased density of the radical oxide film over the thermal oxide film is reflected on the larger value of Qbd of the radical oxide film as compared with that of the thermal oxide film as shown in FIG. 20.

Just like the improving effect of the O($^1$D) oxidation on the underlying tunnel oxide film as mentioned in the previous embodiment, the O($^3$P) oxidation is also effective in improving the underlying tunnel oxide film at a high temperature exceeding over 550° C.

For example, as an underlying oxide film, the surface of silicon substrate heated to 1,000° C. is exposed to a hydrogen combustion atmosphere of the normal pressure for 3 minutes thereby to form a thermal oxide film having a thickness of 8 nm for instance.

Further, as an underlying oxide film, the surface of silicon substrate heated to 900° C. for instance is exposed to a hydrogen combustion atmosphere of the normal pressure for 5 minutes thereby to form a wet oxide film having a thickness of 8 nm for instance.

Furthermore, as an underlying oxide film, the surface of silicon substrate heated to 900° C. for instance is exposed to about 7% $O_2/O_3$ atmosphere of 5 Torr for 15 minutes thereby to form an ozone oxide film having a thickness of 8 nm for instance. In this case, the ozone-containing gas can be formed by making use of an ozonizer for instance.

Then, these underlying oxide films are exposed to the microwave plasma downflow atmosphere of oxygen gas for 10 minutes under the conditions of: 900° C. in temperature, 5 Torr in pressure, 2.45 GHz in discharge frequency and 200 W in discharging output, whereby obtaining oxide films having a thickness of 10 nm for instance. The silicon oxide films thus obtained are enhanced in flatness of the substrate/oxide film interface due to the effect by the active oxygen radical O($^3$P) and high in density of oxide film, and hence the dielectric breakdown resistance of the oxide films can be improved. It is also possible to employ a silicon oxide film to be formed by means of a CVD method or a spin-on-glass method as an underlying oxide film to be treated in the oxygen radical O($^3$P) atmosphere.

As for the source for generating the oxygen radical O($^3$P) to be employed for the oxidation at a temperature exceeding over 550° C., it is preferable to employ a plasma atmosphere, ozone, light irradiation and active metallic surface.

As for the raw material gas for generating the O($^3$P), it is preferable to employ a gas containing a molecule having oxygen atom. For example, as mentioned above, oxygen gas ($O_2$), ozone gas ($O_3$), nitrogen monoxide, dinitrogen monoxide, nitrogen dioxide, water vapor and hydrogen peroxide can be employed.

As for the plasma atmosphere for generating the O($^3$P), a parallel plate plasma, a helicon plasma, electron cyclotron resonance plasma or a radical beam may be employed in place of the microwave discharge plasma mentioned above in this embodiment.

As for the means for generating the O($^3$P), the irradiation of a light having an energy capable of dissociating the raw material gas molecule can be employed. When the irradiation of light is employed, the generation of electron and ion can be suppressed, thus making it possible to selectively generate the O($^3$P) of specific excited state.

Ozone ($O_3$) may be employed as a source for the O($^3$P). Ozone would be dissociated in the vicinity of the surface of the substrate as represented by the formula: $O_3 \rightarrow O(^3P)+O_2$, thus feeding the Q($^3$P) to the substrate. Ozone may be generated through a corona discharge of a raw material gas by making use of an ozonizer. It is also possible to generate ozone by a process wherein a raw material gas is subjected to a plasma discharge or light irradiation thereby to generate the O($^3$P), which is then allowed to react with O or $O_2$ existing nearby, thus generating $O_3$.

As for the means for generating the O($^3$P), a raw material gas may be contacted with the surface of a metal or a metal oxide having a catalytic action. For example, when a tungsten filament is heated to 1,500° C., an oxygen gas can be decomposed into the O($^3$P) (Ikegami, Ohmori, Ikeda, Iwano, Zaima and Yasuda; Extended Abstracts of the 1995 International Conference On Solid State Devices and Materials, Osaka, pp. 16–18 (1995)). Further, it is also possible to employ the surface of a metal such as platinum or gold, which is stable against an oxygen atmosphere and has a catalytic action. These catalysts can be employed by heating them at a temperature of about 150 to 1,000° C., or cooling them to a temperature of about −50 to 0° C.

Figure 21:
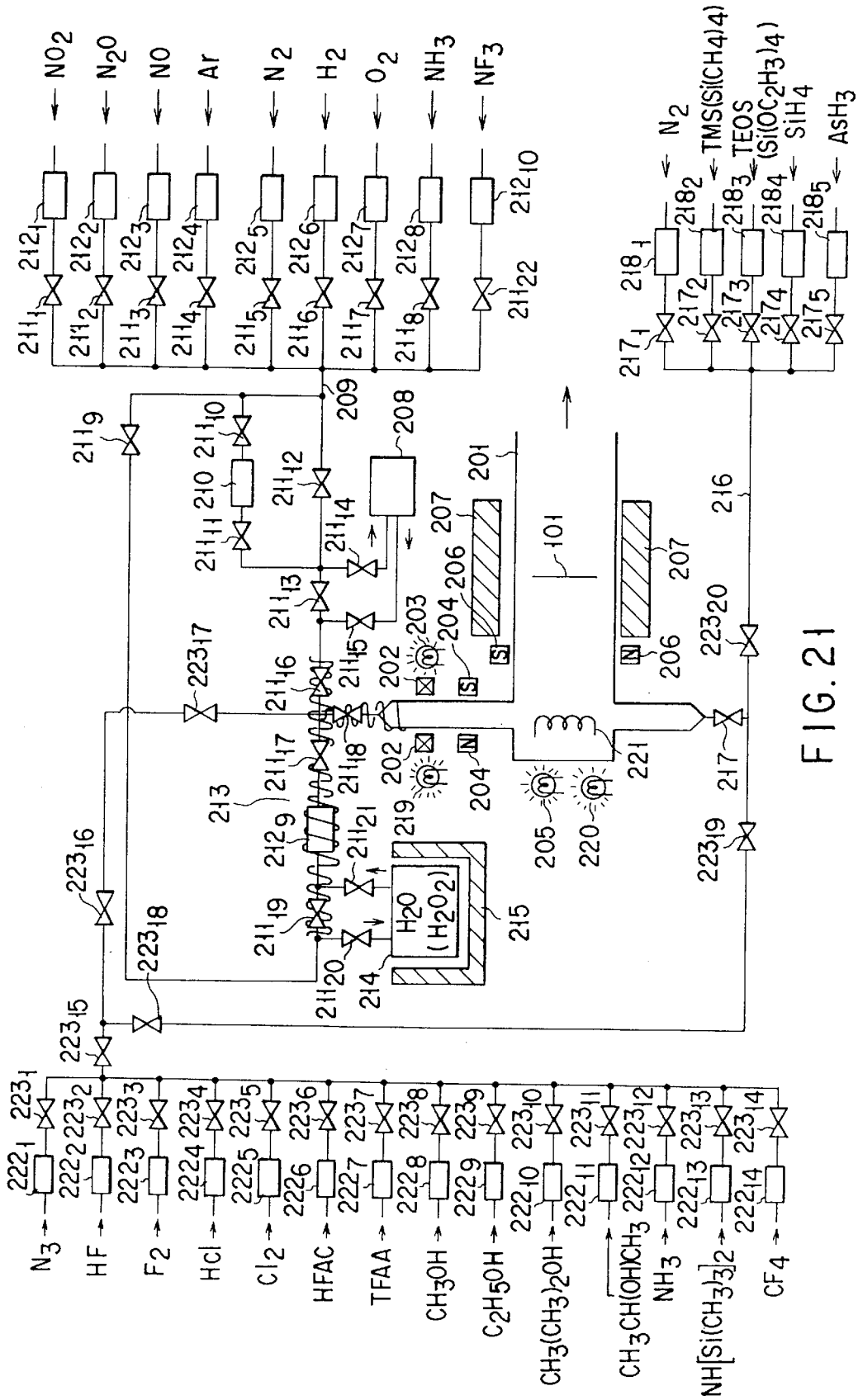
FIG. 21 is a diagram schematically illustrating the semiconductor manufacturing apparatus according to the third embodiment of the present invention.

Next, an apparatus for manufacturing a semiconductor according to this embodiment will be explained. FIG. 21 shows schematically the structure of this semiconductor manufacturing apparatus according to this embodiment. For simplification, the details of the controlling devices, wirings, cooling water circulating lines of each unit are omitted in FIG. 21. In FIG. 21, the same portions as those of FIG. 9 are referred to by the same reference numbers.

A furnace 201 for carrying out the oxidation is made of quartz. However, other kinds of material such as BN (boron nitride), alumina, Teflon, SUS, aluminum, etc. may be employed if required. The employment of quartz is effective in preventing an oxide film to be formed through oxidation from being contaminated with a metallic impurity.

The furnace 201 is constituted by a single tube. However, the furnace 201 may be constituted by a multiple tube such as a double tube or a triple tube if required whereby allowing a purging gas to flow through a space between an inner tube and an outermost tube for preventing the substrate from being contaminated by the internal diffusion of an impurity penetrating from the outside of the furnace.

A heater 207 is employed for heating the substrate 101 to be treated. However, an infrared lamp 220 may be employed instead. Further, a heating means may be installed in the vicinity of the substrate 101. The temperature of the substrate 101 is set to about 700 to 900° C. for instance.

For generating oxygen-activated species, a microwave plasma may be generated in a low pressure oxygen gas by making use of an electrode 202 for instance. Namely, oxygen gas ($O_2$) of 5 Torr in pressure is introduced into the interior of the quartz furnace 201 through a mass flow controller 212$_7$, a valve 211$_7$, a pipe 209, and valves 211$_{12}$, 211$_{13}$, 211$_{16}$ and 211$_{18}$. More preferably, the valve 211$_{12}$ is closed so as to allow the oxygen gas to pass through a valve 211$_{10}$, a gas purifier 210 and a valve 211$_{11}$, thus enhancing the purity of the oxygen gas by the removal of impurities such water and carbon dioxide which might have been mixed in the gas. The stream of this oxygen gas is exposed to a microwave of 2.45 GHz in frequency which is emitted from the electrode 202, thereby generating a plasma. As a result, the substrate 101 is exposed to the downflow atmosphere of this plasma, thereby oxidizing the surface of the substrate.

When ozone is desired to be utilized for the oxidation, the ozonizer 208 may be employed for instance. This ozonizer 208 is provided with a cooling water-circulating system (not shown in FIG. 21). In this case, oxygen gas is introduced into the ozonizer 208 via a mass flow controller $212_7$, a valve $211_7$, a pipe 209, and valves $211_{12}$ and $211_{14}$. Then, the resultant ozone-containing oxygen gas is introduced into the interior of the quartz furnace 201 via the valves $211_{15}$, $211_{16}$ and $211_{18}$. As a result, the substrate 101 is exposed to the atmosphere of ozone-containing oxygen gas, thereby oxidizing the surface of the substrate.

When a light irradiation is desired to be utilized for the oxidation, the light source 205 is employed for instance. When oxygen gas is employed as a raw material, a low pressure mercury lamp having an emission line of 184.9 nm for instance is employed as a light source, since $O_2$ is decomposed by a light of 243 nm or less in wavelength as represented by the formula: $O_2 \rightarrow (^3P)+O(^3P)$. Oxygen gas is introduced into the furnace 201 according to the same route as in the case of the aforementioned microwave plasma, and is decomposed by means of the light source 205 in the vicinity of the substrate 101, the resultant oxygen radical being employed for the oxidation of the silicon substrate. When this light source is located as indicated by the reference number 205, oxygen radical of high intensity can be generated in the vicinity of the surface of the substrate, thus making it possible to perform the oxidation efficiently and at a high speed. In order to prevent the surface of the substrate 101 from being damaged by the irradiation of light, the substrate 101 may be directed parallel with the gas stream (the direction of the substrate 101 shown in FIG. 21 is changed), or the light may be irradiated toward the side of the substrate 101. On the other hand, if this light source is located as indicated by the reference number 203, oxygen radical can be uniformly fed to the surface of the substrate 101, thus making it possible to form an oxide film which is excellent in uniformity of film thickness.

If a metal or a metal oxide having a catalytic action is to be employed as an oxygen radical source, the catalyst is placed at the location indicated by the reference number 221, which is located on the upstream side of the substrate 101 as shown in FIG. 21. The shape of the catalyst is not confined to a wire, but may be a foil, a mesh or powder. The catalyst may be carried on other material such as alumina. When a catalyst which is required to be heated is to be employed, the catalyst may be located near the substrate 101 and heated by a heater 207 or by means of radiant heating such as an infrared lamp. It is also possible to heat the catalyst by means of resistance heating by passing an electric current directly to the catalyst. When a catalyst which is required to be cooled is to be employed, the catalyst may be cooled by passing a coolant such as water or liquid nitrogen to the vicinity of the catalyst.

The aforementioned methods of generating oxygen-activated species are all applicable to a sequential treatment (treating one by one) or a batch treatment (treating plural substrates at once) of substrate. Since the oxygen plasma and ozone can be fed to a furnace so as to uniformly supply radicals throughout the interior of the furnace, the batch treatment is more preferable. On the other hand, in the cases of light irradiation and metal/metal oxide catalyst, the radical is generated at a high concentration in the vicinity of these radical-generating sources, so that the employment of the sequential treatment is more preferable.

Fourth Embodiment

Next, the method of manufacturing an EEPROM memory cell according to the fourth embodiment of the present invention will be explained.

The manufacturing method according to this embodiment differs from that of the First Embodiment in the first half portion of method of forming a tunnel oxide film.

Figure 22A:
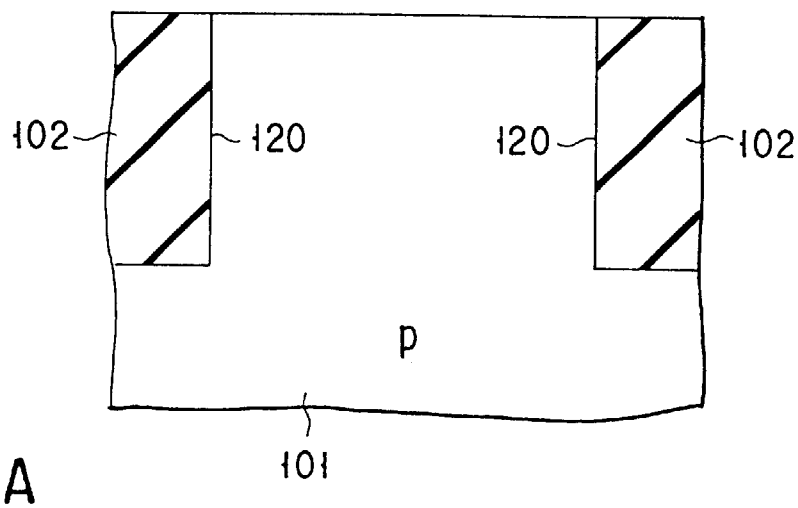
FIGS. 22A to 22C are cross-sectional views illustrating the method of manufacturing the memory cell of EEPROM according to the fourth embodiment of the present invention.

The step of FIG. 22A is the same as that of FIG. 8A. Namely, a trench 120 is formed on the surface of a p-type silicon substrate 101, and then by making use of a CVD method such as a liquid CVD method, the interior of the trench 120 is embedded with a silicon oxide film 102 thereby forming an element isolation.

Figure 22B:
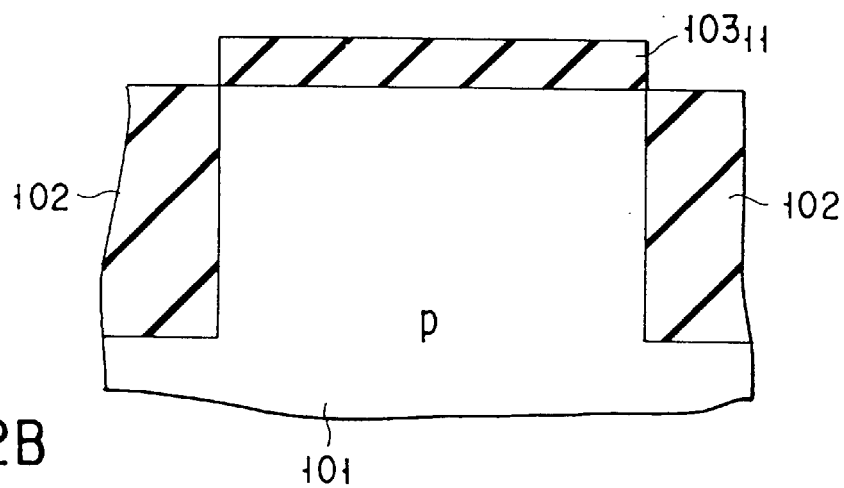

Then, as shown in FIG. 22B, the p-type silicon substrate 101 is exposed to an atmosphere of oxygen-activated species at a temperature of 550° C. for 120 minutes for instance, whereby forming a first tunnel oxide film (an underlying tunnel oxide film) 10311 having a film thickness of 5 nm.

The oxidation employing the activated species $O(^1D)$ which is preferable for the oxidation can be performed in the same manner as explained in the First Embodiment.

The tunnel oxide film $130_{11}$ may be formed by making use of the oxygen radical $O(^3P)$. For example, a silicon oxide film having a thickness of 5 nm for instance can be formed by a process wherein a microwave discharging is applied to a low pressure oxygen gas under conditions of: 2.45 GHz in frequency and 200 W in output, and the silicon substrate is exposed to the downflow atmosphere of the resultant plasma for 10 minutes. The pressure of this atmosphere may be set to 5 Torr for instance.

It is also possible to mix the oxidizing atmosphere containing these oxygen-activated species with a halogen-containing gas at a ratio of about 1 to 10% so as to add a halogen atom to an atomic defective portion or to a distorted Si—O—Si bond thereby terminating these portions with the halogen atom, thus strengthening the oxide film and hence enhancing the dielectric breakdown resistance of the oxide film. The halogen-containing gas should preferably be composed of a gas containing a molecule having a halogen atom such as $F_2$ and $Cl_2$. In order to prevent the substrate or oxide film from being etched by a halogen activated species, the halogen-containing gas should not be subjected to a microwave discharging or a discharging in the ozonizer. For example, the halogen-containing gas should be introduced to the surface of substrate without passing through the discharge electrode or the ozonizer.

Figure 22C:
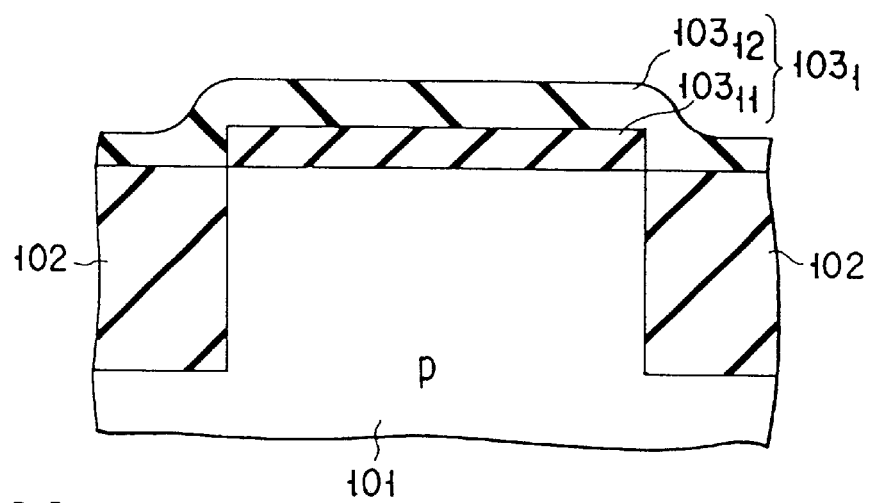

Then, as shown in FIG. 22C, a second tunnel oxide film $103_{12}$ is deposited all over the surface of the substrate by means of a low pressure CVD method. These tunnel oxide films $103_{11}$ and $103_{12}$ thus deposited correspond to the tunnel oxide film $103_1$ of the First Embodiment.

In this low pressure CVD method, a gas mixture comprising 50 sccm of silane gas and 450 sccm of dinitrogen monoxide gas is introduced to the vicinity of the substrate heated to 750° C. for 5 minutes, thereby forming a silicon oxide film having a thickness of 15 nm. The pressure of the atmosphere may be set to 1 Torr.

The oxide film may be deposited by allowing silicon difluoride $SiF_2$ to react with an oxygen radical in the vicinity of the surface of the silicon substrate. $SiF_2$ may be formed by passing a silicon tetrafluoride gas $SiF_4$ at a flow rate of about 50 sccm over the surface of silicon crystal heated to a temperature of about 1,000° C., the resultant $SiF_2$ being fed to the substrate. It is possible to employ, as an oxygen radical source, a downflow atmosphere that can be obtained by applying a microwave plasma to an oxygen gas flow of 500 cc in flow rate. The pressure of the atmosphere may be set to 1 Torr for instance. In this case, a silicon oxide film having a thickness of 15 nm can be deposited within a period of 10 minutes.

These steps of depositing a silicon oxide film can be performed in the same furnace as that employed in the step of oxidizing a silicon substrate by means of an oxygen-activated species in succession to the oxidizing step without exposing the substrate at least to the external air.

The step of depositing the tunnel oxide film $103_{12}$ may be performed in a different furnace from that employed in the step of forming the tunnel oxide film $103_{11}$ by means of the radical oxidation of silicon in succession to the oxidizing step without exposing the substrate at least to the external air.

For example, the substrate heated to 700° C. is exposed for 2 minutes to an atmosphere of TEOS (Si(OC$_2$H$_5$)$_4$) at a flow rate of 500 sccm and under a pressure of about 1 Torr, thereby forming a silicon oxide film having a thickness of 15 nm.

A silicon nitride film or a silicon nitride oxide film may be deposited as the tunnel oxide film $103_{12}$.

For example, the substrate heated to 780° C. is exposed for 5 minutes to an atmosphere comprising SiH$_2$Cl$_2$ of 50 sccm in flow rate, NH$_3$ of 500 sccm in flow rate and N$_2$ of 70 sccm in flow rate, thereby depositing a silicon nitride film having a thickness of 15 nm. The pressure of the atmosphere in this case may be set to 0.5 Torr for instance.

Alternatively, the substrate heated to 800° C. is exposed for 5 minutes to an atmosphere comprising SiH$_2$Cl$_2$ of 135 sccm in flow rate, NH$_3$ of 90 sccm in flow rate and N$_2$O of 450 sccm in flow rate, thereby depositing a silicon nitride film having a thickness of 15 nm. The pressure of the atmosphere in this case may be set to 1 Torr for instance.

Finally, the same processes as shown in FIGS. 8C to 8E explained in the First Embodiment are repeated thereby to accomplish the EEPROM memory cell.

The cross-section of the tunnel oxide film of the memory cell thus manufactured according to the method of this embodiment was then observed using a transmission electron microscope (TEM), the results being compared with that of the tunnel oxide film manufactured according to the conventional method.

As a result, as in the case of the First Embodiment, the interface between the Si substrate and the tunnel oxide film which is obtained according to the method of this embodiment (O($^1$D) oxidation and O($^3$P) oxidation) is more excellent in flatness as compared with the interfaces between the Si substrate and the tunnel oxide film which are obtained according to the conventional methods (dry oxygen oxidation). Additionally, the value of Qbd according to this embodiment is larger than that of the tunnel oxide film obtained according to the conventional method (dry oxidation).

These results are considered as being brought about due to the employment of the O($^1$D) and O($^3$P) oxide films (which is excellent in flatness at the interface thereof with the p-type silicon substrate 101 and in density) for the formation of the first tunnel oxide film $103_{11}$.

The method of this embodiment is applicable to the case where the concentration of the activated species O($^1$D) and Q($^3$P), which are preferable for the oxidation, is low and the speed for forming a tunnel oxide film is slow, and is characterized in that a first tunnel oxide film (an underlying tunnel oxide film) $103_{11}$ (which has a sufficient film thickness required for flattening the interface between the silicon substrate and the tunnel oxide film and for ensuring a high density film in the vicinity of the interface the tunnel oxide film) is formed at first by making use of the O($^1$D) and O($^3$P) atmospheres, and then a second tunnel oxide film $103_{12}$ is deposited on the first tunnel oxide film by means of a low pressure CVD method which is high in speed of forming a film. Therefore, this method is characterized in that the efficiency of film formation would be enhanced as a whole.

If the density of the film located in the vicinity of the interface between the p-type silicon substrate 101 and the tunnel oxide film $103_1$ is high, the problem being induced by the low value of Qbd, i.e., the hot electron resistance of the tunnel oxide film $103_1$ at the occasion of injecting electrons from the floating gate electrode $104_1$ to the tunnel oxide film $103_1$ can be improved, thus making it possible to enhance the electric reliability of the tunnel oxide film $103_1$.

Another parameter for the improvement of the electric reliability of the tunnel oxide film may be ascribed to the fact that due to the lamination of a different kind of oxide film (i.e., the tunnel oxide film $103_{11}$ formed by means of O($^1$D) or O($^3$P), or the tunnel oxide film $103_{12}$ formed by means of a CVD method), a route of current leak which leads to a dielectric breakdown can be hardly extended from the floating gate electrode $104_1$ to the p-type silicon substrate 101.

For improving the resistance of the tunnel oxide film $103_1$ at the occasion of injecting electrons from the p-type silicon substrate 101 to the tunnel oxide film $103_1$ in this embodiment, the tunnel oxide film $103_{12}$ may be modified by exposing it to the O($^1$D) or O($^3$P) atmosphere.

The present invention is not limited to the aforementioned embodiments. For example, although an oxidizing apparatus which is applicable to all of the aforementioned embodiments is shown in FIG. 9, an apparatus which is designed for a specific purpose may be employed. For example, when only the O($^1$D) or O($^3$P) is employed as an oxidizing species, a redundant portion of the apparatus shown in FIG. 9 may be omitted, thus modifying it to conform with such a requirement.

The heater 207 utilizing a resistance heating is employed for heating the substrate in this embodiment. However, a radiant heating such as an infrared lamp may be employed instead.

Although the substrate 101 is arranged in such a manner that the surface thereof becomes perpendicular to the gas flow in FIG. 9, the substrate 101 may be arranged in such a manner that the surface thereof becomes parallel with the gas flow.

As for the source for generating oxygen radical, a parallel plate plasma, a helicon plasma, electron cyclotron resonance plasma or a radical beam may be employed in place of the aforementioned microwave discharge.

As for the underlying film to be oxidized by means of an activated species which is desired for oxidation, a silicon oxide film, a silicon nitride film or a silicon nitride oxide film, each constituting an interlayer insulation film, may be employed other than those mentioned in the aforementioned embodiments.

It is possible, in all of these underlying layers, for the activated species (such as O($^1$D), where the spin quantum number is zero, s=0 and which is preferable for the oxidation) to easily enter into and react with these underlying layers thereby forming a dense oxide film or a dense nitride oxide film. When the O($^1$D) is penetrated to reach the interface between the underlying layer and a silicon substrate, the interface can be flattened, thus further improving the reliability of the insulation film.

The underlying film to be oxidized by means of the O($^1$D) may be constituted by the conventional thermal oxide film or ozone oxide film.

The O($^1$D) is also effective in remedying a process damage which might be brought about onto a gate oxide film or an interlayer insulation film during the manufacturing step of semiconductor, e.g., in the step of etching, CVD, lithography, etc.

Even if the O($^1$S) which is higher in singlet excitation state than the O($^1$D) is employed in place of the O($^1$D), almost the same effects as in the case of the O($^1$D) would be obtained.

As for the underlying layer to be oxidized, a GaAs substrate or an InP substrate may be employed other than a silicon substrate. Further, the underlying layer may not be a substrate but may be a polycrystalline layer or amorphous layer of Si, GaAs or InP.

In the foregoing explanation, a technique of utilizing an activated species which is optimum for an oxidation step, i.e., part of the process for manufacturing a semiconductor, has been explained. However, it is also possible apply the present invention to other steps (i.e., other than the oxidation step) where other kinds of activated species can be employed such as the steps of plasma CVD, plasma washing, etching, resist removal, etc. Namely, by forming a high concentration of activated species which is optimum for a specific step, these steps can be improved. For example, the treatment efficiency (through-put) of substrate and the quality of the film to be formed would be improved, or the damage of underlying layer in the process of the removal of an upper layer or in the process of washing would be inhibited.

The present invention is also applicable to the formation of a silicon oxide film of other than EEPROM, e.g., a gate oxide film of MOSFET for instance.

Fifth Embodiment

FIGS. 23A to 23D illustrate the Fifth Embodiment of the present invention, wherein an improvement on the flatness of the interface between a gate oxide film and a silicon substrate by the application of the present invention to a pretreatment prior to the step of forming a gate oxide film is explained. The steps shown in FIGS. 23A to 23D illustrate the present invention, whereas the steps shown in FIGS. 24A to 24D illustrate the prior art for comparison.

Figure 23A:
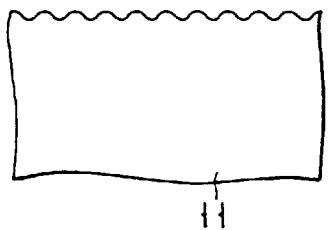
FIGS. 23A to 23D are cross-sectional views illustrating the fifth embodiment of the present invention.
Figure 23B:
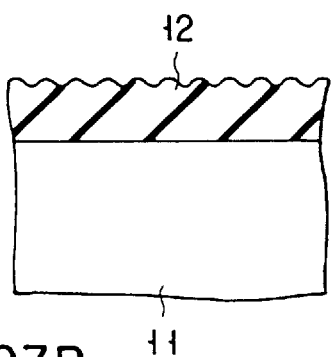
Figure 24B:
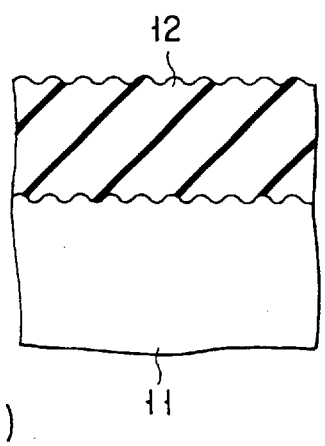

First, as shown in FIG. 23A, a silicon substrate 11 is prepared (the surface of the silicon substrate is roughened), and then a buffer oxide film 12 (the film thickness should preferably be 8 nm or more) is formed as shown in FIG. 23B by means of oxygen radical oxidation.

For example, a silicon oxide film having a thickness of 10 nm for instance is formed by a process wherein a microwave plasma was applied to an oxygen gas flow of about 800 sccm in flow rate under conditions of: 2.45 GHz in frequency and 200 W in output, and the silicon substrate heated to 930° C. for instance is exposed to the resultant downflow atmosphere for 15 minutes for instance. The pressure of this atmosphere is set to 5 Torr for instance.

Alternatively, an ozone-containing gas (for example, amount 7% $O_3/O_2$) is formed at first in an ozonizer, and then the surface of a silicon substrate heated to a temperature of 930° C. for instance is exposed to an atmosphere of this ozone-containing gas for 20 minutes for instance, thereby forming a silicon oxide film having a thickness of 10 nm for instance. In this case, the pressure of the atmosphere may be 5 Torr.

The temperature of the substrate should preferably be more than 550° C., more preferably in the range of from 600° C. to 950° C. for enhancing the reactivity of the O($^3$P) and of suppressing the growth of oxide film due to the dry oxidation.

Figure 24A:
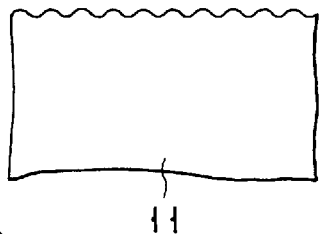
FIGS. 24A to 24D are cross-sectional views illustrating the prior art in comparison with the fifth embodiment of the present invention.

In the case of the prior art, a buffer oxide film 12 is formed by making use of the ordinary thermal oxidation as shown in FIG. 24A. For example, a silicon substrate is exposed to a dry oxygen atmosphere of 20 L/min in flow rate and 1,000° C. in temperature for 20 minutes thereby to form a silicon oxide film having a thickness of 20 nm. At this moment, the interface between the silicon substrate 11 and the buffer oxide film 12 is roughened when the buffer oxide film 12 is formed by making use of the prior art, whereas the interface between the silicon substrate 11 and the buffer oxide film 12 is flattened in atomic level when the buffer oxide film 12 is formed by making use of the oxygen radical oxidation of the present invention. The reason for this phenomenon may be explained as follows.

The reason for the achievement of flattening of the substrate/oxide film interface in atomic level by the employment of oxygen radical oxidation may be ascribed to the fact that an active oxygen atom radical has been fed to the silicon substrate in contrast to the conventional thermal oxidation. In the case of both thermal oxidation and radical oxidation, the concentration of the diffusing oxidation species decrease gradually in proportion to an increase in depth as measured from the surface of the oxide film (facing the oxidizing atmosphere) to the interior of the oxide film. When the flatness of the interface is relatively low, the projected portion of the substrate at the interface (a portion of substrate which is protruded into the oxide film) is located closer to the surface of the oxide film than the concave portion (a portion of oxide film which is protruded into the substrate), so that the concentration of oxidizing species to be fed to the projected portion becomes higher, thus improving the flatness of the interface. When the flatness of the interface is relatively high, the process of oxidation reaction is considered to be inhibited due to the interface stress between the substrate and the oxide film where the distance between atoms differs from each other. In the case of the conventional thermal oxidation, since the reactivity of the oxidizing species at the substrate/oxide film interface is not so high, the process of oxidizing reaction is inhibited due to the stress of the interface which has been enhanced in flatness, and hence the improvement of flatness at the interface is caused to saturate even if the roughness of the interface is still remained in some degree. In contrast to that, when oxygen atom radical is fed from the oxidation atmosphere, it is considered that this active oxidizing species reaches the substrate/oxide film interface and overcomes the barrier (due to the stress at the interface) of oxidation reaction, so that the projected portion of the substrate which is closer to the surface of the oxide film is preferentially oxidized, thus making it possible to flatten the interface in atomic level.

It is possible, through the employment of O($^1$D) which is more preferable for oxidation than O($^3$P), to flatten the oxide film/substrate interface at a lower temperature and with a smaller oxide film thickness than the case where the O($^3$P) is employed. At the same time, the effect of flattening the interface between the semiconductor and the oxide film would be enhanced.

Figure 23C:
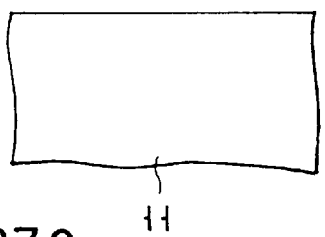
Figure 24C:
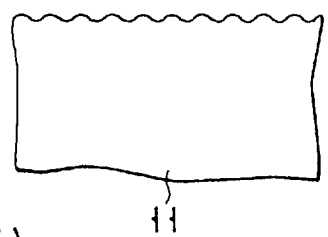

After the buffer oxide film 12 is formed in this manner, the buffer oxide film 12 is removed as shown in FIG. 23C. As a matter of fact, a sample was prepared by a process wherein a buffer oxide film was formed on the surface of a silicon substrate (p-type (100)) under the predetermined conditions (930° C., 15 minutes and 10 nm in film thickness), and then the buffer oxide film was removed (0.25% HF, 12 minutes), the flatness of the resultant sample being subsequently evaluated by means of a transmission electron microscope (TEM). As a result, the buffer oxide film/substrate interface was found as being flat in atomic level, and the surface of the substrate after the removal of the oxide film was also found as being flat in atomic level. By contrast, in the case of the sample which was manufactured according to the prior art (1,000° C., thermal oxidation by making use of dry oxygen for 20 minutes and 20 nm in film thickness), a roughness at a height of several atomic layer was recognized at the buffer oxide film/substrate interface, and the surface of the substrate after the removal of the oxide film was also found as being roughened.

Figure 23D:
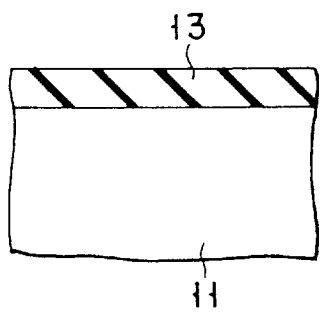
Figure 24D:
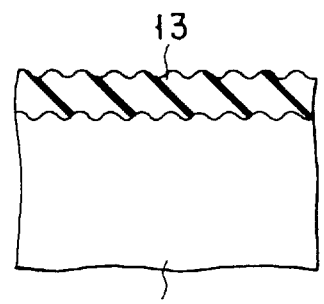

After the buffer oxide film 12 is removed, a gate oxide film 13 is formed by making use of oxygen radical oxidation as shown in FIG. 23D. As a result, a substrate/gate oxide film interface which is flattened in atomic level can be obtained even if the film thickness of the gate oxide film 13 is as thin as less than 8 nm.

When the thickness of oxide film is as thin as 5 nm or less, it is possible, even through the conventional dry oxidation or wet oxidation, to obtain a flat oxide film/substrate interface after oxidation, provided that the surface of silicon substrate is preliminarily flattened prior to the oxidation. Because, when the thickness of the oxide film is small, the roughness of the surface of silicon substrate before the oxidation would be greatly reflected on the flatness of the oxide film/substrate interface after oxidation.

In this case, the oxygen radical oxidation was performed by a process wherein a microwave plasma was applied to oxygen gas under conditions of: 2.45 GHz in frequency and 200 W in output, and the silicon substrate heated to 900° C. was exposed for one minute to the downflow atmosphere of the resultant plasma. The pressure of this atmosphere was set to 5 Torr for instance, and the silicon oxide film obtained was 3 nm in thickness for instance.

On the other hand, the dry oxidation was performed for instance by exposing the silicon substrate to a dry oxygen atmosphere of the normal pressure at a temperature of 900° C. for 2 minutes, thereby obtaining a silicon oxide film having a thickness of 3 nm for instance.

The wet oxidation was performed for instance by exposing the silicon substrate to a hydrogen combustion atmosphere (which was diluted with nitrogen gas to 50%) of the normal pressure for 2 minutes for instance, thereby obtaining a silicon oxide film having a thickness of 3 nm for instance.

A thin film oxide film may be formed by making use of an ozone atmosphere. For example, an ozone-containing gas (for example, about 7% $O_3/O_2$) is formed at first in an ozonizer, and then the surface of a silicon substrate heated to a temperature of 900° C. for instance is exposed to an atmosphere of this ozone-containing gas for 5 minutes for instance, thereby forming a silicon oxide film having a thickness of 3 nm. In this case, the pressure of the atmosphere may be set to 5 Torr for instance.

By contrast, when the buffer oxide film 12 is formed by means of thermal oxidation according to the prior art, it is impossible to assure a sufficient flatness of the surface of the substrate 11 prior to the formation of the gate oxide film 13, so that even if oxygen radical oxidation having a high effect for flattening the substrate/oxide film interface is employed, it is impossible to obtain a flat substrate/gate oxide interface.

Sixth Embodiment

Figure 25A:
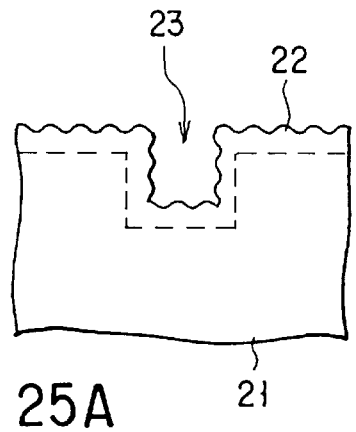
FIGS. 25A to 25C are cross-sectional views illustrating the sixth embodiment of the present invention.
Figure 25B:
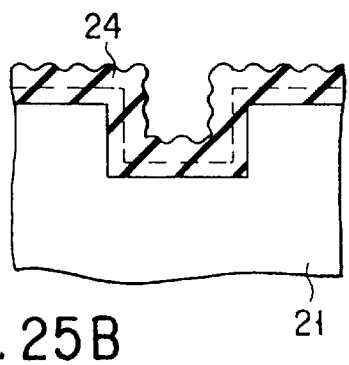
Figure 25C:
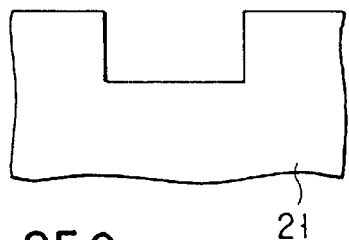

FIGS. 25A to 25C illustrate the Sixth Embodiment of the present invention, wherein the application of the present invention to a pretreatment prior to the step of embedding a hole or a trench formed on the surface of substrate is explained. The steps shown in FIGS. 25A to 25C illustrate the present invention, whereas the steps shown in FIGS. 26A to 26C illustrate the prior art for comparison.

Figure 26A:
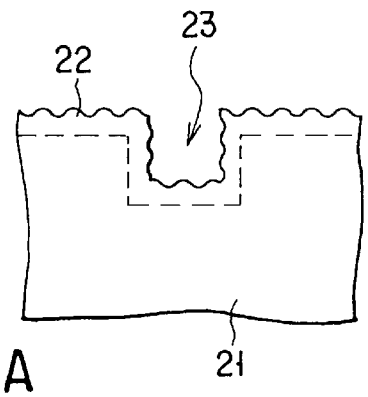
FIGS. 26A to 26C are cross-sectional views illustrating the prior art in comparison with the sixth embodiment of the present invention.

First, as shown in FIGS. 25A and 26A, a hole or a trench 23 is formed on the surface of the silicon substrate 21 by means of RIE. In this case, all RIE damage layer 22 is formed on the surface of the substrate. Then, as shown in FIG. 25B, a buffer oxide film 24 (the film thickness thereof should preferably be 8 nm or more) by means of oxygen radical oxidation. For example, a silicon oxide film having a thickness of 10 nm for instance is formed by a process wherein a microwave plasma was applied to an oxygen gas flow of 800 sccm in flow rate under conditions of: 2.45 GHz in frequency and 200 W in output, and the silicon substrate heated to 930° C. for instance is exposed to the resultant downflow atmosphere for 15 minutes for instance. The pressure of this atmosphere is set to 5 Torr for instance.

Figure 26B:
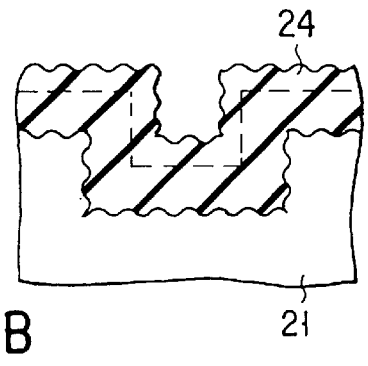
Figure 26C:
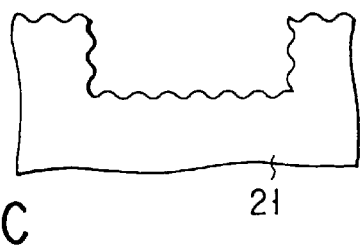

In the case of the prior art, a buffer oxide film 24 is formed by making use of the ordinary thermal oxidation as shown in FIG. 26B. For example, a silicon substrate is exposed to a dry oxygen atmosphere of 20 L/min in flow rate and 1,000° C. in temperature for 20 minutes thereby to form a silicon oxide film having a thickness of 20 nm. Subsequently, as shown in FIGS. 25C and 26C, the buffer oxide film 24 is removed. For example, the substrate is immersed in a 0.25% aqueous solution of hydrogen fluoride for 12 minutes for instance.

When the buffer oxide film 24 is formed according to the prior art, a fairly large portion (large film thickness) of not only the RIE damage layer (a region of over the dotted line) but also the non-damaged layer (a region of below the dotted line) is included in the buffer oxide film 24. Therefore, the flatness of the surface of substrate after the removal of the buffer oxide layer is very bad, and at the same time, the width and depth of the trench or hole are excessively extended, thus hindering the miniaturization of semiconductor element. Further, since the bottom surface and side wall are extremely roughened, the dielectric breakdown of an insulating layer to be embedded in a subsequent step tends to be caused. By contrast, if the buffer oxide film 24 is formed by means of oxygen radical oxidation to a film thickness which is slightly larger than the RIE damage layer, the loss of the surface layer of substrate due to the buffer oxidation can be minimized, thus contributing to the miniaturization of semiconductor element, and at the same time, the surface of substrate as well as the bottom surface and side wall of the hole or trench would be extremely flattened. Furthermore, the upper edge portion of the hole or trench would be rounded, thus improving the dielectric breakdown resistance of an insulation film to be embedded therein in a subsequent step.

For example, according to the present invention, an oxide film having a thickness of 10 nm is formed at first by means of radical oxidation on the inner wall and bottom surface of an element isolation trench having a width of 0.5 $\mu$m and a depth of 0.4 $\mu$m, and then, the trench is filled with a silicon oxide film by means of CVD method employing TEOS $(Si(OC_2H_5)_4)$ for instance. For example, a substrate heated to 700° C. is exposed to a TEOS gas flow 50 sccm in flow rate and 1 Torr in pressure for 30 minutes thereby embedding the trench with the silicon oxide film.

Alternatively, an oxide film having a thickness of 10 nm may be formed at first by means of radical oxidation on the inner wall and bottom surface of a trench capacitor having a width of 0.4 µm and a depth of 4 µm, and after these surfaces are flattened by a process of removing the oxide film with hydrofluoric acid, the inner wall of the hole is oxidized in an oxidizing atmosphere and the hole is filled with a dielectric substance.

The oxidation of the flattened inner wall of the trench may be carried out by a process wherein a silicon substrate is exposed to a dry oxygen atmosphere of 20 L/min in flow rate and 1,000° C. in temperature for 20 minutes thereby to form a silicon oxide film having a thickness of 20 nm. By the way, it is also possible in this oxidation to employ other kinds of oxidizing method employing a wet oxidizing atmosphere, an oxygen radical atmosphere or an ozone atmosphere.

The deposition of a polysilicon layer in the interior of the trench whose inner wall is deposited with an oxide film may be performed by making use of a low pressure CVD method. For example, a silane gas is introduced to the vicinity of the substrate as a flow rate of 100 sccm for instance under a pressure of 0.1 Torr for instance. Under these conditions, the filling of trench with polysilicon is performed taking about 40 minutes while maintaining the temperature of the substrate to 620° C. It is also possible to employ, in place of the polysilicon layer, a ferroelectric substance such as RZT (Pb—Zn—Ti oxide) and BSTO (Ba—Sr—Ti oxide).

In any of these embodiments, it is possible to improve the flatness of the hole or trench as compared with the conventional method where an oxide film is removed after a dry oxidation, thus making it possible to improve, over the prior art, the dielectric breakdown resistance of the element isolation trench or of the trench capacitor after the embedding of the hole or trench.

In the foregoing explanation of this embodiment, it has been explained that the film thickness of the buffer oxide film should preferably be 8 nm with a view to flatten the surface of silicon layer. Followings are additional explanation on this value.

Figure 27:
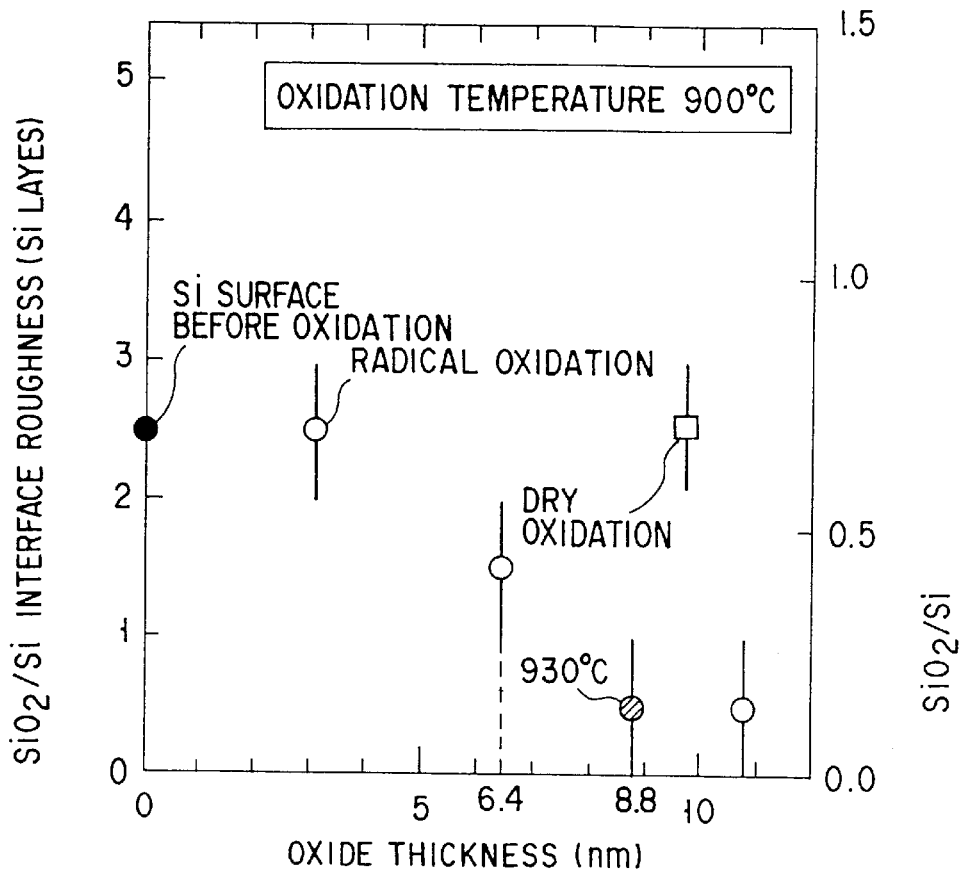
FIG. 27 is a graph illustrating the dependency of the roughness of the interface between the silicon oxide film/the silicon substrate on the thickness of oxide film.

FIG. 27 shows the dependency of the roughness of $SiO_2$/Si(100) interface on the thickness of oxide film, which has been examined on a silicon oxide film formed by means of radical oxidation (the oxidation by making use of oxygen-activated species). In this case, the roughness of interface is based on the height between the highest point and the lowest point on the $SiO_2$/Si interface as measured using a photograph of $SiO_2$/Si(100) interface taken from the TEM (transmission electron microscope). In this case, the visual field of TEM photograph in the direction of interface is about 70 nm. It would be clear from FIG. 27 that the smaller the $SiO_2$/Si(100) interface roughness is, the higher the flatness of the surface of the silicon layer is after the removal of oxide film.

As shown in FIG. 27, there is a roughness having a height corresponding to 2 to 3 atomic layers on the ordinary Si(100) surface before oxidation. When this surface is oxidized, the height of this $SiO_2$/Si(100) interface roughness becomes smaller with the progress of oxidation. When this surface is oxidized by making use of oxygen radical so as to form an oxide film having a thickness exceeding over 6.4 nm, the height of this $SiO_2$/Si(100) interface roughness becomes one atomic layer or less, thus making it possible to obtain a flat $SiO_2$/Si(100) interface of atomic level. On the other hand, in the case of the conventional dry oxidation, an interface roughness having a height corresponding to 1–2 atomic layers would be left even if an oxide film of 10 nm in thickness is formed, thus failing to obtain a flat $SiO_2$/Si(100) interface. Therefore, if a flat (in atomic level) silicon surface is desired, it will be achieved by a process wherein an oxide film having a thickness exceeding over 6.4 nm is formed by means of radical oxidation at first, and then this oxide film is removed.

Seventh Embodiment

This embodiment explains a case where the roughness of the surface of semiconductor substrate before oxidation is fairly large.

Figure 28:
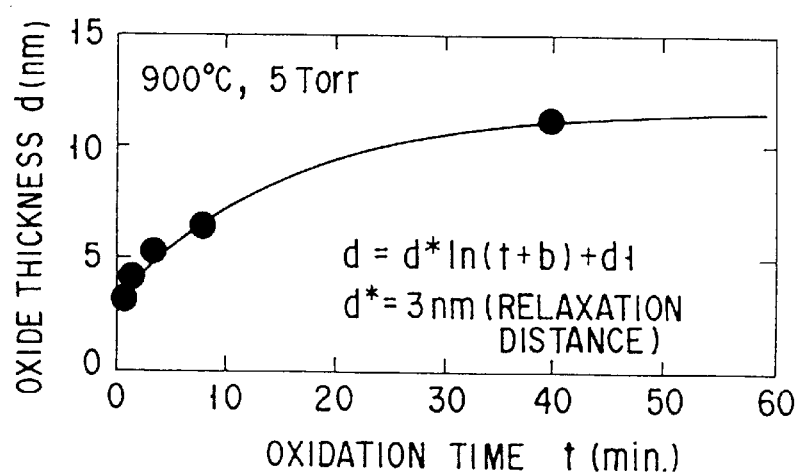
FIG. 28 is a graph illustrating the dependency of the thickness of oxide film on the oxidation time.

When the roughness of the surface of semiconductor substrate before a buffer oxidation is fairly large, this roughness before oxidation cannot be eliminated even if an oxide film having a thickness exceeding about 8 to 10 nm is formed by means of buffer oxidation employing an oxygen-activated species. It may be possible to further increase the thickness of the buffer oxide film to be formed by making use of oxygen-activated species. However, since the growth of oxide film through an oxygen radical oxidation tends to saturate as shown in FIG. 28, the method of increasing the thickness of buffer oxide film by making use of oxygen-activated species is not so effective. Therefore, it is more preferable to repeat the process of forming and removing the oxide film as shown in FIGS. 29A to 29E.

The reason for enabling a flatness (in atomic level) of oxide film/silicon substrate to be obtained by an oxidation by making-use of oxygen-activated species can be explained as follows from the comparison of the speed of growing oxide film through this oxidation.

FIG. 28 illustrates the dependency of the thickness of oxide film to be formed by making use of oxygen-activated species on the oxidation time. At the initial stage of oxidation, the oxide film is rapidly grown, but the increase in film thickness is gradually suppressed with a growth of the oxide film. Accordingly, the oxidation by means of oxygen-activated species is characterized in that the oxidation by means of oxygen radical proceeds rapidly, while the diffusion of oxygen radical is suppressed in the oxide film. The fact that the growth speed of oxide film is fitted by a logarithmic function as shown in this FIG. 28 indicates that the oxygen radical is inactivated in the process of oxidation. The depth wherein the oxygen radical concentration in the oxide film becomes 1/e (e: the base of natural logarithm) of that of the surface of the oxide film can be represented by the formula: relaxation distance d*=3 nm.

FIG. 27 indicates that the effect of flattening the oxide film/substrate interface can be recognized in the range where the film thickness exceeds over 6.4 nm. Since this film thickness is far larger than that of the relaxation distance d* shown in FIG. 28, the oxygen radical concentration in the vicinity of the oxide film/substrate interface is considered to be extremely minimized due to the inactivation of the radical in the oxide film. Therefore, it is assumed that oxygen radical can be easily moved in the direction of the interface in the vicinity of the oxide film/substrate interface, and that the roughness in one atomic level at the interface can be detected by the radical, whereby Si atoms existing in the projected portion of the roughness at the interface and not yet oxidized are preferentially oxidized by the oxygen radical, thus flattening the interface in atomic level.

According to FIG. 27, there is a roughness corresponding to about 3-ply atomic layer on the surface of the silicon substrate before oxidation, and the height of the roughness is about 0.8 to 1 nm. In order to eliminate this roughness, an oxide film having a thickness ranging from more than 6.4 nm to about 10 nm is required to be formed by means of radical oxidation. Therefore, in order to eliminate the roughness on the silicon surface by means of radical oxidation, it is preferable to form an oxide film to a thickness about ten times as large as the height of roughness, and then to remove the oxide film.

FIGS. 29A to 29E illustrates an example of repeating the process of forming and removing an oxide film for flattening a highly roughened surface of a semiconductor substrate, wherein the process of flattening the inner wall of trench is exemplified.

Figure 29A:
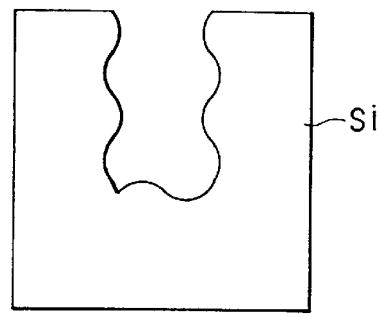
FIGS. 29A to 29E are cross-sectional views illustrating part of the manufacturing method according to the seventh embodiment of the present invention.

FIG. 29A shows a configuration of trench formed immediately after an RIE (reactive ion etching) step.

Figure 29B:
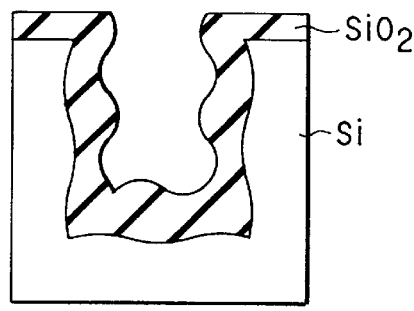
Figure 29C:
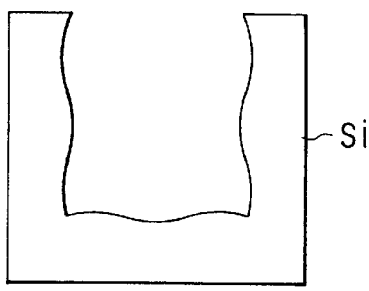

Then, a first buffer oxidation was performed on this trench formed immediately after RIE, thereby obtaining the configuration of FIG. 29B. Then, $SiO_2$ was removed to obtain a trench where the roughness on the inner wall was improved as shown in FIG. 29C. This first buffer oxidation may be performed not only by making use of oxygen-activated species but also by making use of a dry oxidation, a wet oxidation in a water vapor atmosphere, an oxidation in a hydrochloric acid atmosphere, an oxidation in liquid phase containing ozone or hydrogen peroxide, or an oxidation according to the prior art.

The trench employed in this case was 0.4 μm in width and 0.4 μm in depth. An oxygen radical atmosphere was employed in this first buffer oxidation. For example, the oxygen radical oxidation was performed by a process wherein a microwave plasma was applied to oxygen gas about 800 sccm in flow rate under conditions of: 2.45 GHz in frequency and 200 W in discharge output, and the silicon substrate heated to 900° C. was exposed for 30 minutes to the downflow atmosphere of the resultant plasma. The pressure of this atmosphere was set to 5 Torr for instance, and the silicon oxide film obtained was 10 nm in thickness for instance. After the formation of the oxide film, the substrate was immersed in a 0.25% aqueous solution of hydrogen fluoride for 12 minutes thereby to remove the oxide film.

Figure 29D:
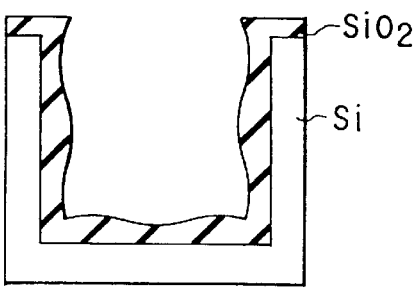
Figure 29E:
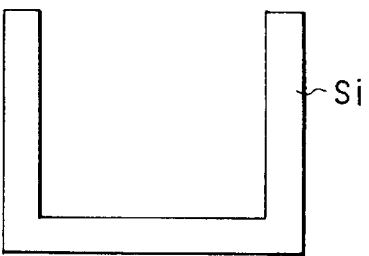

After the flatness of the inner wall of the trench was enhanced to some extent by the first buffer oxidation, a second buffer oxidation was performed on this trench, thereby obtaining the configuration of FIG. 29D. Then, $SiO_2$ was removed to obtain a trench where the roughness on the inner wall was further improved as shown in FIG. 29E. In order to enhance the flatness of the inner wall of the trench after the removal of oxide film, the employment of oxidizing activated species is preferable for the second buffer oxidation.

An oxygen radical atmosphere was employed in this second buffer oxidation. For example, the oxygen radical oxidation was performed by a process wherein a microwave plasma was applied to oxygen gas about 800 sccm in flow rate under conditions of: 2.45 GHz in frequency and 200 W in output, and the silicon substrate heated to 900° C. for instance was exposed for one minutes to the downflow atmosphere of the resultant plasma. The pressure of this atmosphere was set to 5 Torr for instance, and the silicon oxide film obtained was 10 nm in thickness for instance. After the formation of the oxide film, the substrate was immersed in a 0.25% aqueous solution of hydrogen fluoride for 12 minutes thereby to remove the oxide film.

The aforementioned first buffer oxidation may be repeated plural times for enhancing the flatness of the semiconductor surface. It is also possible to perform a pretreatment after the second buffer oxidation, i.e., an oxidation and a subsequent removal of oxide film may be additionally performed in such a manner that the flattened semiconductor surface would not be deteriorated.

Eighth Embodiment

FIGS. 30A to 30D illustrate the Eighth Embodiment of the present invention, wherein the application of the present invention to the flattening of the surface of substrate which has been exposed at the bottom of a contact hole is explained. The steps shown in FIGS. 30A to 30D illustrate the present invention, whereas the steps shown in FIGS. 31A and 31B illustrate the prior art for comparison. By the way, the step of FIG. 31B corresponds to the step of FIG. 30D.

Figure 30A:
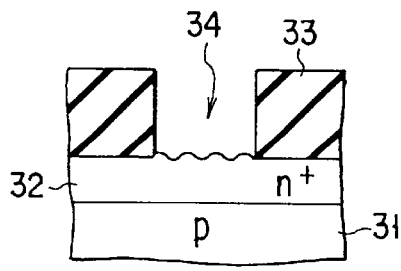
FIGS. 30A to 30D are cross-sectional views illustrating the eighth embodiment of the present invention.
Figure 30B:
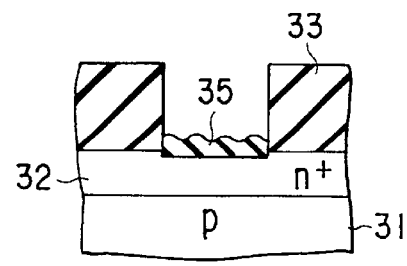
Figure 30C:
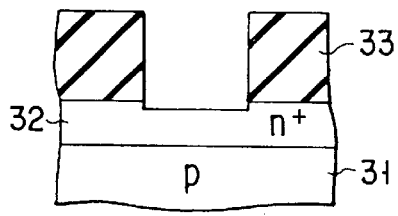
Figure 30D:
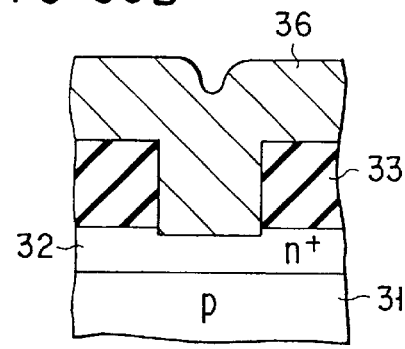
Figure 31A:
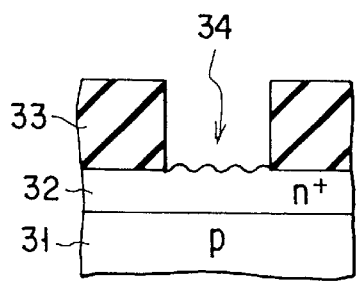
FIGS. 31A to 31B are cross-sectional views illustrating the prior art in comparison with the eighth embodiment of the present invention.
Figure 31B:
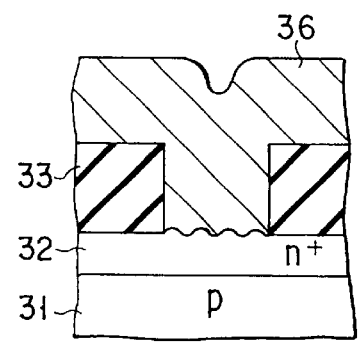

First, as shown in FIGS. 30A and 31A, an impurity diffusion layer 32 and an interlayer insulation film 33 are formed on the surface of the silicon substrate 31 for forming source-drain regions. Then, a contact hole 34 is formed by making use of RIE. At this occasion, the exposed surface of the impurity diffusion layer 32 is roughened. Subsequently, after a contact hole is formed, a buffer oxide film 35 (the film thickness thereof should preferably be 8 nm or more) is formed at the bottom surface of the contact hole by means of oxygen radical oxidation as shown in FIG. 30B. Thereafter, as shown in FIG. 30C, the buffer oxide film 35 is removed and then a metal wiring layer 36 is formed as shown in FIG. 30D.

In this case, the contact hole formed was 0.3 μm in width and 500 nm in depth for instance. An oxygen radical atmosphere was employed in the formation of the buffer oxide film 35 on the bottom surface of the contact hole. For example, the oxygen radical oxidation was performed by a process wherein a microwave plasma was applied to oxygen gas about 800 sccm in flow rate under conditions of: 2.45 GHz in frequency and 200 W in output, and the silicon substrate heated to 700° C. was exposed for 90 minutes to the downflow atmosphere of the resultant plasma. The pressure of this atmosphere was set to 5 Torr for instance, and the silicon oxide film obtained was 10 nm in thickness for instance.

A mixed gas atmosphere comprising hydrogen fluoride and methanol was employed for the removal of the buffer oxide film. The mixing ratio between the hydrogen fluoride and the methanol was set to that of azeotropic composition, i-e., 38.5% and 61.5% respectively. However, the mixing ratio of hydrogen fluoride may be decreased so as to control the etching rate of the oxide film. The removal of the buffer oxide film was performed by exposing the substrate to this gas phase atmosphere for one minute at room temperature and under the normal pressure. This step was performed in succession to the step of forming the buffer oxide film without exposing the substrate to the external air.

This step of removing the buffer oxide film in gas phase atmosphere may be performed, other than the aforementioned mixed vapor atmosphere of hydrogen fluoride and methanol, by making use of a hydrogen fluoride anhydride atmosphere, an $F_2/H_2$ gas excited by ultraviolet rays, a CDE (chemical dry etching) employing F-containing gas such as $CF_4$, an RIE (reactive ion etching), a hydrogen radical treatment, and a sputtering employing Ar plasma or $N_2$ plasma for instance.

Then, aluminum having a thickness of 200 nm was deposited by means of magnetron sputtering method on the entire upper surface of the substrate including the interior of the contact hole where the buffer oxide film had been removed, thereby forming a wiring layer.

According to the present invention, a buffer oxide film is formed on the bottom surface of the contact hole at first, and then the buffer oxide film is removed, thus making it possible to obtain an extremely flat bottom surface of the contact hole. As a result, a wiring layer can be uniformly grown on the bottom surface of the contact hole, and hence the contact resistance between the wiring layer and the substrate can be reduced. Therefore, it is possible to improve the reliability of the wiring layer, to prevent the punch-through of electric charge at the impurity diffusion layer, and to minimize the depth of the impurity injection layer. Instead of depositing a metal wiring layer, the flattened surface of silicon substrate at the bottom surface of contact hole may be silicified so as to form a metal silicide layer, thus obtaining almost the same advantage as mentioned above.

For example, the silicide layer was formed by a process wherein a titanium layer having a thickness of 20 nm was deposited on the substrate by means of magnetron sputtering method, and then the substrate was subjected to a heat treatment at a temperature of 700° C. for 30 seconds. Then, aluminum having a thickness of 200 nm was deposited by means of sputtering method on the entire upper surface of the substrate including the silicide layer. By the way, it is also possible to adopt a method wherein a titanium nitride layer having a thickness of 70 nm is deposited on the substrate by means of sputtering method, and then the substrate is subjected to a heat treatment at a temperature of 700° C. for 30 seconds, after which a copper layer having a thickness of 200 nm is further deposited.

Ninth Embodiment

Next, as the Ninth Embodiment, an application of the present invention to the step of manufacturing MOS transistor will be explained. This embodiment is also applicable to a non-volatile memory such as an EEPROM.

Figure 32:
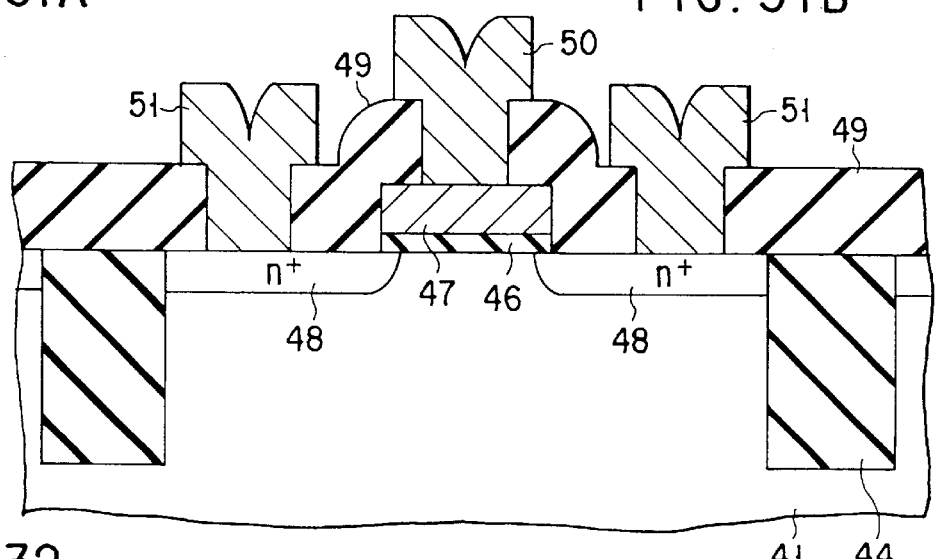
FIG. 32 is a cross-sectional view schematically illustrating the semiconductor device to be manufactured by the process according to the ninth embodiment of the present invention.

FIG. 32 is a cross-sectional view schematically illustrating the element structure of n-channel MOS transistor according to the ninth embodiment of the present invention.

An element isolation region 44 which has been formed by embedding a silicon oxide film to a trench according to the method of the present invention is formed on the surface of a p-type silicon substrate 41. The element isolation may be formed by making use of a LOCOS. An n-type impurity diffusion layer of high concentration for constituting a source-drain region 48 is formed on the surface (element region) of the silicon substrate 41. Further, a gate oxide film 46 according to the method of the present invention is formed on the surface of the silicon substrate 41. A polysilicon film containing arsenic for constituting a gate electrode 47 is formed on this gate oxide film 46. A silicon oxide film 49 is formed all over the substrate, and contact holes are formed in the silicon oxide film 49. Wiring layers 50 and 51 which are formed through a patterning of the same conductive layer (Al, etc.) are formed.

FIGS. 33A to 33K are cross-sectional views illustrating the process of manufacturing an n-channel MOS transistor shown in FIG. 32. This manufacturing method will be explained below by referring to FIGS. 33A to 33K.

Figure 33A:
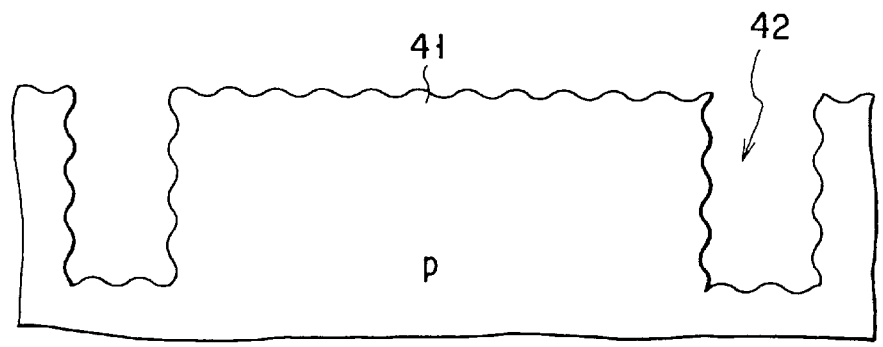
FIGS. 33A to 33K are cross-sectional views illustrating the manufacturing method according to the ninth embodiment of the present invention.

First, as shown in FIG. 33A, a trench 42 is formed on the surface of a p-type silicon substrate 41 by means of a reactive ion etching (RIE) . As a result, the bottom surface and side wall of the trench are roughened due to the etching species.

Figure 33B:
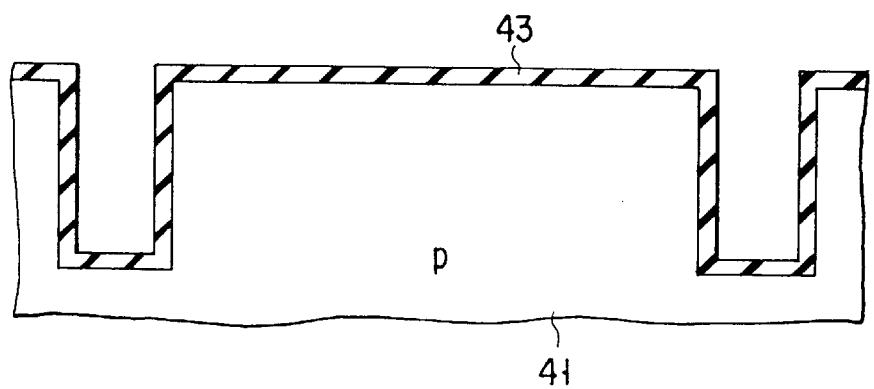

Then, as shown in FIG. 33B, the p-type silicon substrate 41 is exposed to an atmosphere of oxygen radical atmosphere at a temperature of 800° C. for 60 minutes, whereby forming a buffer oxide film 43 having a film thickness of 10 nm. As a result, due to the effect of the oxygen radical oxide film to flatten the substrate/oxide film interface, the flatness of the bottom surface and side wall of the trench are improved. By the way, in the example shown in FIG. 33B, not only the surface of trench but also the surface of the substrate are concurrently oxidized and hence the flatness of the surface of the substrate is improved. However, the regions other than the trench may be covered by making use of a masking layer such as a silicon oxide film, thereby allowing only the trench to be oxidized.

The buffer oxide film 43 to be formed by making use of an oxygen radical may be formed by employing a manufacturing apparatus shown in FIG. 9 for instance.

The oxygen radical can be generated by a process wherein oxygen ($O_2$) gas is introduced via a mass flow controller 211 and a pipe 209 into a quartz tube 201 in which the silicon substrate 101 is placed in advance, and then this oxygen gas is excited by means of plasma discharging, thus allowing the oxygen radical to generate. The oxygen radical thus generated is then fed through a downflow thereof to the silicon substrate 101. Preferably, any impurities such as water and carbon dioxide that might be mixed in small amount in the oxygen gas should be removed by passing the oxygen gas through a gas purifier 210.

The pressure inside the quartz tube 201 is controlled by means of an exhaust system to 5 Torr for instance. The flow rate of the oxygen gas is controlled by the mass flow controller 212 to 800 sccm for instance. The plasma discharge may be performed by making use of a cavity (a discharge electrode for generating a microwave plasma) which is arranged outside the quartz tube 201, and by setting the plasma frequency to 2.45 GHz and the discharge output to 200 W. The silicon substrate 101 is heated by making use of a heater 206. The heater 206 is designed to utilize a resistance heating for heating the substrate in this embodiment. However, a radiant heating such as an infrared lamp may be employed instead. Although the substrate 101 is arranged in such a manner that the surface thereof becomes perpendicular to the gas flow in this embodiment, the substrate 101 may be arranged in such a manner that the surface thereof intersects at a desired angle with the gas flow.

Figure 33C:
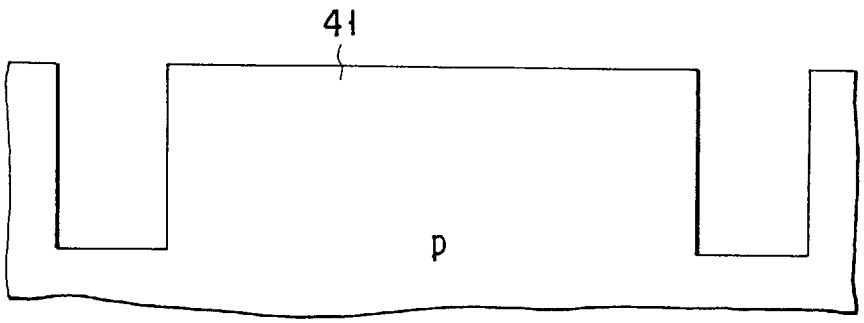

Referring back to the manufacturing steps shown in FIGS. 33A to 33K, after the buffer oxide film 43 is formed by making use of the apparatus shown in FIG. 9, the buffer oxide film 43 is removed as shown in FIG. 33C. As a result, a trench excellent in flatness of the bottom surface and side wall can be obtained. The treatment for removing the oxide film can be performed by immersing the substrate in a 0.25% aqueous solution of hydrogen fluoride for 12 minutes for instance. If the etching rate of the oxide film is too fast, the flatness of the surface of substrate after the removal of the oxide film would be deteriorated. Therefore, in order to expose the surface of the substrate while controlling the etching rate of the oxide film so as to prevent the flatness of the substrate/oxide film interface of the oxygen radical oxide film from being deteriorated, the concentration of the aqueous solution of hydrofluoric acid should preferably be set to 1% or less, or the hydrogen ion concentration of the aqueous ammonium fluoride solution should preferably be set to $10^{-4}$ mol/L or less (pH≧4). Alternatively, the buffer oxide film may be removed in a gas atmosphere containing hydrogen fluoride molecule.

Figure 33D:
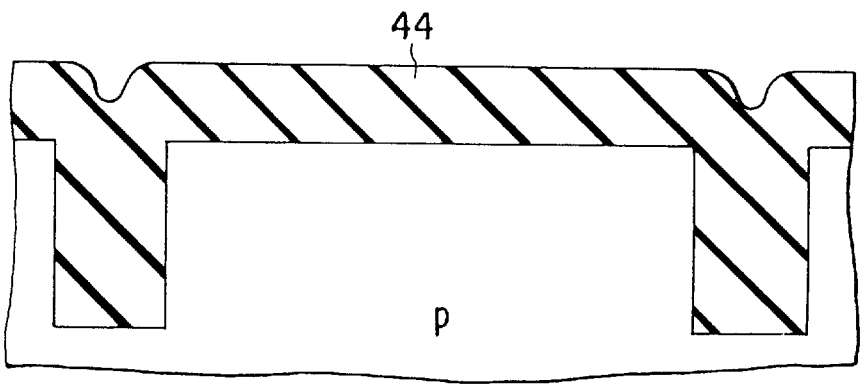

Then, as shown in FIG. 33D, the trench is filled with a silicon oxide film 44 by means of a CVD method such as a liquid phase CVD method, thus forming an element isolation.

Figure 33E:
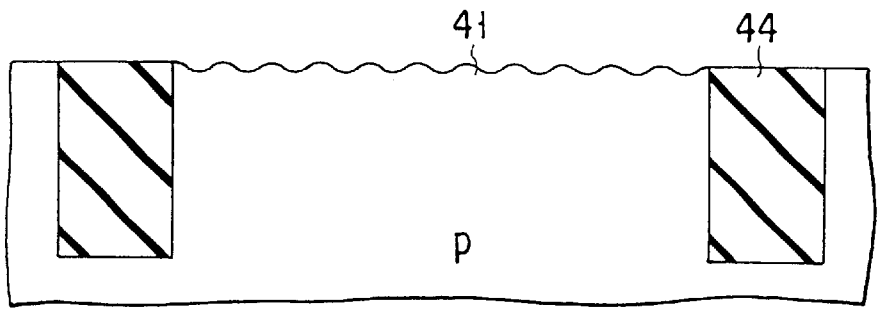

Then, as shown in FIG. 33E, an upper portion of the silicon oxide film 44 is removed by making use of a 5% aqueous solution of hydrofluoric acid, thus allowing the surface of the silicon substrate 41 which corresponds to the element region to be exposed. This exposed surface of the substrate is deteriorated due to the reactive plasma at the step of depositing the silicon oxide film 41 or due to the aqueous solution of hydrofluoric acid of high concentration that has been employed for a high speed etching of the silicon oxide film of relatively large thickness.

Figure 33F:
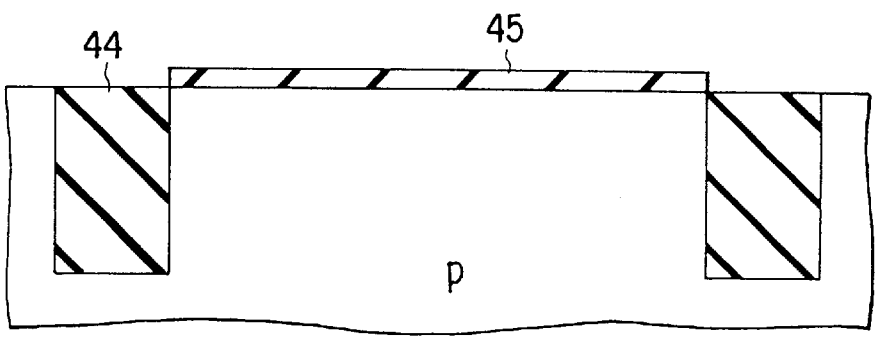

Then, as shown in FIG. 33F, the substrate 41 is exposed to an oxygen radical atmosphere to form a buffer oxide film 45. The oxidation conditions may be the same as those of the step shown in FIG. 33B. As a result, due to the effect of the oxygen radical oxide film to flatten the substrate/oxide film interface, the surface of the substrate for constituting an element region is flattened in atomic level.

Figure 33G:
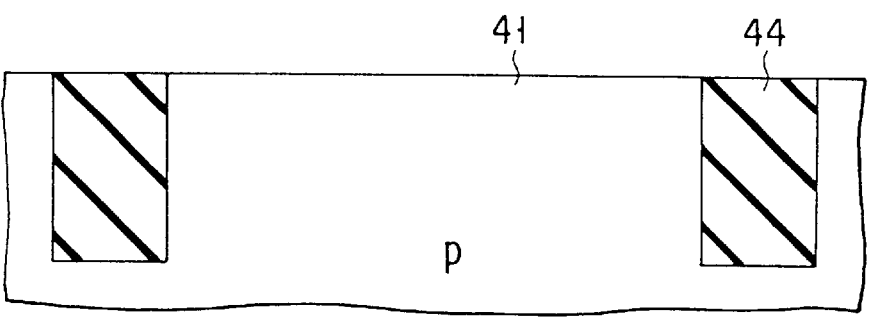

Then, as shown in FIG. 33G, the buffer oxide film 45 is removed, thus obtaining a substrate surface which is very excellent in flatness. The conditions for removing the oxide film may be the same as those employed in the step of FIG. 33C.

Figure 33H:
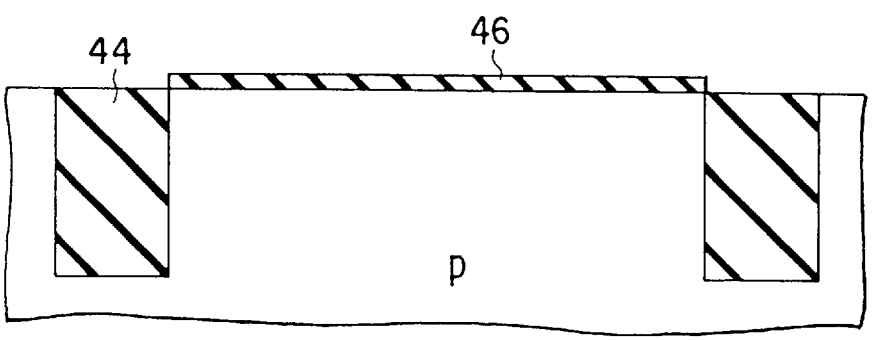

Then, as shown in FIG. 33H, the surface of the silicon substrate 41 is oxidized thereby forming a gate oxide film 46 having a thickness of 3 nm for instance. In the case of very thin oxide film, the flatness of the substrate/oxide film interface after oxidation is greatly influenced by the degree of roughness of the substrate surface before oxidation. However, since the buffer oxide film 45 is formed by means of oxygen radical oxidation so as to flatten the substrate surface before the step of gate oxidation, it is possible to obtain an extremely flattened substrate/gate oxide film interface even in the case of very thin oxide film.

The gate oxide film 46 may be formed by making use of the oxygen radical for instance. For example, the oxygen radical oxidation was performed by a process wherein a microwave plasma was applied to oxygen gas flow 800 sccm in flow rate under conditions of: 2.45 GHz in frequency and 200 W in output, and the silicon substrate Heated to 900° C. was exposed for one minute to the downflow atmosphere of the resultant plasma. The pressure of this atmosphere was set to 5 Torr for instance, and the silicon oxide film obtained was 3 nm in thickness for instance. When the cross-section of this oxide film was observed by means of a transmission electron microscope (TEM), the oxide film/substrate interface was found as being flat in atomic level. As shown in FIG. 27, even if an oxide film having a thickness of 3 nm is formed by means of radical oxidation on the surface of the ordinary silicon substrate, it is impossible to obtain a flat oxide film/substrate interface, since the surface of the substrate before oxidation is roughened at a height corresponding to about 3-ply atom layer.

A dry oxidation may be employed for the formation of the gate oxide film 46. For example, the dry oxidation was performed by exposing the silicon substrate to a dry oxygen atmosphere of the normal pressure at a temperature of 900° C. for 2 minutes, thereby obtaining a silicon oxide film having a thickness of 3 nm for instance.

A wet oxidation film may be employed for the formation of the gate oxide film 46. For example, the wet oxidation was performed for instance by exposing the silicon substrate to a hydrogen combustion atmosphere (which was diluted with nitrogen gas to 50%) of the normal pressure for 2 minutes, thereby obtaining a silicon oxide film having a thickness of 3 nm for instance.

An ozone atmosphere-may be employed for the formation of the gate oxide film 46. For example, an ozone-containing gas (for example, about 7% $O_3/O_2$) is formed at first in an ozonizer, and then the surface of a silicon substrate heated to a temperature of 900° C. for instance is exposed to an atmosphere of this ozone-containing gas for 5 minutes for instance, thereby forming a silicon oxide film having a thickness of 3 nm. In this case, the pressure of the atmosphere may be set to 5 Torr.

Figure 33I:
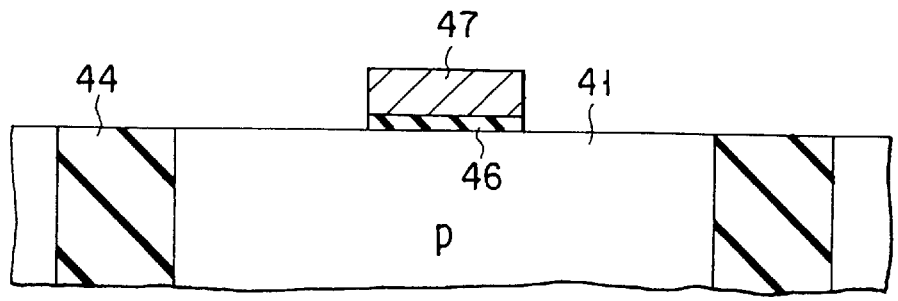

Then, as shown in FIG. 33I, a polysilicon film doped with arsenic for forming a gate electrode 47 is deposited all over the substrate by means of a low pressure CVD method at a temperature of 650° C. Thereafter, the polysilicon film 47 and the gate electrode 47 are successively etched away by means of a reactive ion etching method.

Figure 33J:
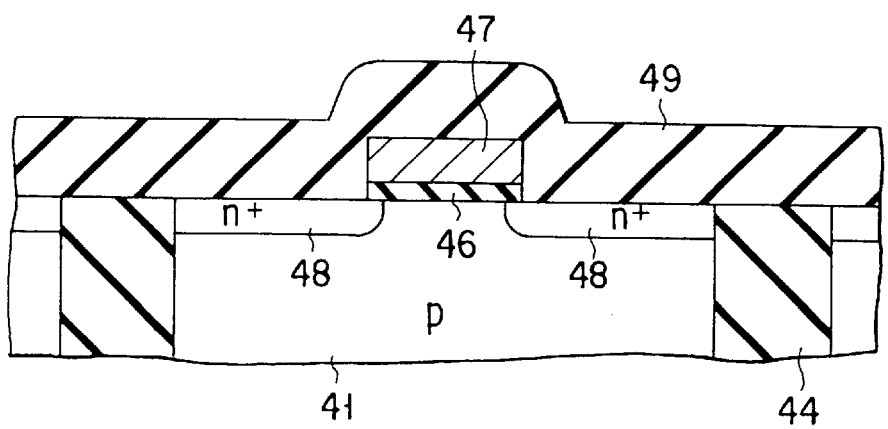

Then, as shown in FIG. 33J, arsenic ions are injected into the surface of silicon substrate 41 with the gate electrode 47 being employed as a mask under the conditions of 40 keV in acceleration voltage and $2 \times 10^{15}$ cm$^{-2}$ in dosage thereby forming, in self-alignment, a source/drain region 48. Subsequently, a silicon oxide film 49 is deposited all over the substrate by means of a low pressure CVD method.

Figure 33K:
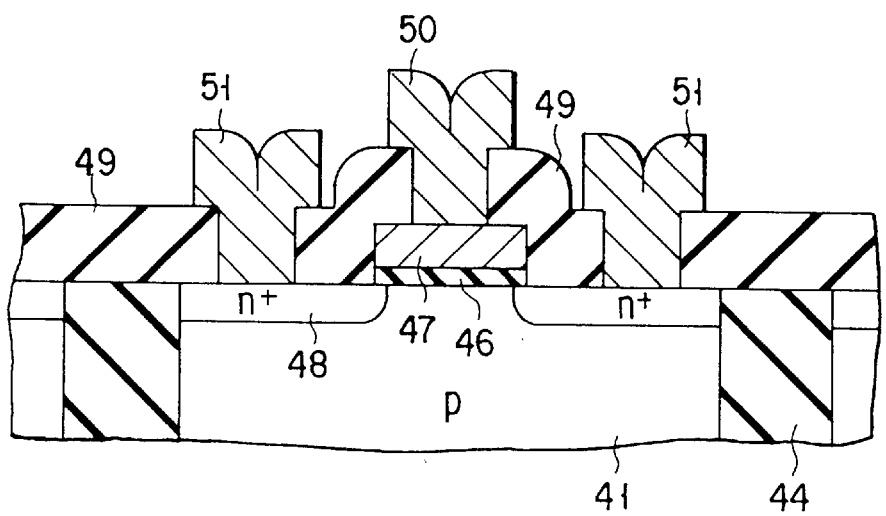

Then, as shown in FIG. 33K, contact holes for obtaining electric contacts with the gate electrode 47 and the source/drain region 48 respectively are formed in the silicon oxide film 49, after which an Al film is deposited all over the surface of the substrate, and the Al film is patterned thereby to form wiring layers 50 and 51 connected to the gate electrode 47 and the source/drain region 48 respectively.

The cross-section of this n-channel MOS transistor thus manufactured according to the method of this embodiment was then observed using a transmission electron microscope. As a result, with respect to the trench, the flatness of the substrate/embedded oxide film interface at the bottom surface and side wall of the trench was found more excellent as compared with that of the prior art where the buffer oxide was performed by means of thermal oxidation. With respect to the substrate/gate oxide film interface, it was possible to obtain a flat (in atomic level) substrate/oxide film interface which the prior art had failed to obtain. Further, the embedded oxide film of the trench and the gate oxide film indicated higher values in dielectric breakdown resistance and in Qbd (the total amount of electrons that have passed through the oxide film until the dielectric breakdown thereof is resulted) as compared with those of the prior art, and at the same time, the mobility of electric charge flowing below the gate electrode was also increased as compared with that of the prior art. On the other hand, the density in interface level of the oxide film was reduced, thus indicating an improvement in electric property thereof.

When the surface of silicon substrate is flattened before oxidation, the surface (facing the oxidizing atmosphere) of the gate oxide film after oxidation can be also flattened, so that the flatness of the interface between the gate electrode (to be formed on the gate oxide film) and the gate oxide film can be also improved as compared with that of the prior art. Namely, this effect of flattening the gate electrode/gate oxide film interface also contributes to the improvement of the electric property of the gate oxide film to be obtained by the present invention.

Since the sole difference between the method of this embodiment and the prior art fundamentally resides in the kind of oxidizing species, the method according to this embodiment would not introduce the problems such as an increase in number of process or the complication of process.

Furthermore, since the surface of the substrate 41 is flattened by making use of the present invention before the formation of the gate oxide film 46, the flatness of the interfaces among the source/drain region 48, the interlayer insulation film 49 and the wiring layer 51 can be further improved as compared with the prior art.

After contact holes are formed as shown in FIG. 33K, a buffer oxide film may be formed by performing an oxygen radical oxidation of the exposed surface of substrate at the bottom surface of each contact hole, the buffer oxide film being subsequently removed in the same manner as shown in the steps of FIGS. 30A to 30D, and the wiring layers 50 and 51 being subsequently formed thereon. If this method is adopted, the damage that has been given to the bottom surface of contact hole at the occasion of forming the contact hole by means of RIE for instance can be remedied, thus improving the flatness of the bottom surface of contact holes. In order to prevent the region in the vicinity of the contact holes from being deformed or denatured due to the heating at the occasion of the buffer oxidation, the temperature of the oxygen radical oxidation should preferably be set to a low level. For example, a buffer oxide film having a thickness of 10 nm was formed under conditions of: 700° C. in temperature, 5 Torr in $O_2$ pressure, 200 W in discharge output and 90 minutes in oxidation time. Subsequently, the substrate was entirely immersed in a 0.25% aqueous solution of hydrofluoric acid for 12 minutes thereby to remove the buffer oxide film. When this step was additionally performed, the contact resistance between the wiring layers 50 and 51 and the underlying silicon (the substrate 41 and gate electrode 47) could be reduced, thus increasing the life of the wiring layers. This effect may be attributed to the fact that the wiring layers were allowed to grow uniformly on the flattened bottom surface.

Although the wiring layers 50 and 51 were formed in the step of FIG. 33K in the above embodiment, in place of employing the aforementioned wiring layers, the surface of the silicon substrate 41 may be silicified so as to form a metal silicide layer. In this case, as mentioned above, a buffer oxide film is formed at first by performing an oxygen radical oxidation of the exposed surface of substrate at the bottom surface of each contact hole which has been formed in advance, and then a metal silicide layer is formed after the buffer oxide film is removed.

As for the oxygen radical oxidation to be employed for forming a buffer oxide film or a gate oxide film, the following methods may be employed for generating oxygen-activated species in place of employing aforementioned microwave plasma discharge of $O_2$ gas for the generation of oxygen-activated species.

Namely, as an excitation method of $O_2$ gas, a parallel plate plasma, a heliconwave plasma, electron cyclotron resonance plasma or a radical beam may be employed.

Further, instead of oxygen ($O_2$) gas, ozone may be employed for forming the buffer oxide film or gate oxide film through an ozone oxidation. In this case, the valve 74c is closed, thus allowing oxygen gas to pass through the ozonizer 80 thereby forming an ozone-containing gas, which is then introduced into the quartz tube 201 (FIG. 9).

As for the raw material gas for generating an oxygen radical, a gas containing a molecule having oxygen atom may be employed in place of oxygen gas. For example, ozone gas ($O_3$), nitrogen monoxide (NO), dinitrogen monoxide ($N_2O$), nitrogen dioxide ($NO_2$), water vapor ($H_2O$) and hydrogen peroxide ($H_2O_2$) can be employed. These gases and oxygen gas may be formed of a pure gas or a mixture of plural gases, or may be mixed with an inert gas such as helium, neon and argon.

Alternatively, oxygen atom radical which has been generated by irradiating an excitation light to oxygen gas or ozone gas may be employed for the oxygen radical oxidation.

The irradiation of an excitation light to oxygen gas or ozone gas can be performed by making use of the light sources 203 and 220 shown in FIG. 9. Since the light source 220 is designed to irradiate the surface of the substrate 101, the concentration of the radical can be enhanced at the surface of substrate. The employment of the light source 220 is effective in remedying the damage of the surface of substrate which has been brought about by the irradiation of excitation light. As for the number-of exciting photon, it may be a single photon excitation or a multiple photon excitation. Furthermore, a plurality of light sources may be co-used.

As for the kinds of oxygen atom radical to be generated by the irradiation of an excitation light, $O(^3P, s=1)$ of the ground state, $O(^1D, s=0)$ of the first excitation state, $O(^1S, s=0)$ of the second excitation state, etc. may be employed. The s represents the electron spin quantum number based on the entire oxygen atom. Four valence electrons of the $2p$ orbit which are bound by oxygen atom are respectively provided with an upward spin (↑: spin quantum number ½) and a downward spin (↓: spin quantum number −½), and it is assumed that the total of the spin quantum numbers of each valence electron is reflected on the value of "s". These S, P and D correspond to the azimuthal quantum number of the valence electron based on the entire oxygen atom (l=0, 1, 2).

Any of these oxygen atoms can be employed for the aforementioned oxygen radical oxidation. As shown in FIG. 11A, the $O(^1D)$ and the $O(^3P)$ (when used at a temperature exceeding over 550° C.) are high in reactivity, so that they are capable of oxidizing Si of the oxide film/substrate interface one atom Layer by one atom layer, thus making it possible to flatten the interface in atomic level. On the other hand, in the case of the conventional dry oxidation, since the reactivity thereof is low as shown in FIG. 11B, unreacted Si atoms are caused to left at the oxide film/substrate interface, thus a roughness is caused to remain at the interface. It is more preferable to enhance the concentration of the oxygen atom radical which is conditioned in the singlet state such as $O(^1D)$.

Namely, in the case of the oxygen radicals $O(^1D)$ and $O(^1S)$, s is zero (s=0) and the direction of spins of valence electrons is constituted by a pair (↑↓), so that oxygen atom can easily enter into the Si—Si bond (valence electron: ↑↓) and hence the reactivity as well as the oxide film-forming rate of these $O(^1D)$ and $O(^1S)$ are high, and at the same time, the effect thereof to flatten the substrate/oxide film interface is also high. By contrast, in the case of the oxygen radical $O(^3P)$, s is one (s=1) and the direction of spins of two valence electrons is both constituted by either upward direction (↑↑) or downward direction (↓↓), so that oxygen atom can hardly enter into the Si—Si bond (valence electron: ↑↓) and hence the $O(^3P)$ is relatively poor in reactivity.

If the concentration of the $O(^1D)$ is to be enhanced in an apparatus shown in FIG. 9, dinitrogen monoxide ($N_2O$) gas is introduced via a mass flow controller 212, a valve 211 and a pipe 209 into a quartz tube 201, and then this $N_2O$ gas is excited by a light having a wavelength of 197 nm and irradiated from a light source 203, thus allowing the $O(^1D)$ to generate. By making use of this method, the activated species $O(^1D)$ can be selectively generated.

Although an oxidizing apparatus which is applicable to all of the aforementioned embodiments is shown in FIG. 9, an apparatus which is designed for a specific purpose may be employed. For example, when only the plasma discharge of oxygen gas is employed as a method of generating oxygen atom radical for instance, a redundant portion of the apparatus shown in FIG. 9 may be omitted, thus modifying it to conform with such a specific requirement.

Tenth Embodiment

If a gas phase atmosphere is employed in the step of removing an oxide film which has been formed in advance by making use of an oxygen-activated species for a buffer oxidation, and if the steps in subsequent to the buffer oxidation and the removal of oxide film are performed in a gas phase atmosphere, it is possible to successively perform the process of "buffer oxidation→removal of oxide film→subsequent steps" in the same semiconductor manufacturing apparatus without exposing the semiconductor device to the external air atmosphere. The subsequent steps in this case include a step of gate oxidation, a step of nitrification, a step of depositing an insulation film, a step of depositing a conductive film, and a step of forming a compound consisting a metal and a semiconductor (for example, a metal silicide). This continuous treatment of "buffer oxidation→removal of oxide film→subsequent steps" is very advantageous in preventing a deterioration of electric properties such as a deterioration of dielectric breakdown resistance of an insulation film due to the contamination of semiconductor surface and a contact failure between a wiring layer and a semiconductor surface, in improving the performance and yield of semiconductor device, in improving the through-put of semiconductor manufacturing apparatus, and in saving labor.

Although a gas phase atmosphere is employed for removing an oxide film that has been formed by means of buffer oxidation in the present invention, it is also possible to employ, for the step of removing an oxide film, a wet treatment employing a chemical (such a hydroflouric acid treatment) or CMP (chemical mechanical polishing) treatment, provided that there is no possibility of bad effect due to a mixing of water in the processes before and after the step of removing an oxide film (i.e., in the step of buffer oxidation and the post-treatments such as a gate oxidation step).

FIGS. 34A to 34F illustrate one example of as semiconductor manufacturing apparatus which is capable of continuously performing a sequence of steps, i.e., the step of buffer oxidation, the step of removing an oxide film and the subsequent steps without exposing the semiconductor device to the external air atmosphere.

In FIGS. 34A to 34F, it is assumed that each step is performed in an individual vessel, so that each vessel is aligned. However, it is also possible to arrange them otherwise, such as in a circle. Alternatively, the entire steps may be performed in the same vessel or only some of them may be performed in the same vessel. If desired, an apparatus for performing the next step such as selectively or entirely etching a film formed in any of the steps shown in FIGS. 34A to 34F may be added to each Figure. As for the method of etching, a chemical dry etching, a reactive ion etching, a wet treatment employing a chemical, or a chemical mechanical polishing may be employed. The apparatus shown in FIGS. 34A to 34F may be suitably combined or an apparatus designed for the next step may be further combined with these apparatus.

According to the apparatus shown in FIGS. 34A to 34F, a pretreatment for the buffer oxidation is also performed in a gas phase atmosphere for continuously performing the entire process. However, this pretreatment may be performed in a separate apparatus, i.e., it may be performed in a wet treatment.

The transfer of the substrate between the vessels is performed in a vacuum or in an inert gas atmosphere such as nitrogen or argon.

The treatments in an oxidation pretreatment chamber and in an oxide film-removing chamber are respectively performed as a dry treatment in a vapor atmosphere. It is also possible to employ, for the step of removing an oxide film, a wet treatment employing a chemical (such a hydroflouric acid treatment) or CMP (chemical mechanical polishing) treatment, provided that there is no possibility of bad effect due to a mixing of water in other steps (for example, the buffer oxidation step and in the steps after the oxide film-removing step).

Figure 34A:
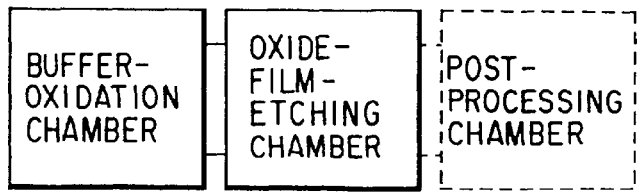
FIGS. 34A to 34F are block diagrams schematically illustrating the semiconductor manufacturing apparatus according to the tenth embodiment of the present invention.

FIG. 34A illustrates a fundamental structure of the semiconductor manufacturing apparatus according to the present invention. If the buffer oxidation and the removal of oxide film according to the present invention are performed continuously without exposing the semiconductor device to the external air, the subsequent treatments can be successively performed without exposing the flattened semiconductor surface to the external air atmosphere, thus preventing a deterioration of electric properties such as a deterioration of dielectric breakdown resistance of an insulation film due to the contamination of semiconductor surface and a contact failure between a wiring layer and a semiconductor surface.

Figure 34B:
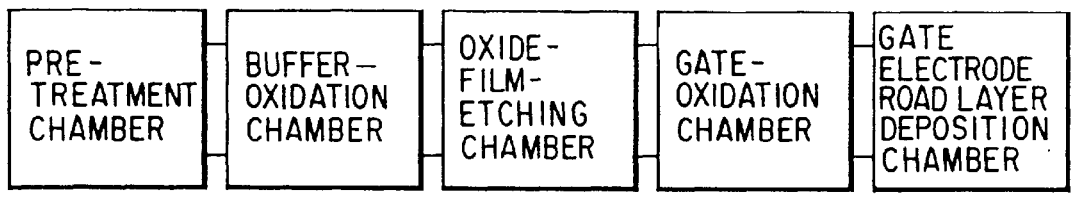

FIG. 34B illustrates another example of semiconductor manufacturing apparatus according to the present invention wherein method of the present invention applied to the step of forming a gate oxide film. Each treatment vessel is connected with a gas pipe, a heating device or an activated species-generating apparatus as required for each treatment as shown in FIG. 21. Any redundant pipe in FIG. 21 may be omitted.

For example, a semiconductor substrate provided with an element isolation is placed in an oxidation pretreatment chamber, and then the surface of the substrate is washed with a photo-excited chlorine radical atmosphere and/or a hydrofluoric anhydride vapor atmosphere.

For example, a microwave plasma was applied to oxygen gas flow 800 sccm in flow rate under conditions of: 2.45 GHz in frequency and 200 W in output, and the silicon substrate heated to 900° C. was exposed for 30 minutes to the downflow atmosphere of the resultant plasma. The pressure of this atmosphere was set to 5 Torr for instance, and the silicon oxide film obtained was 10 nm in thickness for instance.

Then, the substrate is transferred to a buffer oxidation chamber, and an oxide film is formed by means of an oxidation employing the aforementioned oxygen-activated species as shown in FIG. 33F, thereby forming a flat oxide film/substrate interface.

Then, the substrate is transferred to an oxide film-removing chamber, and the oxide film which has been formed by means of buffer oxidation is removed by making use of a hydrofluoric anhydride vapor atmosphere as shown in FIG. 33G, thereby allowing a flat substrate surface to be exposed.

Then, the substrate is exposed to a 7% hydrofluoric anhydride vapor atmosphere (diluted with nitrogen) for one minute for instance. In this case, with a view to promote the etching of the oxide film, the substrate should preferably be heated to a temperature of 100° C. After the oxide film is removed, the substrate should preferably be kept in a low pressure atmosphere which is heated to a temperature of 200° C. for 10 minutes for instance for removing F atoms remaining on the substrate surface.

Then, the substrate is transferred to a gate oxidation chamber, and a gate oxidation is performed by oxidizing the flattened substrate surface as shown in FIG. 33H. This gate oxidation was performed by making use of oxygen radical. For example, the oxygen radical oxidation was performed by a process wherein a microwave plasma was applied to oxygen gas flow 800 sccm in flow rate under conditions of: 2.45 GHz in frequency and 200 W in output, and the silicon substrate heated to 900° C. was exposed for one minute to the downflow atmosphere of the resultant plasma. The pressure of this atmosphere was set to 5 Torr for instance, and the silicon oxide film obtained was 3 nm in thickness for instance. By the way, nitrification or oxynitrification may be adopted in place of the gate oxidation, thereby forming a gate insulation film composed of other kinds of material such as a nitride film or oxynitride film.

Then, the substrate is transferred to a gate electrode layer deposition chamber, and a polysilicon film doped with arsenic is deposited all over the substrate by means of a low pressure CVD method employing silane for instance. This gate electrode layer deposition step should preferably performed in succession to the gate oxidation. However, this step may be performed by making use of a separate apparatus which is different from that employed in the process of the buffer oxidation-oxide removal-gate oxidation.

Finally, the substrate bearing the gate oxide film and the polysilicon film is taken out of the gate electrode layer deposition chamber, and then transferred to an apparatus of the next step for performing a selective etching of these films.

Figure 34C:
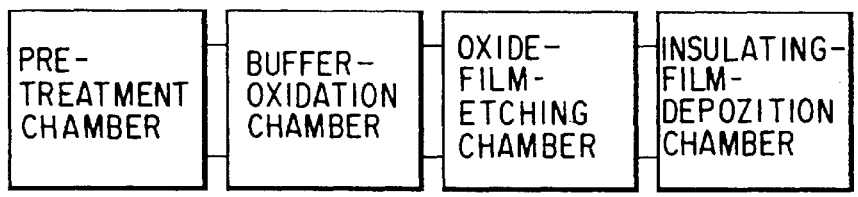

FIG. 34C illustrates another example of semiconductor manufacturing apparatus according to the present invention wherein method of the present invention applied to the step of depositing an insulation film. Each treatment vessel is connected with a gas pipe, a heating device or an activated species-generating apparatus as required for each treatment as shown in FIG. 21.

For example, a semiconductor substrate which has been selectively subjected to a reactive ion etching is placed in an oxidation pretreatment chamber, and then, as shown in FIGS. 33A to 33C, is subjected to a pretreatment in the oxidation pretreatment chamber, to an oxidation treatment in the buffer oxidation chamber and to an oxide film-removing treatment in the oxide film-removing chamber in the same manner as in the case of FIG. 34B, thereby flattening the inner wall of the element isolation trench.

Then, the substrate is transferred to an insulation film deposition chamber, and an insulation film is deposited by means of a CVD method such as a liquid phase CVD as shown in FIG. 33D, thereby embedding the trench with the insulation film.

For example, the inner wall and bottom surface of an element isolation trench having a width of 0.5 μm and a depth of 0.4 μm were flattened by means of buffer oxidation employing an oxygen radical, and then, the trench was filled with a silicon oxide film by means of CVD method employing TEOS ($Si(OC_2H_5)_4$) for instance. For example, a substrate heated to 700° C. is exposed to a TEOS gas flow 50 sccm in flow rate and 1 Torr in pressure for 30 minutes thereby embedding the trench with the silicon oxide film.

Finally, the substrate bearing the insulation film is taken out of the deposition chamber, and then subjected to the next step for removing the film on the element region by making use of hydrofluoric acid or the CMP method. By the way, the vessel for performing go the next step may be connected with the apparatus of FIG. 34C so as to perform the next step in succession to the step of insulation film deposition without exposing the substrate to the external air atmosphere. It is also possible to perform the next step in the insulation film deposition chamber.

Figure 34D:
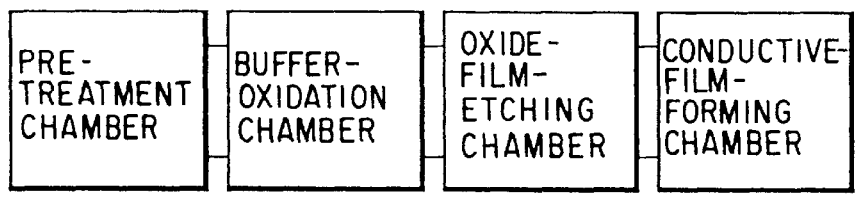

FIG. 34D illustrates another example of semiconductor manufacturing apparatus according to the present invention wherein method of the present invention applied to the step of forming a contact between a wiring layer and a semiconductor layer. Each treatment vessel is connected with a gas pipe, a heating device or an activated species-generating apparatus as required for each treatment as shown in FIG. 21.

For example, a semiconductor substrate which provided with contact holes in an insulation film is placed in an oxidation pretreatment chamber, and then, as shown in FIGS. 30A to 30C, is successively subjected to a pretreatment in the oxidation pretreatment chamber, to an oxidation treatment in the buffer oxidation chamber and to an oxide film-removing treatment in the oxide film-removing chamber in the same manner as in the case of FIG. 34B, thereby flattening the silicon surface exposed at the bottom of the contact holes. The contact holes were dimensioned to have a width of 0.3 μm and a depth of 500 nm for instance.

Then, the substrate is transferred to a conductive film-forming chamber, and an Al layer having a thickness of 200 nm is deposited all over the surface of the substrate including the flattened silicon surface by means of a magnetron sputtering method as shown in FIG. 30D.

Finally, the substrate bearing the conductive film is taken out of the chamber, and then subjected to a selective etching step. By the way, the vessel to be employed in the next step may be connected with the conductive film-forming chamber so as to make it possible to continuously perform the next step in subsequent to the formation of the conductive film.

Figure 34E:
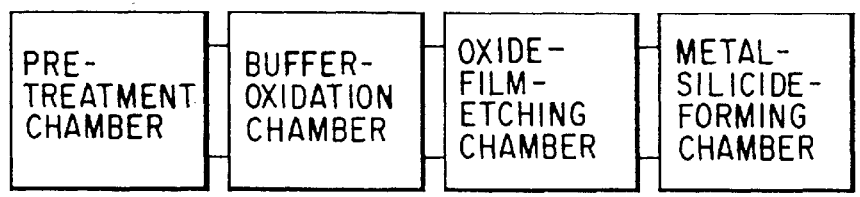

FIG. 34E illustrates another example of semiconductor manufacturing apparatus according to the present invention wherein method of the present invention applied to the step of forming a contact between a wiring layer and a semiconductor layer. In the same manner as in the case of FIG. 34D, a silicon substrate is successively subjected to a pretreatment in the oxidation pretreatment chamber, to an oxidation treatment in the buffer oxidation chamber and to an oxide film-removing treatment in the oxide film-removing chamber, thereby-flattening the silicon surface exposed at the bottom of the contact holes.

Then, the substrate is transferred to a metal silicide-forming chamber, and a metal silicide is deposited on the silicon surface exposed at the bottom of the contact holes. For example, the silicide layer was formed by a process wherein a titanium layer having a thickness of 20 nm is deposited on the surface of substrate by means of a magnetron sputtering method, and then subjected to a heat treatment at a temperature of 700° C. for 30 seconds.

Finally, the substrate bearing the metal silicide is taken out of the chamber, and then an Al layer is formed all over the surface of substrate. By the way, the vessel for performing the next step may be connected with the metal silicide-forming chamber so as to perform the next step in succession to the step of forming a metal silicide.

Figure 34F:
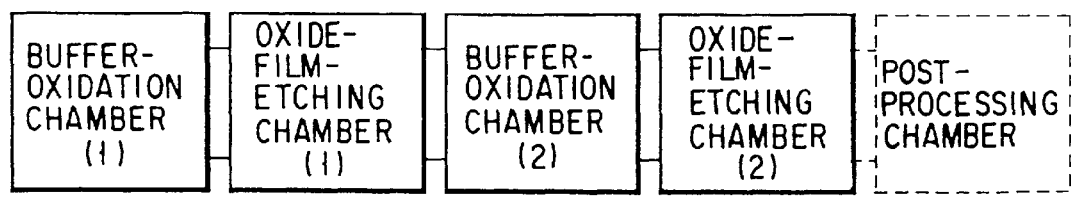

FIG. 34F illustrates another example of semiconductor manufacturing apparatus according to the present invention wherein method of the present invention applied to the step of flattening a semiconductor surface which is extremely roughened. Each treatment vessel is connected with a gas pipe, a heating device or an activated species-generating apparatus as required for each treatment as shown in FIG. 21.

For example, a semiconductor substrate which provided with an element isolation as shown in FIG. 29A is placed in a buffer oxidation chamber (1) after the pretreatment thereof, and then, as shown in FIG. 29B, a first oxidation is performed. Preferably, the pretreatment of the first buffer oxidation should be performed continuous with this first buffer oxidation. This first buffer oxidation may be performed not only by making use of oxygen-activated species but also by making use of a dry oxidation, a wet oxidation in a water vapor atmosphere, an oxidation in a hydrochloric acid atmosphere, an oxidation in liquid phase containing ozone or hydrogen peroxide, or an oxidation according to the prior art.

Then, the substrate is transferred to a oxide film-removing chamber (1), and the oxide film is removed in a hydrofluoric anhydride atmosphere for instance as shown in FIG. 34C. As a result, a semiconductor surface which is more enhanced in flatness as compared with that of the first buffer oxidation can be obtained.

Then, the substrate is transferred to a buffer oxidation chamber (2) and is subjected to a second buffer oxidation as shown in FIG. 29D. In order to enhance the flatness of the semiconductor surface after the removal of oxide film, this second buffer oxidation should preferably be performed by making use of an oxygen-activated species.

Then, the substrate is transferred to a oxide film-removing chamber (2), and the oxide film is removed. As a result, a semiconductor surface which is further enhanced in flatness can be obtained as shown in FIG. 29E.

Finally, the substrate is taken out of the oxide film-removing chamber (2), and then subjected to the next step such as a step of depositing an insulation film for instance. Alternatively, the vessel to be employed in the next step is connected with the oxide film-removing chamber (2) so as to make it possible to continuously perform the next step such as a step of depositing an insulation film on the flattened semiconductor surface without exposing the substrate to the external air.

The semiconductor manufacturing apparatus which is capable of continuously performing the "buffer oxidation→oxide film-removal→subsequent steps" without exposing a semiconductor device to the external air should preferably be adapted to employ, at the occasion of removing an oxide film formed by means of a buffer oxidation, a gas phase atmosphere containing a molecule having F atom, Cl atom, Br atom or I atom, i.e., a molecule having an etching action of the oxide film, or containing an activated species.

It is possible, according to the aforementioned various oxygen radical oxidation, to obtain a semiconductor/buffer oxide film interface whose flatness is improved over that of the prior art, even if the process conditions such as oxidation temperature, gas flow rate, the pressure of atmosphere, excitation light intensity, excitation light wavelength, treatment time, or plasma discharge output are varied.

Furthermore, it is possible to obtain a substrate surface or an inner surface (bottom surface or side wall) of hole or trench, which is improved in flatness over that of the prior art, even if the method of removing the film, the kinds or concentration of the etching species, or etching time are varied at the occasion of removing a buffer oxide film.

Since a buffer oxide film, which is more excellent in flatness of the interface thereof with an underlying semiconductor as compared with that of the conventional thermal oxide, can be obtained under a low temperature by making use of the aforementioned oxygen radical oxidation, any deformation or denaturing of the substrate due to a high temperature treatment can be suppressed. Therefore, the present invention is applicable to a wide range of use, i.e., not only to the pretreatment for a gate oxidation, for a embedding of trench for element isolation, or for a embedding of contact hole, but also to the flattening treatment of the exposed semiconductor surface, or of the inner wall of hole or trench. For example, the present invention is applicable to the flattening treatment of the bottom surface or inner wall of trench capacitor hole.

As for the semiconductor to which the treatment with the formation of buffer oxide film by means of oxygen radical oxidation is applicable, it is possible to employ a GaAs substrate or an InP substrate other than a silicon substrate. Furthermore, it is also applicable to the polycrystalline layer or amorphous layer of a semiconductor such as Si, GaAs or InP, as well as to an epitaxial growth layer of these semiconductors.

Hydrofluoric acid or an aqueous solution of ammonium fluoride are exemplified in the aforementioned embodiments as being useful for the removal of the oxide film that has been formed by making use of a buffer oxidation. However, it is also possible to employ an gas phase atmosphere for the removal of the oxide film.

If a gas phase atmosphere is employed in the step of removing an oxide film, and if the gate oxidation step in subsequent to the buffer oxidation and the removal of oxide film is performed in a gas phase atmosphere, it is possible to successively perform the process of "buffer oxidation→removal of oxide film→subsequent steps" (or steps of nitrification, deposition of an insulation film, deposition of a conductive film and formation of a compound consisting a metal and a semiconductor) in the same semiconductor manufacturing apparatus without exposing the semiconductor device to the external air atmosphere. Therefore, a deterioration of electric properties such as a deterioration of dielectric breakdown resistance of an insulation film due to the contamination of semiconductor surface and a contact failure between a wiring layer and a semiconductor surface can be prevented, and hence the performance and yield of semiconductor device can be improved and at the same time, the through-put of semiconductor manufacturing apparatus can be improved, thus saving the labor.

The gas phase atmosphere to be employed for removing the oxide film that has been formed by making use of buffer oxidation should preferably comprise a molecule having F atom, Cl atom, Br atom or I atom, i.e., a molecule having an etching action of the oxide film, or comprise an activated species. For example, when a nitrogen-diluted atmosphere of hydrofluoric anhydride (about 7% $HF/N_2$) is employed, an oxide film having a thickness of up to about 100 nm can be etched away within one minute.

The removal of the oxide film in a gas phase atmosphere can be performed by making use of an apparatus shown in FIG. 21 for instance. Namely, after a buffer oxidation is performed by making use of a portion of the apparatus shown in FIG. 21 according to the aforementioned embodiment, the substrate 101 is exposed to a nitrogen-diluted 7% hydrofluoric anhydride vapor atmosphere for one minute. The hydrogen fluoride is introduced via a mass flow controller $222_2$, and valves $223_2$, $223_{15}$, $223_{18}$, $223_{19}$ and $217_5$. Nitrogen is introduced via a mass flow controller $222_1$, and a valve $223_1$ and allowed to join with the hydrogen fluoride. In this case, if the temperature of substrate is heated to about 100° C., the etching of the oxide film would be accelerated. Preferably, in order to remove residual F atoms on the surface of substrate after the oxide film has been removed, the substrate is heated to about 200° C. in a low pressure atmosphere.

The removal of the oxide film in a gas phase atmosphere can be performed by making use of an $F_2/H_2$ gas excited by ultraviolet rays, an $HF/CH_3CO$ paper, a CDE (chemical dry etching), an RIE (reactive ion etching), and a sputtering employing a plasma, in addition to a hydrogen fluoride anhydride vapor atmosphere.

As for the method of treating a substrate in a gas phase atmosphere, the aforementioned oxide film-removing method may be combined with the following methods which are designed to remove a metallic soil or an organic soil. For example, a treatment employing an ultraviolet ray-excited $Cl_2$, a $ClF_3$ vapor, an HFAC (1,1,1,5,5,5-hexafluoro-2,4-pentadione) vapor, a TFAA (acetic trifluoride) vapor, a hydrogen radical+ammonia+hexamethyl disilazane (NH[Si$(CH_3)_3]_2$) atmosphere and a hydrogen radical atmosphere may be performed before or after the aforementioned oxide film-removing method.

If the gas to be employed for the gas phase treatment of substrate is to be excited by means of plasma discharge, the gas is introduced via the valves $223_{16}$ and $223_{17}$ and excited by making use of the electrode 202 and the excitation light source 203. If required, the substrate may be heated.

It is preferable, in the method of manufacturing semiconductor and the apparatus therefor which are to be employed for flattening the semiconductor surface in the aforementioned embodiments, to employ an atmosphere containing as a main component an activated species $O(^1D)$ (which is preferable for the oxidation) for the buffer oxidation for enhancing the flatness of the semiconductor surface.

Eleventh Embodiment

This embodiment illustrates an example of introducing nitrogen atom into an oxidized surface for preventing the punch-through of boron from a gate electrode via an oxide film to the substrate in the oxide film which has been formed in the Third Embodiment. Herein, the boron is designed to be employed as a dopant for a polysilicon layer for gate electrode.

For example, as shown in FIG. 8A, the surface of silicon substrate provided with an element isolation is oxidized by making use of an oxygen radical, thus forming a silicon oxide film 103 as shown in FIG. 8B.

In this case, the oxygen radical was formed by applying a microwave discharging to oxygen gas under conditions of: 2.45 GHz in frequency and 200 W in output. Then, a silicon substrate was exposed to the downflow atmosphere of the resultant plasma, thus performing an oxidation by making use of the oxygen radical $C(^3P)$. In this case, the flow rate of oxygen was set to 800 sccm and the pressure of this atmosphere was set to 5 Torr for instance. A silicon oxide film 6 nm in thickness for instance was formed under the conditions of: 900° C. in temperature of substrate and 5 minutes in oxidation time.

Immediately after the formation of the oxide film, the feeding gas was switched from oxygen gas to nitrogen gas, and by making use of the resultant nitrogen radical atmosphere, nitrogen atom was introduced into the surface of the silicon oxide film. For example, a microwave plasma was applied to a nitrogen gas flow of 800 sccm in flow rate under conditions of: 2.45 GHz in frequency and 100 W in output, and the silicon substrate was exposed to the resultant downflow atmosphere of nitrogen gas plasma. The pressure of this atmosphere was set to 5 Torr for instance. The temperature of the substrate was set to 900° C. and the treatment time was set to 30 minutes for instance. When the surface of the oxide film was examined after this surface treatment with nitrogen by means of an X-ray photoelectron spectrophotometry (XPS), about 1% of nitrogen atom was found introduced in the vicinity of the surface of the oxide film.

As a reference sample, a thermal oxide film was formed on the surface of a separate substrate by means of the conventional dry oxidation. For example, a silicon substrate was exposed to a dry oxygen atmosphere (flow rate: 20 L/min, normal pressure, and 900° C.) for 10 minutes thereby to form a thermal oxide film having a thickness of 6 nm for instance.

Then, a polysilicon layer doped with boron was deposited all over the surface of these substrates at a temperature of 450° C. by means of a low pressure CVD method employing disilane and diborane as raw materials. The polysilicon layer obtained was 200 nm in thickness and $3 \times 10^{20}$ atoms/cm³ in boron concentration.

Thereafter, these substrates were separated into two groups, i.e., one group for forming a MOS transistor, and the other for examining the punch-through of boron.

The substrates for the formation of a MOS transistor were subjected to a heat treatment (annealing of the polysilicon layer) in a nitrogen gas atmosphere at a temperature of 900° C. for 30 seconds. Thereafter, as shown in FIGS. 33I to 33K, a MOS transistor was manufactured in the same manner as in the case of the Ninth Embodiment.

The substrates for the evaluation of the punch-through of boron were subjected to a severe annealing treatment so as to increase the quantity of punch-through of boron whereby facilitating the observation of results. Namely, the substrates were subjected to a heat treatment in a nitrogen gas atmosphere at a temperature of 1,000° C. for 90 minutes. After the heat treatment, the polysilicon layer was removed by means of chemical dry etching (CDE), and then, the quantity of boron which had been injected into the substrate via the oxide film during the heat treatment was investigated by means of the secondary ion mass spectrometry (SIMS).

Figure 35A:
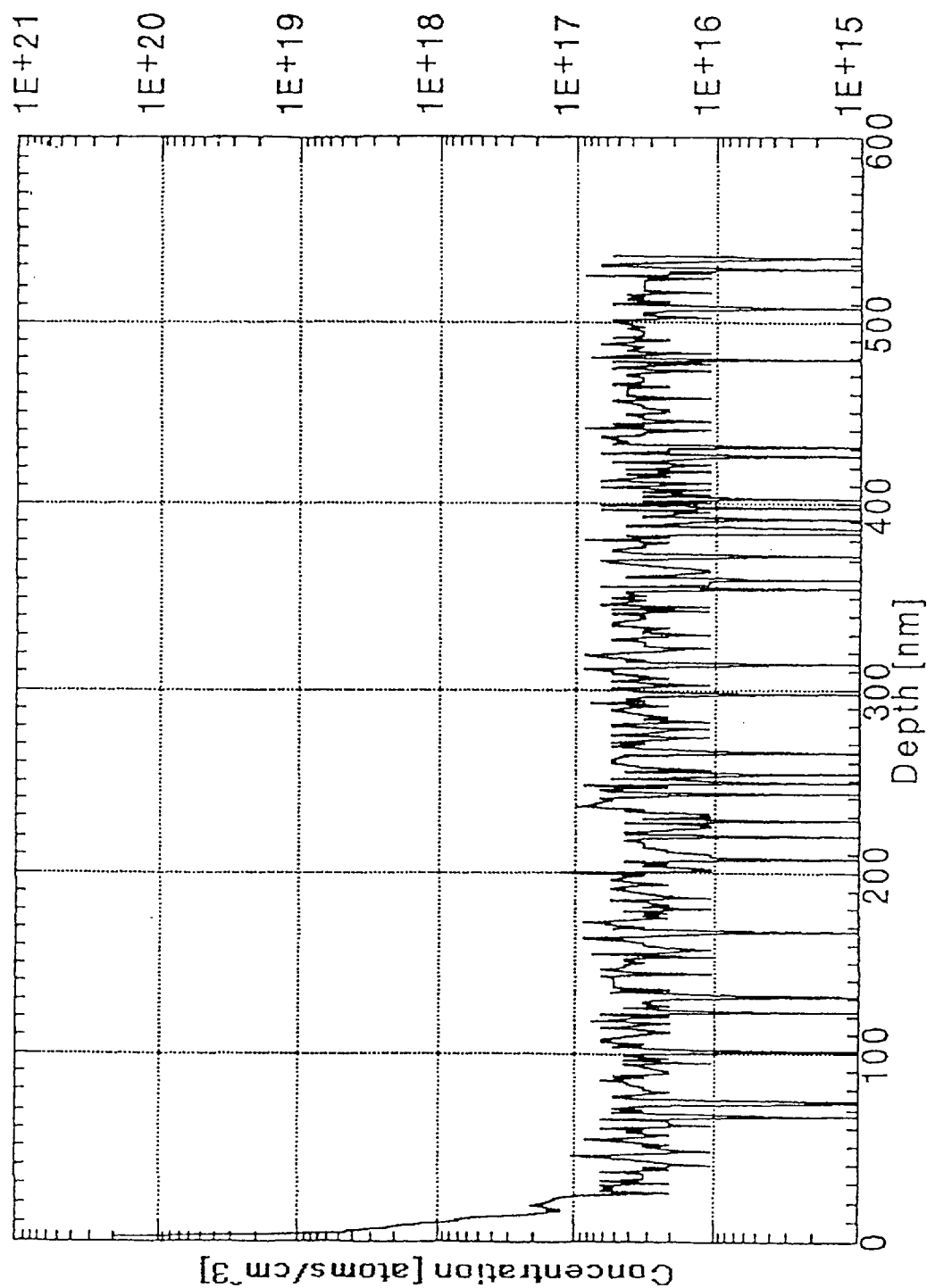
FIGS. 35A to 35C are graphs each showing a difference in quantity of punch-through of boron from the gate electrode to the substrate, depending on the kinds of oxide film.
Figure 35B:
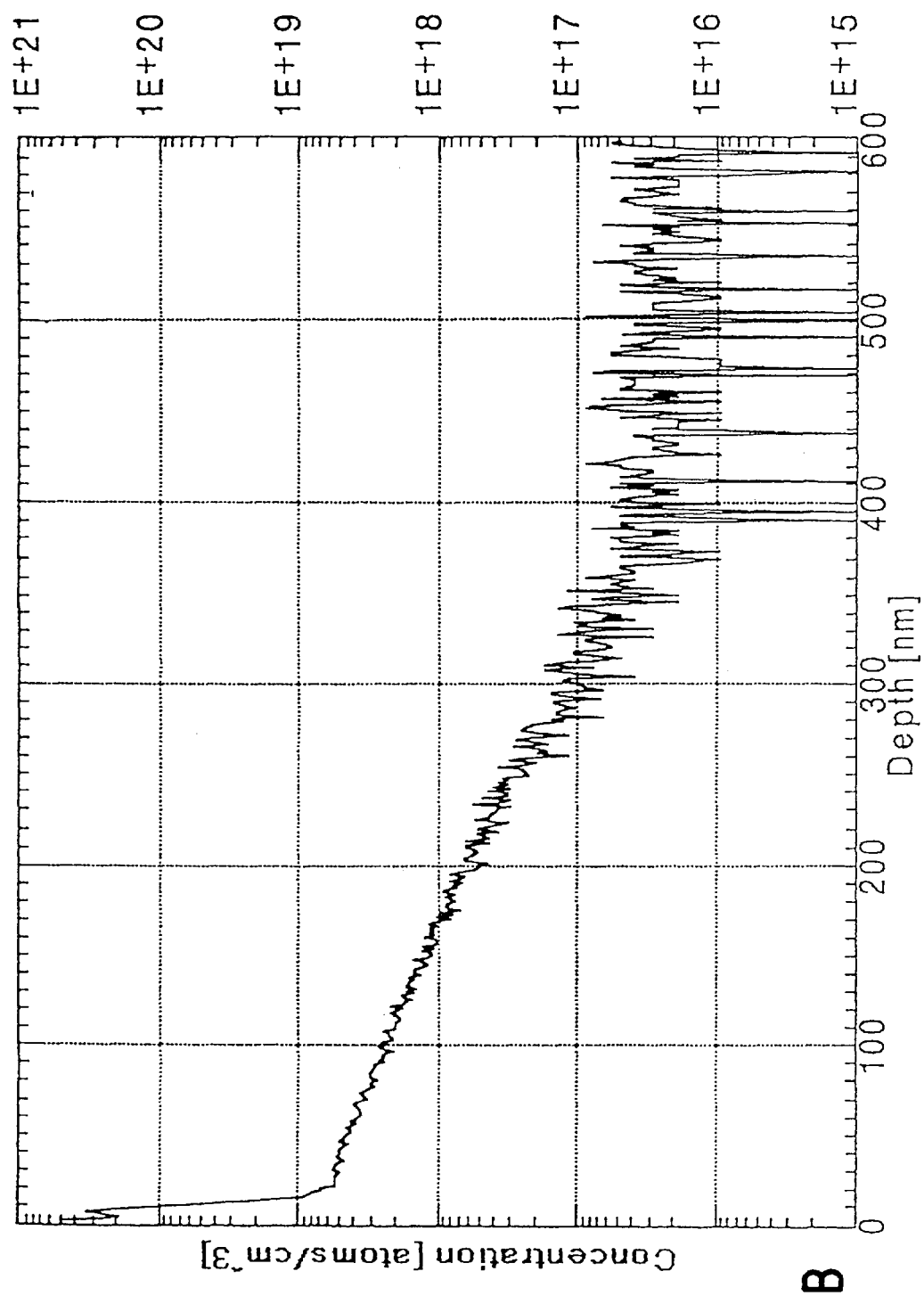
Figure 35C:
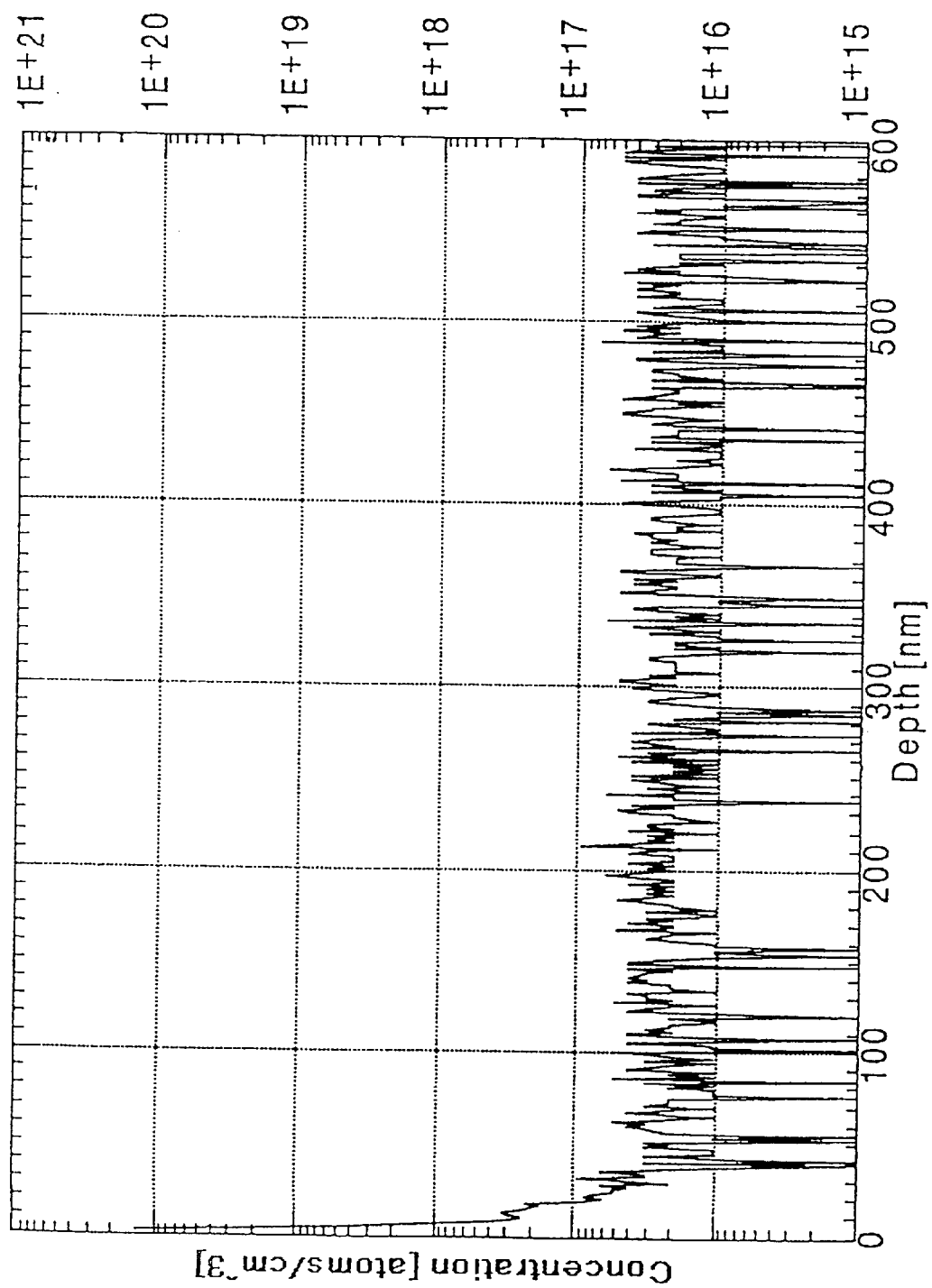

FIG. 35A to 35C show the results obtained from the SIMS wherein the distribution in depth-wise of the boron injected from the gate electrode into the substrate via the oxide film was shown on various kinds of oxide films. Specifically, FIG. 35A shows the results of the insulation film wherein the nitrogen radical was introduced into the surface of silicon oxide film that has been formed by making use of oxygen radical, while FIG. 35B shows the results of the conventional thermal oxide film. Both FIGS. 35A and 35B show the results obtained after an annealing under the conditions of 1,000° C. and 90 minutes in subsequent to the formation of the polysilicon layer. FIG. 35C shows the results obtained without performing an annealing. As shown in FIG. 35A, in the case of the radical oxide film wherein nitrogen atom was introduced in the vicinity of surface of the film, the concentration of boron in the substrate was almost the same as that of FIG. 35C where the annealing was not performed, thus indicating that the punch-through of boron was inhibited in the sample of FIG. 35A. On the other hand, in the case of the conventional thermal oxide film, as compared with that of FIG. 35C where the annealing was not performed, the concentration of boron in the substrate was increased as a result of the annealing as shown in FIG. 35B, thus indicating that a prominent degree of punch-through of boron. By the way, in the case of the radical oxide film where nitrogen atom was introduced in the vicinity of surface of the film, the degree of punch-through of boron was found as being a medium of those of FIGS. 35A and 35B.

On the other hand, when the MOS transistors where these oxide films were employed as a gate oxide film were investigated, the radical oxide film wherein nitrogen atom was introduced indicated an improved stability of threshold voltage as compared with the conventional thermal oxide film, thus reflecting the improvement on the boron-punch-through resistance thereof.

In view of allowing an oxidation to proceed one atom layer by one atom layer (layer-by-layer) so as to obtain a flat (in atomic level) oxide film/semiconductor substrate interface, the substrate for forming a semiconductor device should preferably be constructed such that the offset angle of crystal orientation is nearly 0° (for example, the surface of substrate is parallel with Si(100) plane) and that the flatness of the surface thereof is high.

The activated species to be employed for the oxidation of semiconductor, for the removal of oxide film, or for the nitrification is not limited to those which are generated in an atmosphere by the decomposition of raw material gas that can be effected by means of plasma discharge, exciting light or a catalyst, but may be those that can be obtained through a reaction between the aforementioned activated species and other kind of raw material gas or other chemical species.

The present invention may be carried out by variously modifying the invention within the spirit of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising:

feeding an oxidizing source gas, which has at least one of oxygen molecule and ozone, comprising as a main component oxygen atomic radicals of a singlet state in an excited state to one of a silicon substrate and a silicon thin film deposited on a substrate; and oxidizing a surface of one of said silicon substrate and said silicon thin film to form a silicon oxide film.

2. The method according to claim 1, wherein a light of 175 nm or less in wavelength is irradiated to said oxygen source gas thereby to generate oxygen atomic radicals of singlet state.

3. The method according to claim 1, wherein a light of 175 nm or less in wavelength is irradiated to a plasma atmosphere of gas containing a molecule having oxygen atom thereby to generate the oxygen atomic radicals of singlet state.

4. The method according to claim 3, wherein said plasma atmosphere is separated into a plasma-generating region and an oxidizing region.

5. The method according to claim 1, wherein a light having a wavelength which enables to promote the generation efficiency of oxygen atomic radicals of singlet state rather than oxygen atomic radicals of triplet state is irradiated to a gas atmosphere containing a molecule having an oxygen atom thereby to generate the oxygen atomic radicals of singlet state.

6. The method according to claim 1, wherein said oxidizing source gas containing oxygen atomic radicals of singlet state contains a gas molecule which enables a reaction rate constant to become $4 \times 10^{11}$ cm$^3$mol$^{-1}$s$^{-1}$ or less at a temperature of 298 K in the reaction of deactivating oxygen atomic radicals of singlet state to oxygen atomic radicals of triplet state.

7. The method according to claim 1, wherein a light of 341 nm or less in wavelength is irradiated to an atmosphere containing dinitrogen monoxide thereby to generate the oxygen atomic radicals of singlet state.

8. The method according to claim 1, wherein said oxidation is performed under the conditions where a partial pressure of oxygen molecule in the oxidizing source gas is set to 10 Torr or less, and the oxidizing temperature is set to 550° C. or less.

* * * * *